(12) United States Patent
Iwata

(10) Patent No.: US 7,167,389 B2
(45) Date of Patent: Jan. 23, 2007

(54) MAGNETIC RANDOM ACCESS MEMORY WITH A REFERENCE CELL ARRAY AND DUMMY CELL ARRAYS

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 10/805,315

(22) Filed: Mar. 22, 2004

(65) Prior Publication Data

US 2005/0157541 A1    Jul. 21, 2005

(30) Foreign Application Priority Data

Jan. 20, 2004 (JP) ............... 2004-012071

(51) Int. Cl.
*G11C 11/14* (2006.01)
*G11C 11/15* (2006.01)
*G11C 7/14* (2006.01)
*G11C 5/02* (2006.01)
*G11C 5/06* (2006.01)

(52) U.S. Cl. ............ 365/158; 365/171; 365/173; 365/210; 365/63; 365/66; 365/51

(58) Field of Classification Search ............ 365/158, 365/171, 173, 210, 225.5, 63, 66, 51, 243.5, 365/185.2

See application file for complete search history.

(56) References Cited

U.S. PATENT DOCUMENTS 6,081,445 A     6/2000  Shi et al.
6,349,054 B1 *  2/2002  Hidaka ............ 365/173
6,545,906 B1    4/2003  Savtchenko et al.
6,760,251 B1 *  7/2004  Hidaka ............ 365/171
6,809,976 B1 * 10/2004  Ooishi ............ 365/210
6,879,513 B1 *  4/2005  Ooishi ............ 365/158
2003/0043620 A1 * 3/2003 Ooishi ............ 365/171

FOREIGN PATENT DOCUMENTS

JP     5-250889     9/1993
JP     8-321196     12/1996

(Continued)

OTHER PUBLICATIONS

Roy Scheuerlein, et al., "A 10ns Read and Write Non-Volatile Memory Array Using a Magnetic Tunnel Junction and FET Switch in Each Cell", IEEE International Solid-State Circuits Conference, ISSCC/Session 7/TD: Emerging Memory & Device Technologies/ Paper TA 7.2, Feb. 2000, pp. 128-129.

(Continued)

*Primary Examiner*—J. H. Hur
(74) *Attorney, Agent, or Firm*—Oblon, Spivak, McClelland, Maier & Neustadt, P.C.

(57) ABSTRACT

Memory cell arrays include a data cell array, a reference cell array and a dummy cell array. First read word lines are connected respectively to the gates of the read selection switches of the data cells. Second read word lines are connected respectively to the gates of the read selection switches of the reference cells. The gates of the read selection switches of the dummy cells are also connected respectively to the first and second read word lines but the dummy cells do not function as memory cells because the read selection switch and the MTJ element are cut apart in each of the dummy cells.

21 Claims, 36 Drawing Sheets

FOREIGN PATENT DOCUMENTS

| | | |
|---|---|---|
| JP | 2002-170376 | 6/2002 |
| JP | 2003-178573 | 6/2003 |
| JP | 2003-297072 | 10/2003 |

OTHER PUBLICATIONS

Roy Scheuerlein, et al., "A 10ns Read and Write Non-Volatile Memory Array Using a Magnetic Tunnel Junction and FET Switch in Each Cell", IEEE Slide Supplement, ISSCC/Session 7/TD: Emerging Memory & Device Technologies/Paper TA 7.2, Feb. 2000, pp. 94-95 and 409-410.

M. Durlam, et al., "Nonvolatile RAM Based on Magnetic Tunnel Junction Elements", IEEE Slide Supplement, ISSCC/Session 7/TD: Emerging Memory & Device Technologies, Paper TA 7.3, Feb. 2000, pp. 96-97.

M. Durlam, et al., "Nonvolatile RAM Based on Magnetic Tunnel Junction Elements", IEEE International Solid-State Circuits Conference, ISSCC/Session 7/TD: Emerging Memory & Device Technologies, Paper TA 7.3, Feb. 2000, pp. 130-131.

A. R. Sitaram, et al., "A 0.18µm Logic-Based MRAM Technology for High Performance Nonvolatile Memory Applications", Symposium on VLSI Technology Digest of Technical Papers, Jul. 2003, pp. 15-16.

Takeshi Honda, et al., "MRAM-Writing Circuitry to Compensate for Thermal-Variation of Magnetization-Reversal Current", IEEE, Symposium on VSLI Circuits Digest of Technical Papers, Jul. 2002, (2 pages).

A. Bette, et al., "A High-Speed 128Kbit MRAM Core For Future Universal Memory Applications", 2003 Symposium on VLSI Circuits Digest of Technical Papers, Jul. 2002, pp. 217-220.

Gitae Jeong, et al., A 0.24µm 2.0V 1T1MTJ 16kb Magnetoresistance RAM With Self Reference Sensing, IEEE International Solid-State Circuits Conference, ISSCC/Session 16/Non-Volatile Memory/Paper 16.2, Feb. 2003, pp. 280-281.

M. Durlam, et al., "A Low Power 1Mbit MRAM Based on 1T1MTJ Bit Cell Integrated With Copper Interconnects", IEEE, Symposium on VLSI Circuits Digest of Technical Papers, 2002, (4 pages).

U.S. Appl. No. 10/160,058, filed Jun. 4, 2002, Iwata et al.

U.S. Appl. No. 10/162,605, filed Jun. 6, 2002, Iwata.

U.S. Appl. No. 10/422,971, filed Apr. 25, 2003, Tsuchida et al.

U.S. Appl. No. 10/431,369, filed May 8, 2003, Iwata.

U.S. Appl. No. 10/621,886, filed Jul. 18, 2003, Tsuchida et al.

* cited by examiner

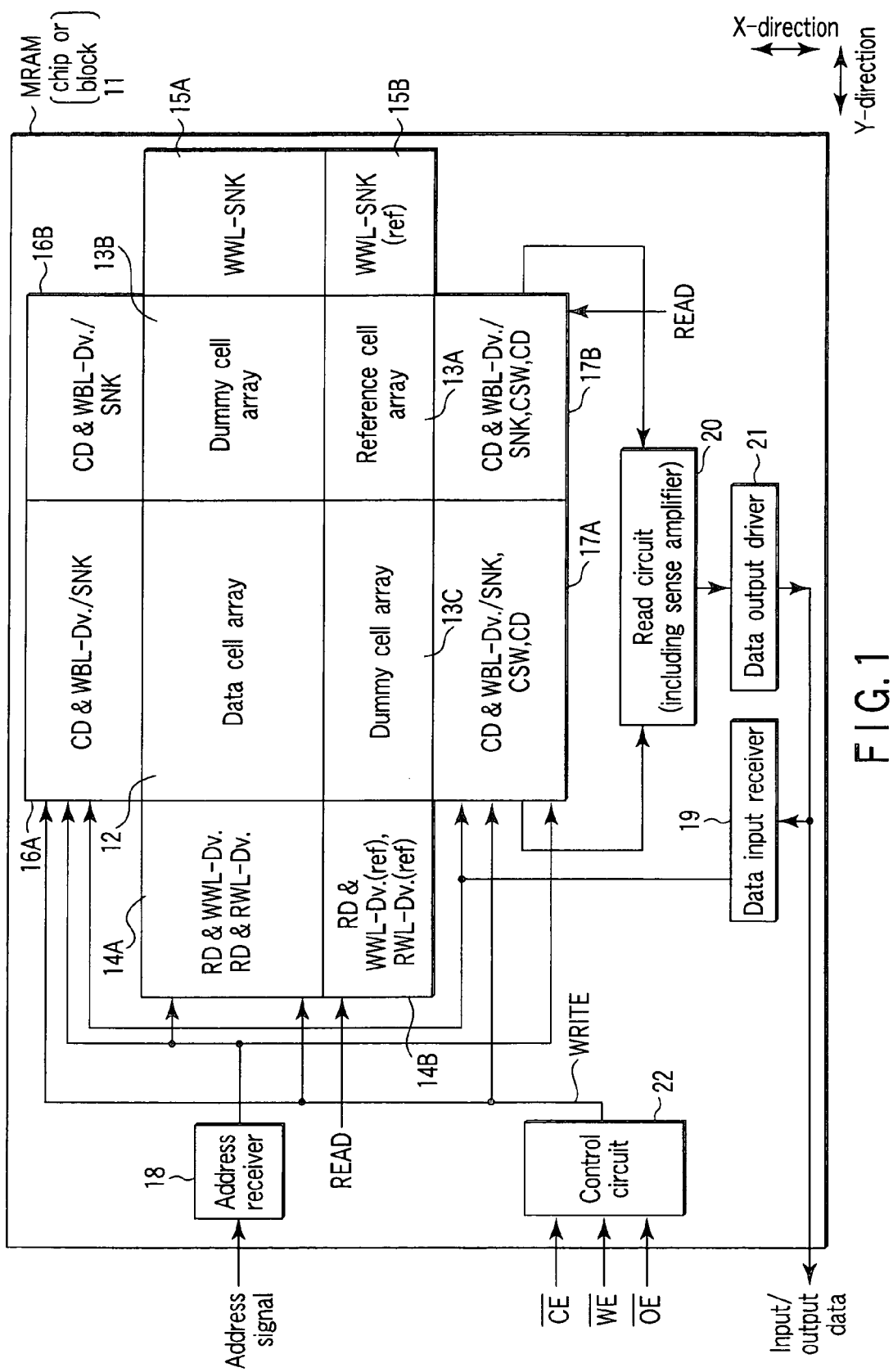
F I G. 1

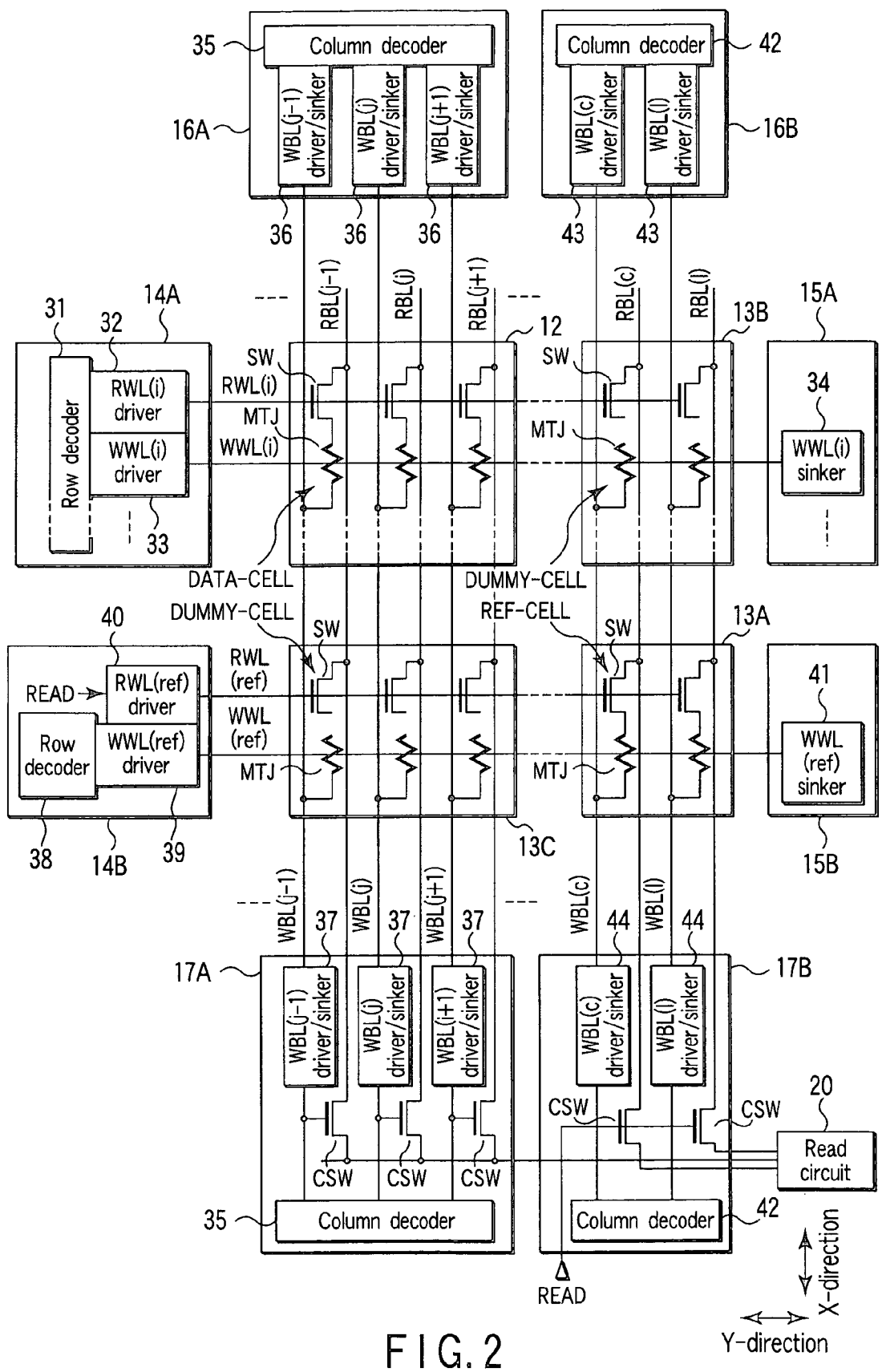
F I G. 2

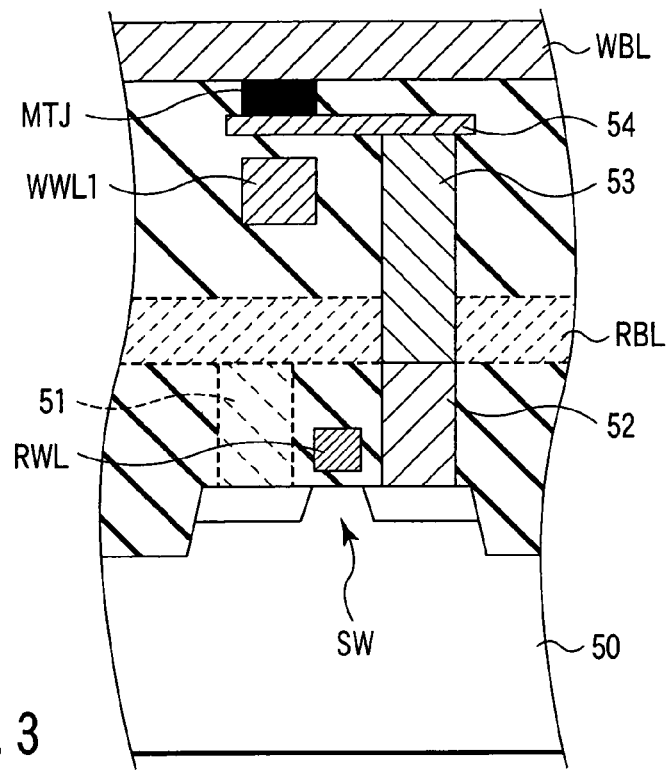
F I G. 3
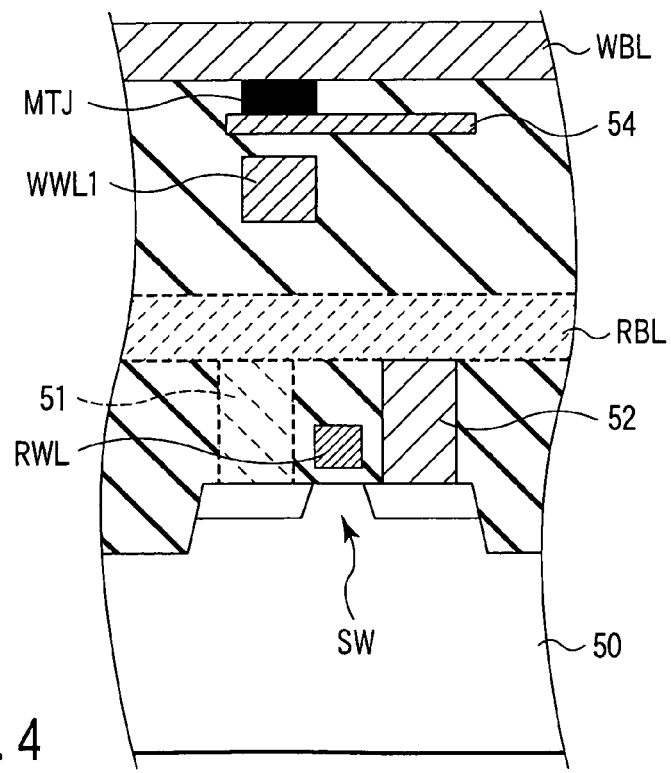
F I G. 4

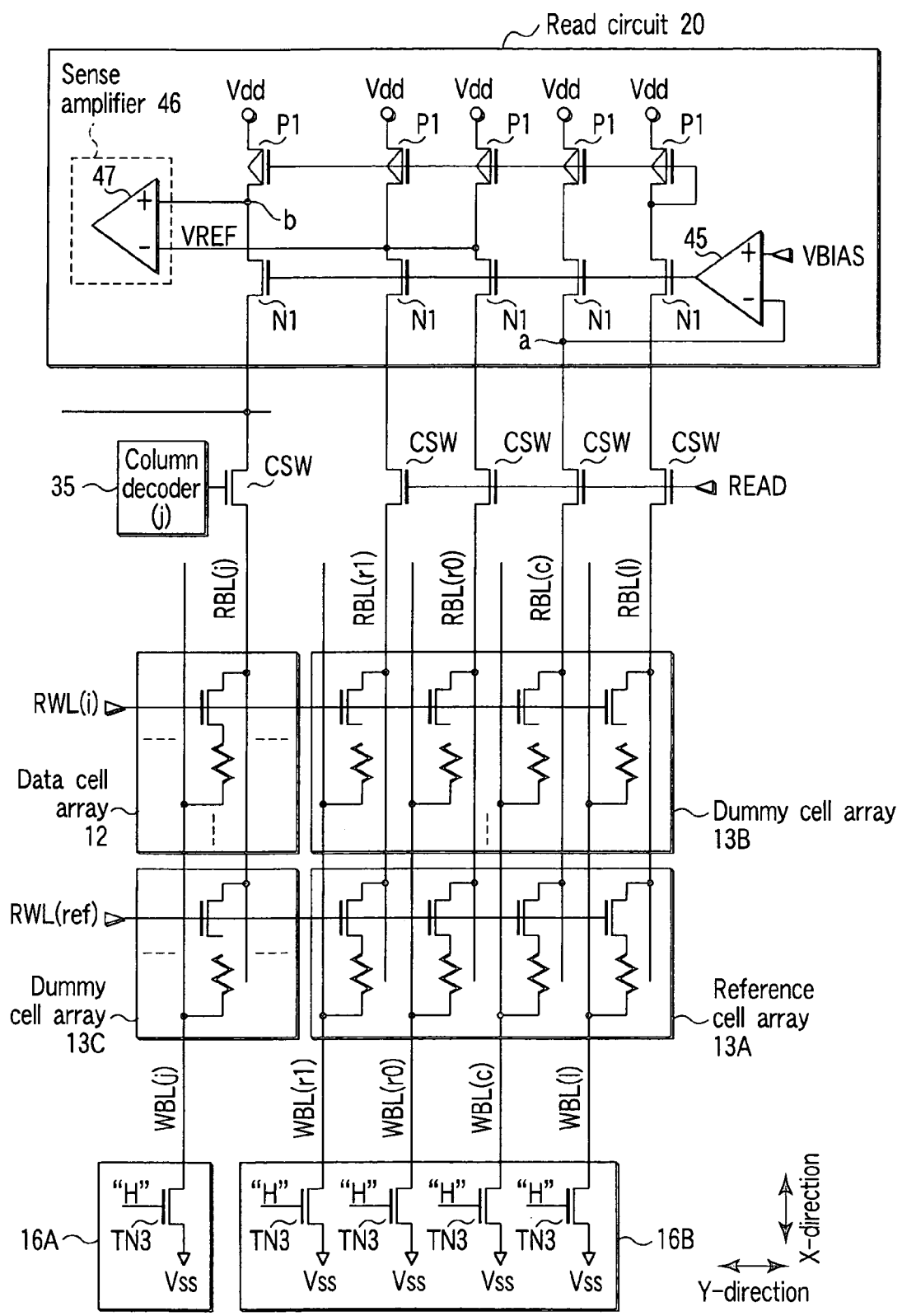
F I G. 6

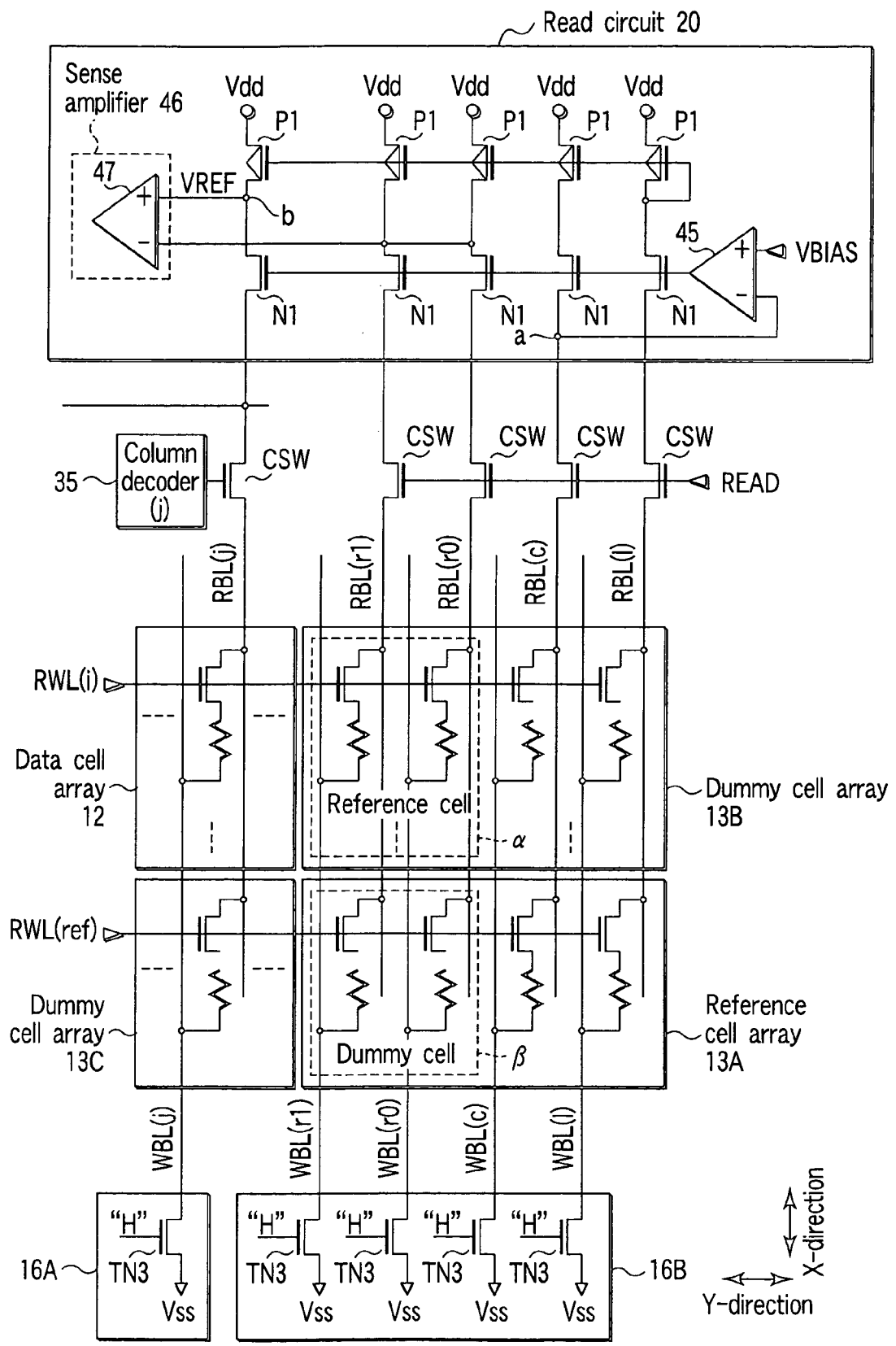
F I G. 7

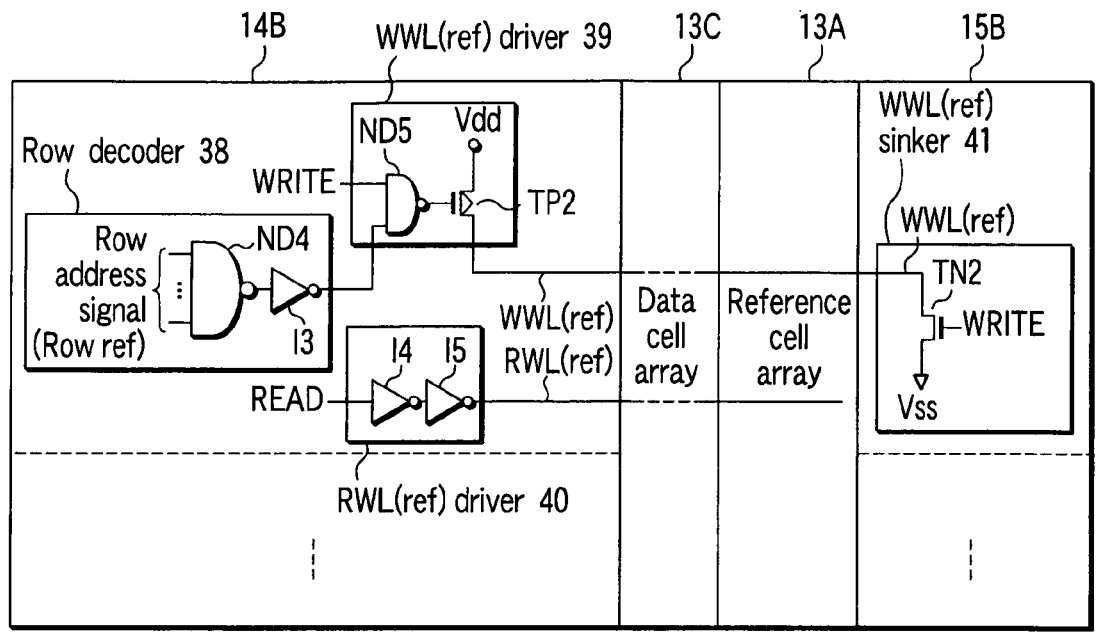
F I G. 10
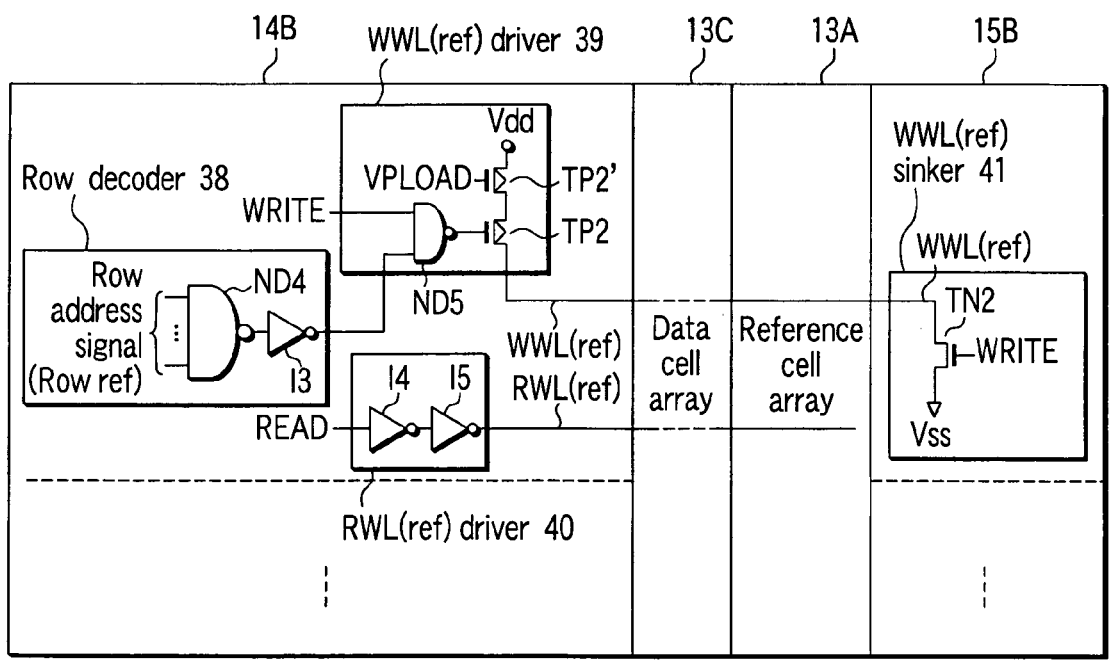
F I G. 11

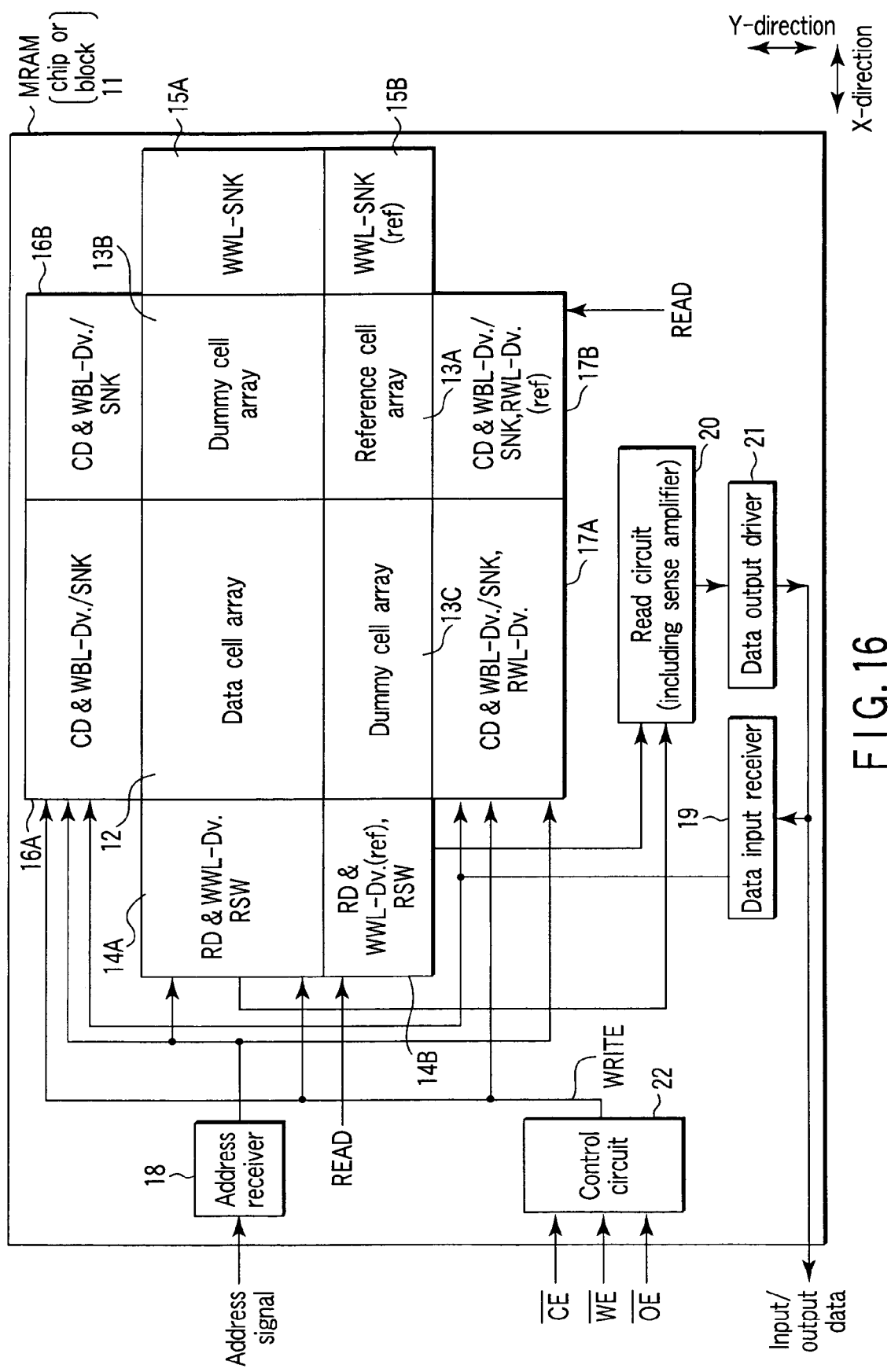
F I G. 16

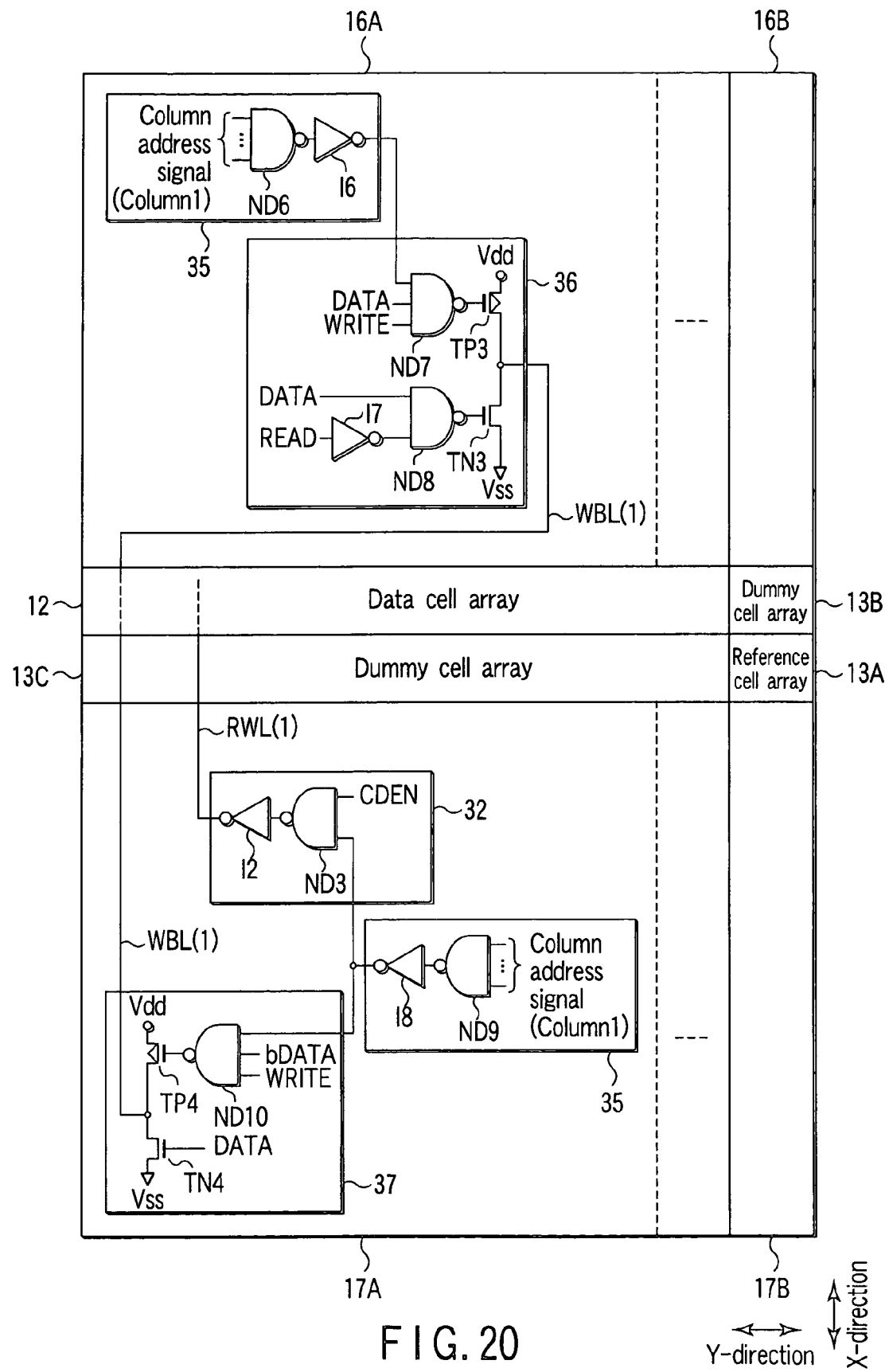
F I G. 20

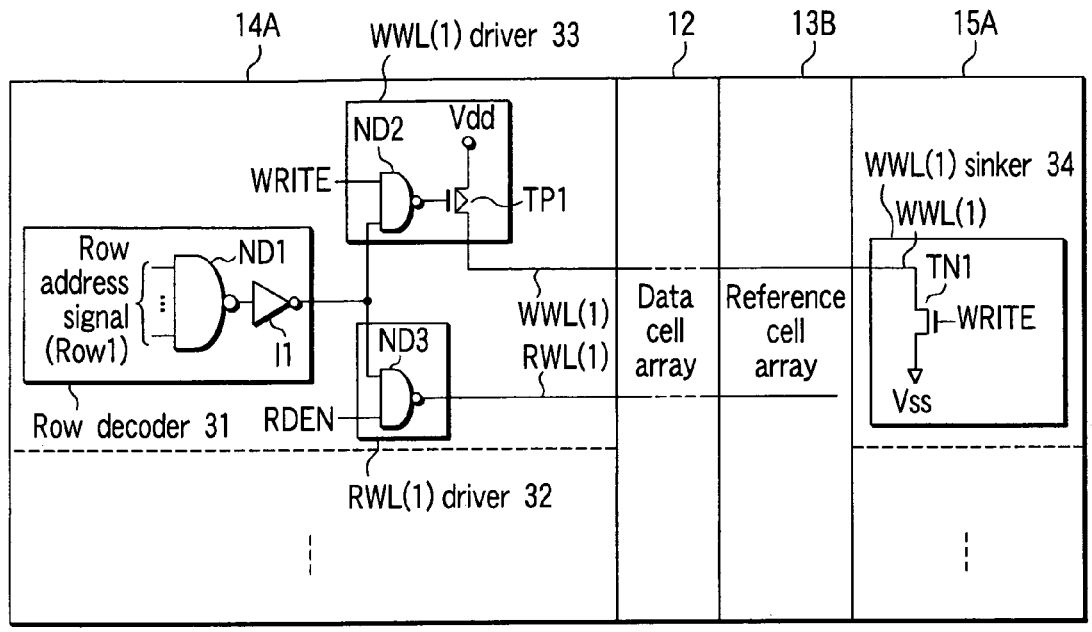
F I G. 23
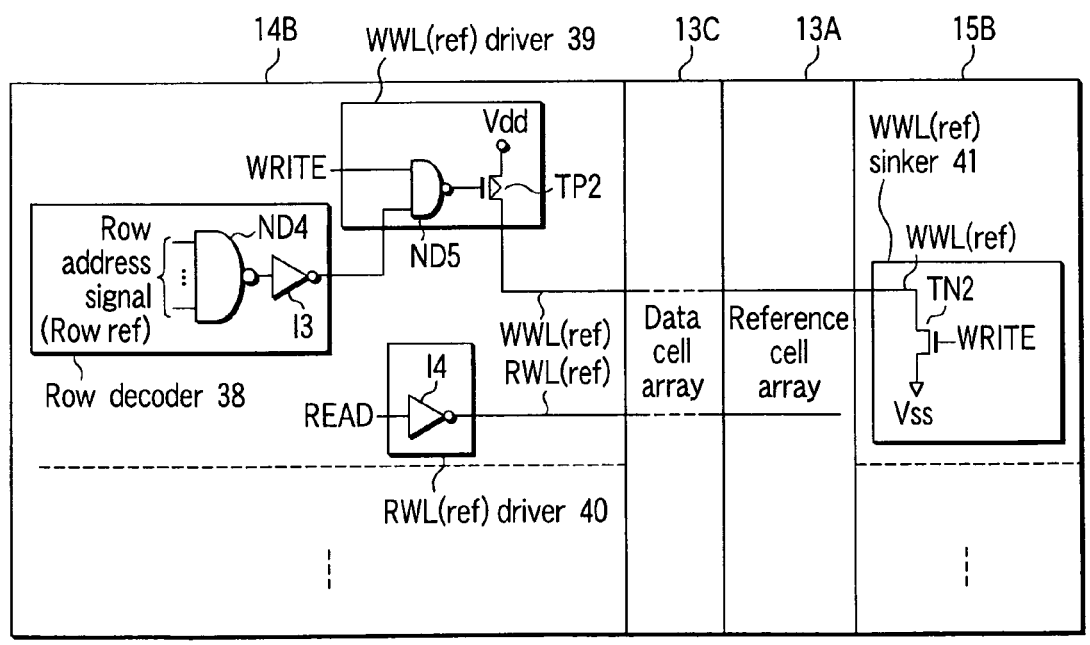
F I G. 24

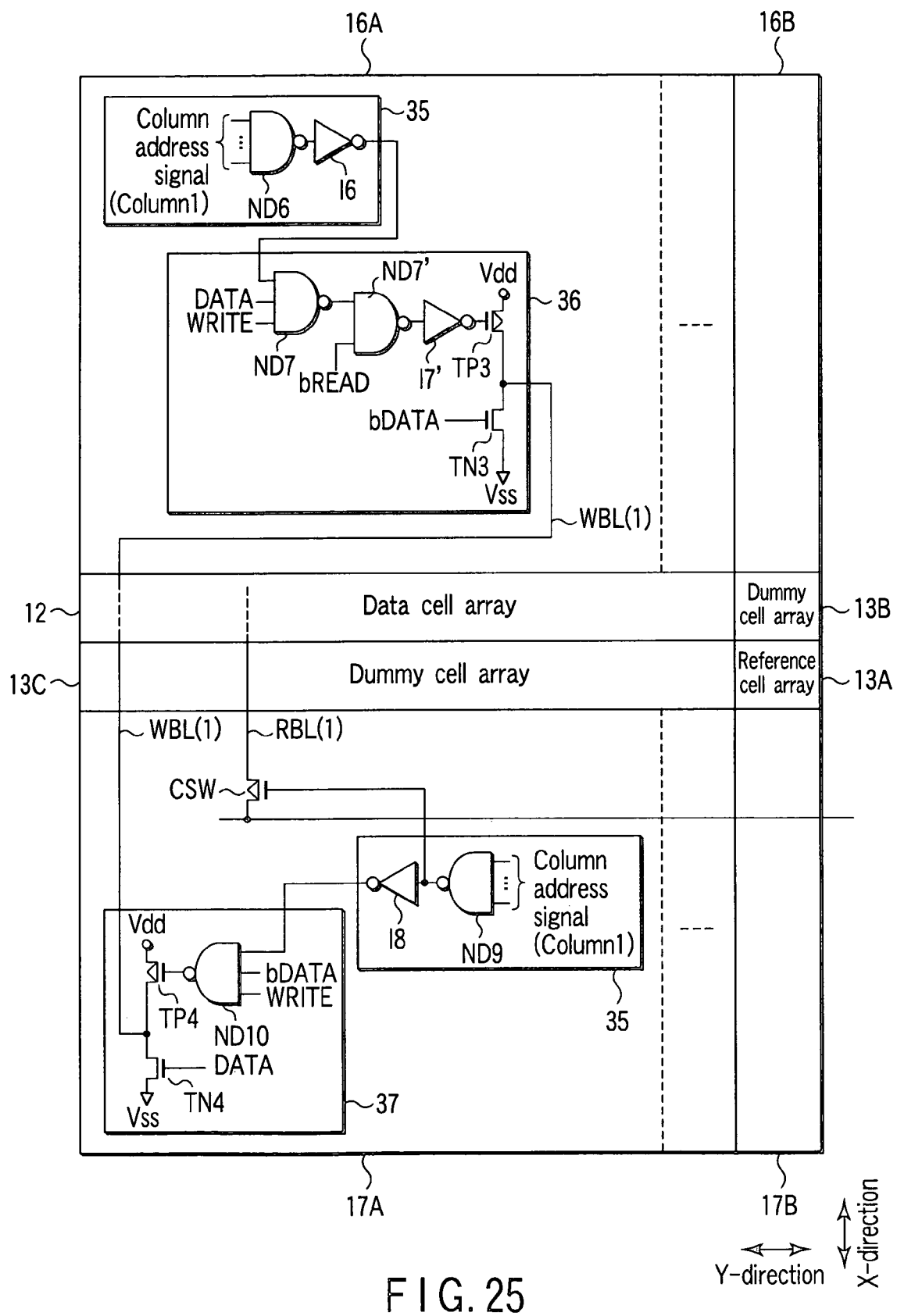
F I G. 25

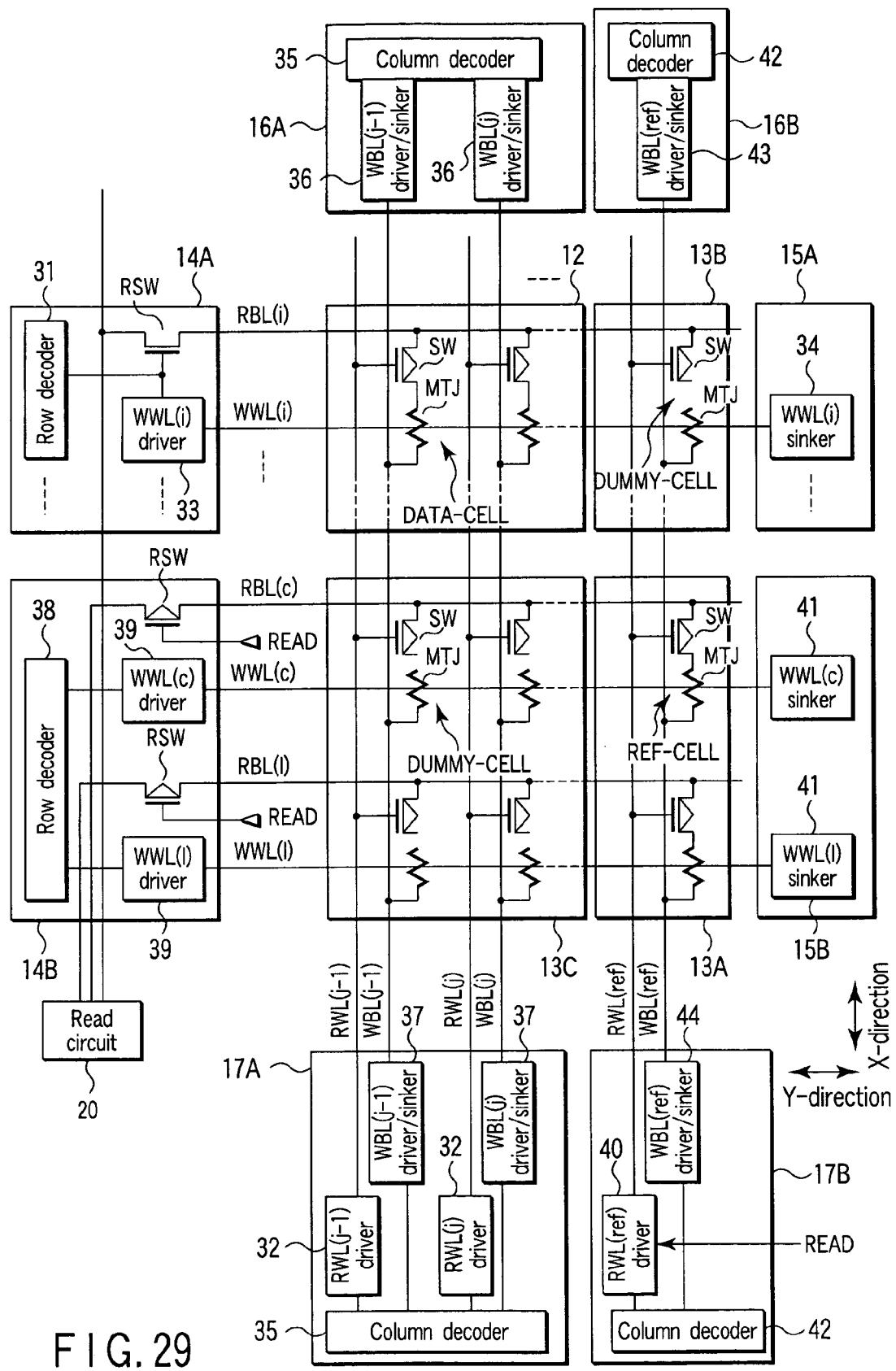
F I G. 29

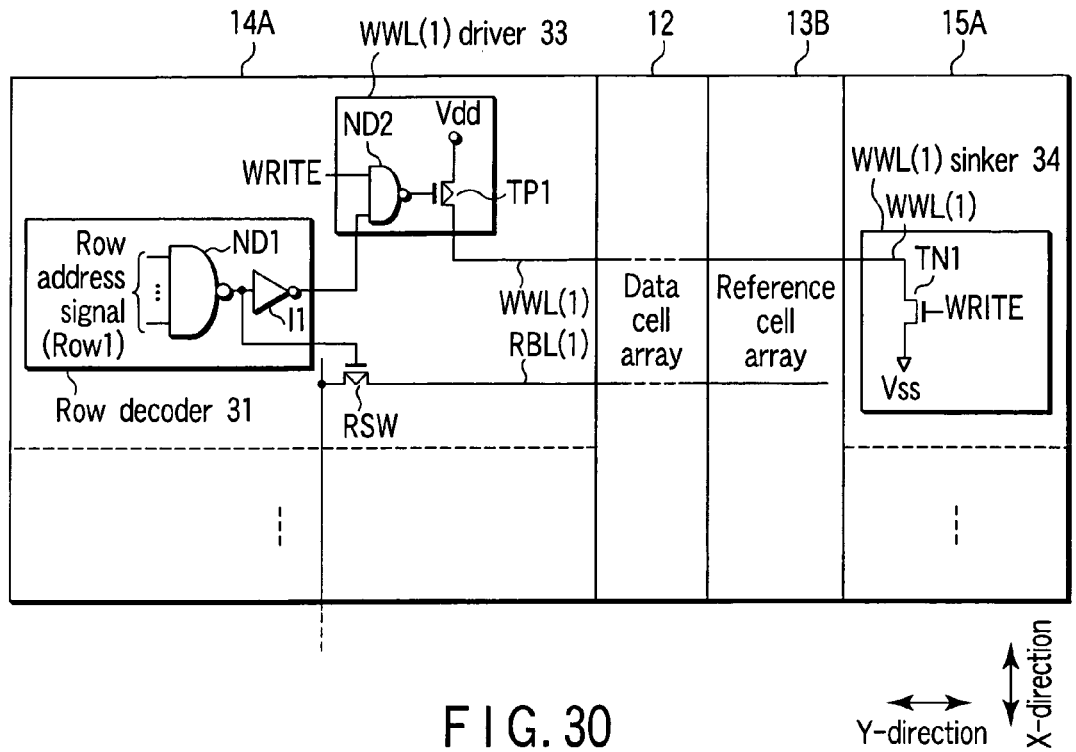
F I G. 30
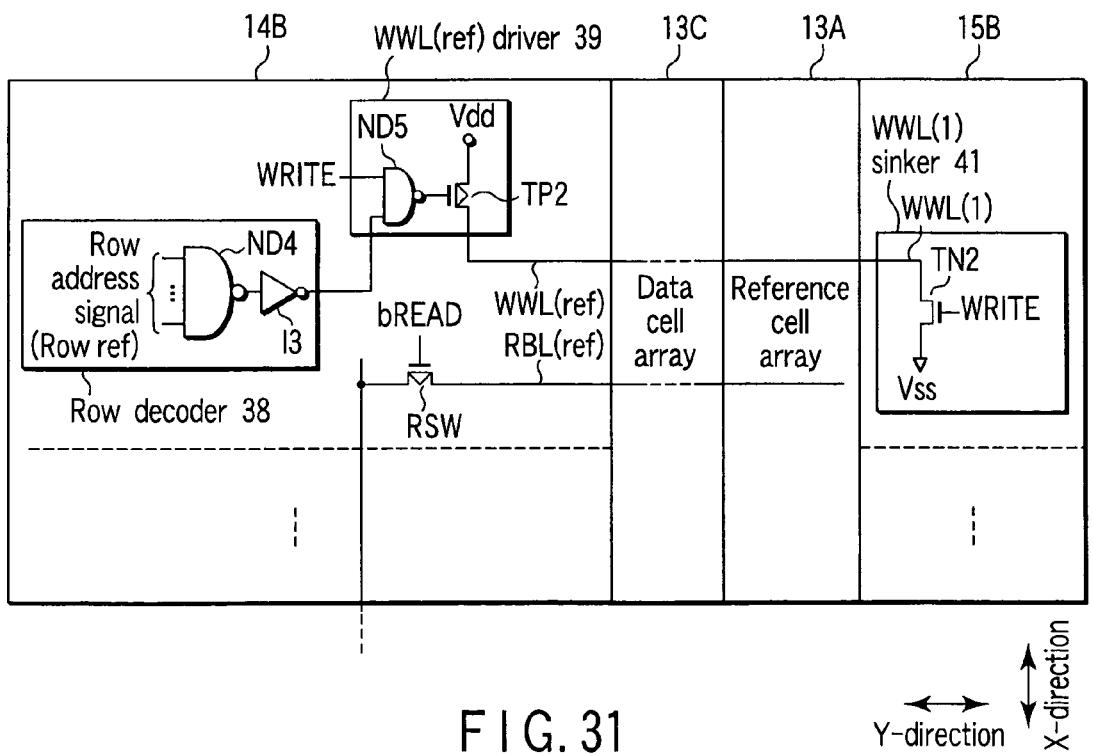
F I G. 31

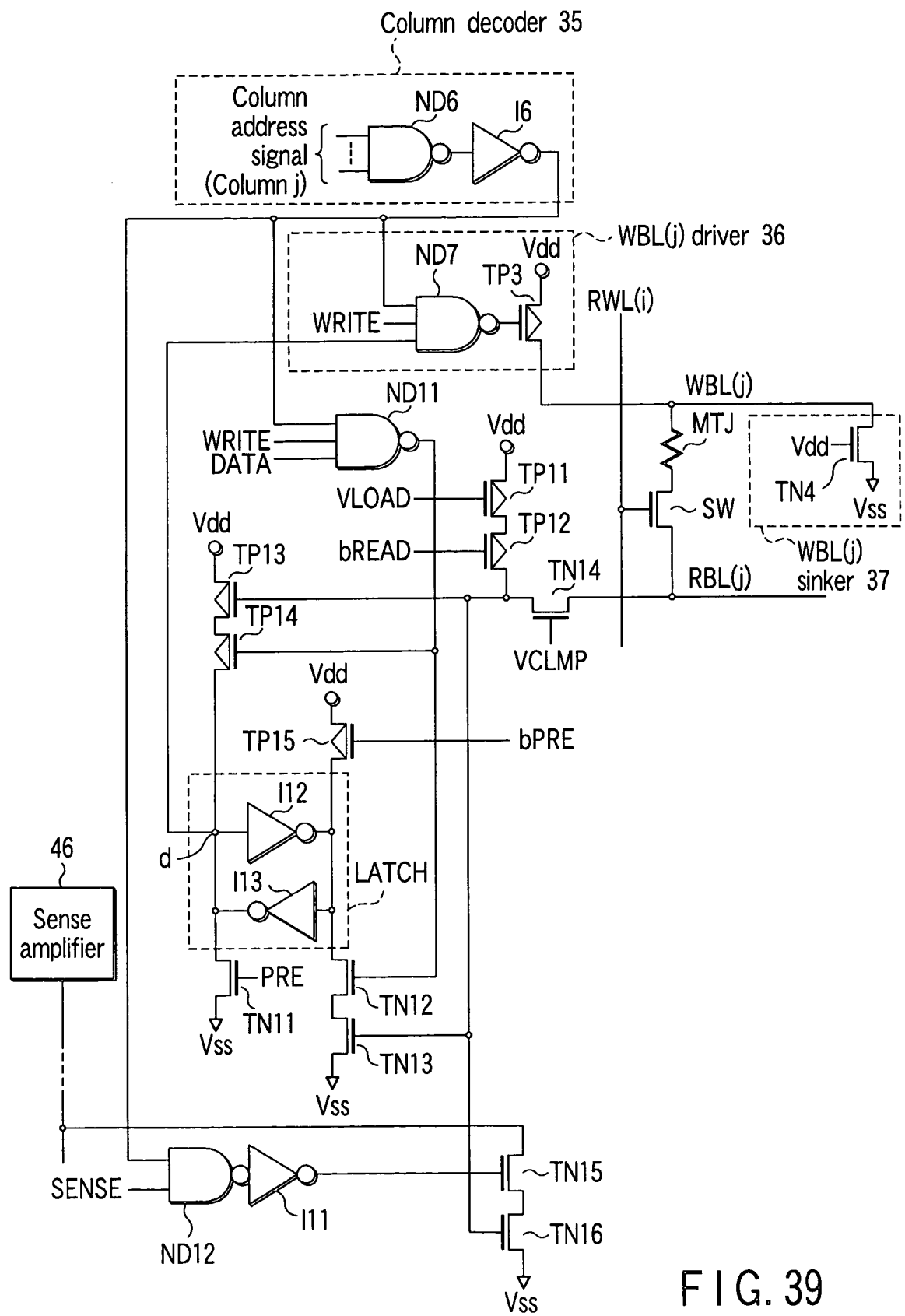
F I G. 39

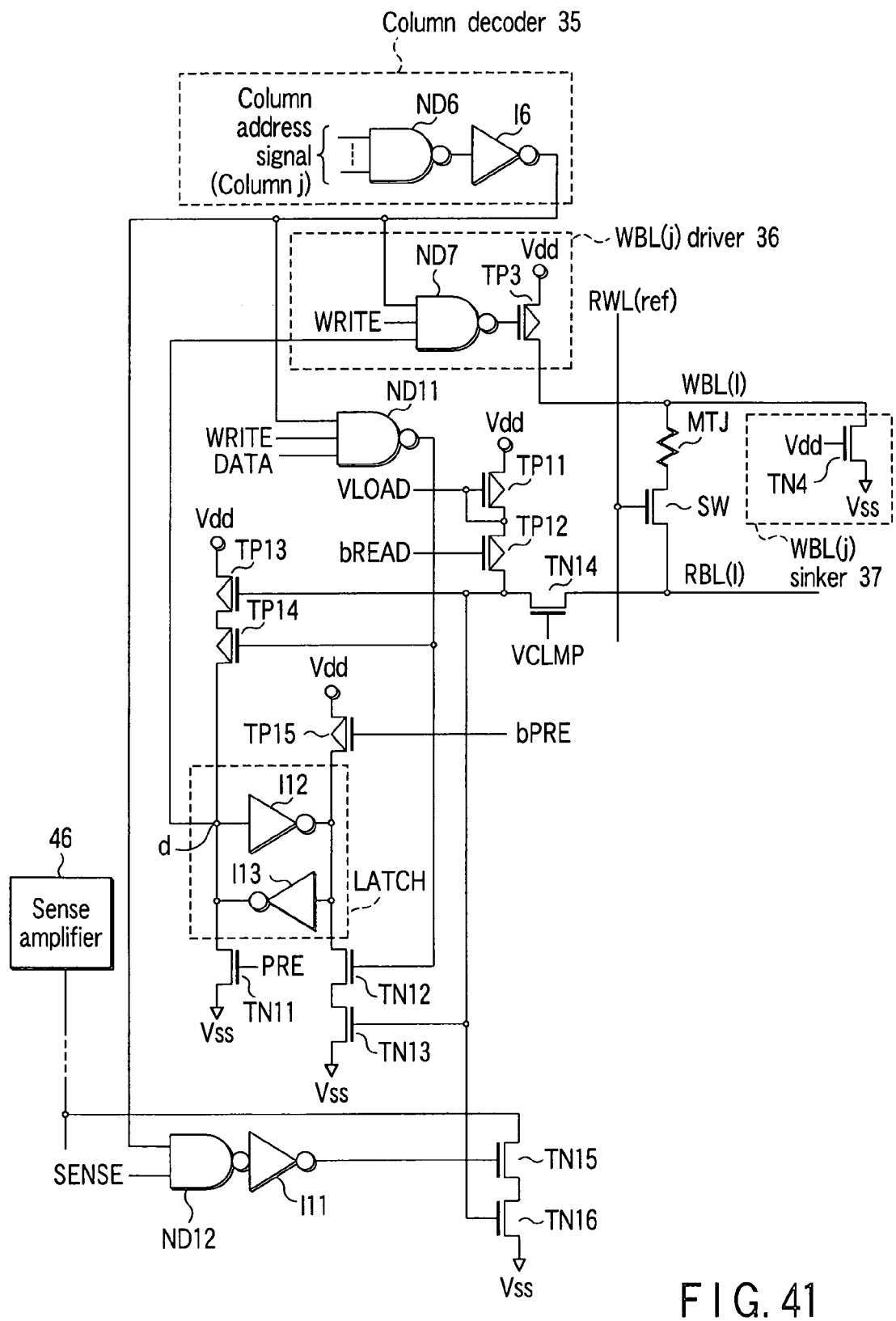
F I G. 41

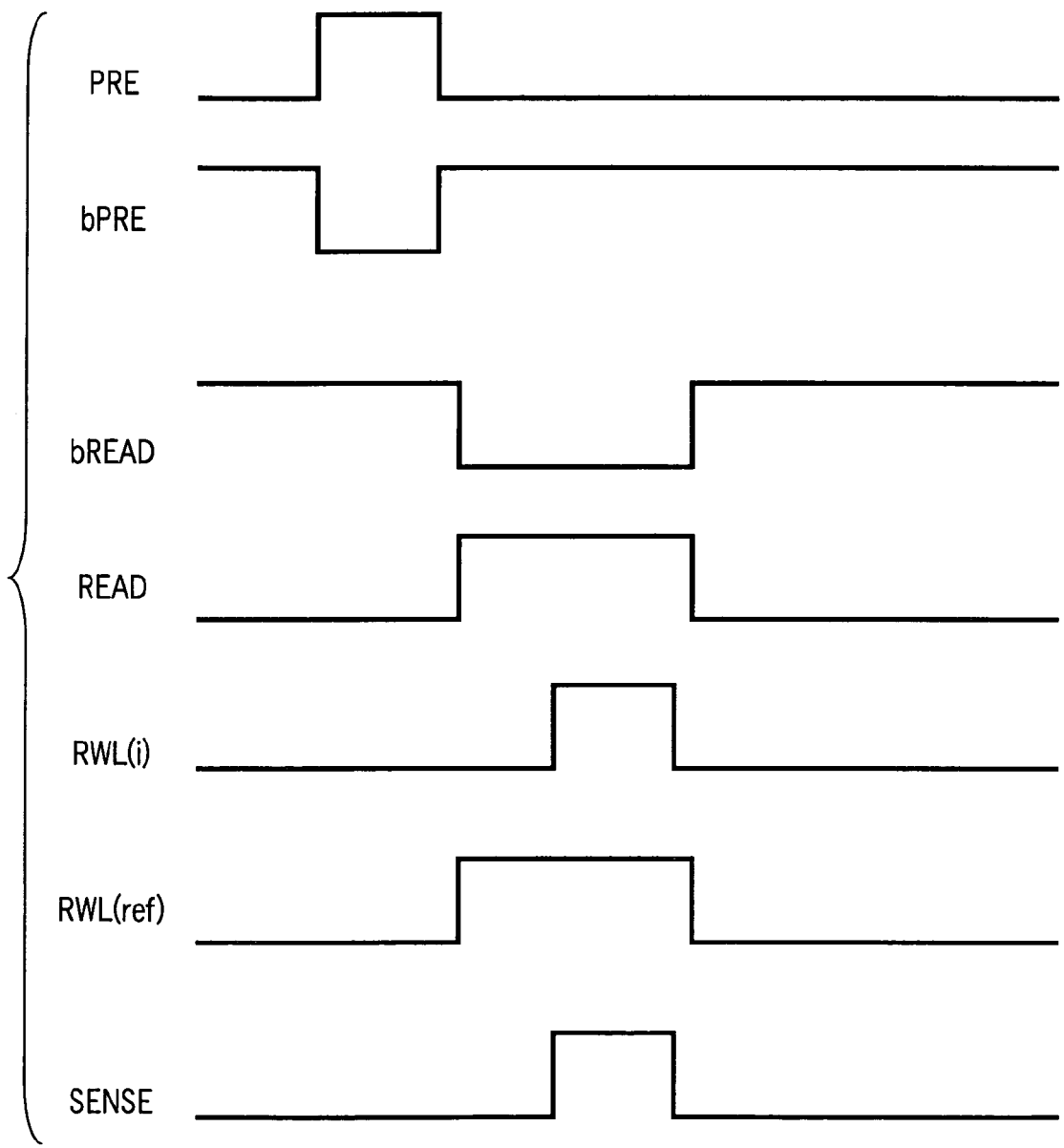
F I G. 43

MAGNETIC RANDOM ACCESS MEMORY WITH A REFERENCE CELL ARRAY AND DUMMY CELL ARRAYS

CROSS-REFERENCE TO RELATED APPLICATIONS

This application is based upon and claims the benefit of priority from prior Japanese Patent Application No. 2004-012071, filed Jan. 20, 2004, the entire contents of which are incorporated herein by reference.

BACKGROUND OF THE INVENTION

1. Field of the Invention

This invention relates to a magnetic random access memory (MRAM) that utilizes the magneto-resistive effect.

2. Description of the Related Art

Magnetic random access memories that utilize the tunneling magneto-resistive (TMR) effect are disclosed, interior, in Patent Documents 1 through 3 and Non-Patent Documents 1 through 5. Such magnetic random access memories are characterized in that they utilize the state of magnetization of MTJ (magnetic tunnel junction elements) for storing data.

A data is written into an MTJ element by flowing 2 write currents to mutually intersecting write word/bit lines at the MTJ element to generate a magnetic field that determines the state of magnetization of the MTJ element. Since a write bit line normally operates as read bit line, it is also referred to as write/read bit line.

The write/read bit line is connected to a sense amplifier and, for a read operation, it is electrically charged in order to read a data. However, because a driver/sinker or a switching element that is used for a write operation is connected to a write/read bit line, the write/read bit line is made to have a large load capacity, which is disadvantageous for a high speed read operation.

To realize a high speed read operation, it is necessary to use write/read bit lines having a small load capacity. For this reason, an arrangement where write bit lines and read bit lines are provided independently and only read bit lines are electrically charged for a read operation has been proposed recently. Such an arrangement is advantageous for high speed read operations because it is no longer necessary to take the load capacity attributable to the driver/sinker or the switching element connected to each write bit line into consideration.

Meanwhile, in a magnetic random access memory where a bit data is stored in a MTJ element (a cell), the use of a bias current/potential that is necessary for reading the cell data and a reference current/potential that operates as reference for determining the value of the cell data is required. Therefore, a bias current/potential generation circuit and a reference current/potential generation circuit need to be provided in a chip to give rise to a problem of a large chip area.

Thus, it will be advantageous if some of the memory cells of a memory cell array can be used as reference cells for generating a bias current/potential or reference current/potential so as to reduce the chip area, realize a high speed read operation and simplify the data storing operation.

The above-cited Patent Documents 1 through 3 and Non-Patent Documents 1 through 5 are listed below.

Patent Document 1: Jpn. Pat. Appln. KOKAI Publication No. 2002-170376

Patent Document 2: U.S. Pat. No. 6,545,906

Patent Document 3: U.S. Pat. No. 6,081,445

Non-Patent Document 1: M. Durlam et al. "A low power 1 Mbit MRAM based on 1T1MTJ bit cell integrated with Copper Interconnects", IEEE, 2002 Symposium on VLSI Circuits Digest of Technical Papers Non-Patent Document 2: T. HONDA et al. "MRAM-Writing Circuitry to Compensate for Thermal-Variation of Magnetization-Reversal Current", 2002 Symposium on VLSI Circuits Digest of Technical Papers, pp. 156–157, July 2002

Non-Patent Document 3: Roy Scheuerlein et al. "A 10 ns Read and Write Non-Volatile Memory Array Using a Magnetic Tunnel Junction and FET Switch in each Cell", ISSCC2000 Technical Digest, pp. 128–129

Non-Patent Document 4: A Bette et al. "A High-Speed 128 Kbit MRAM Core for Future Universal Memory Applications", 2003 Symposium on VLSI Circuits Digest of Technical Papers, pp. 217–220, July 2003

Non-Patent Document 5: A. R. Sitaram et al. "A 0.18 µm Logic-based MRAM Technology for High Performance Nonvolatile Memory Applications", 2003 Symposium on VLSI Circuits Digest of Technical Papers, pp. 15–16, July 2003.

BRIEF SUMMARY OF THE INVENTION

A magnetic random access memory according to an aspect of the present invention comprises: data cells and first reference cells arranged in a memory cell array and formed by magneto-resistive effect elements and read selection switches connected in series; first read word lines connected respectively to the read selection switches of the first reference cells; and second read word lines connected respectively to the read selection switches of the data cells; wherein the data of the data cells are read out on the basis of the data of the first reference cells.

BRIEF DESCRIPTION OF THE SEVERAL VIEWS OF THE DRAWING

FIG. 1 is a schematic block diagram of the first embodiment of MRAM according to the invention;

FIG. 2 is a schematic circuit diagram of the first embodiment of MRAM according to the invention;

FIG. 3 is a schematic illustration of the structure of a data cell and that of a reference cell;

FIG. 4 is a schematic illustration of the structure of a dummy cell;

FIG. 6 is schematic circuit diagram of a second example of read circuit;

FIG. 7 is schematic circuit diagram of a third example of read circuit;

FIG. 10 is a schematic circuit diagram of a first example of row decoder and driver/sinker for reference cells;

FIG. 11 is a schematic circuit diagram of a second example of row decoder and driver/sinker for reference cells;

FIG. 16 is a schematic block diagram of the second embodiment of MRAM according to the invention;

FIG. 20 is a schematic circuit diagram of an example of column decoder and driver/sinker for data cells;

FIG. 23 is a schematic circuit diagram of an example of row decoder and driver/sinker for data cells;

FIG. 24 is a schematic circuit diagram of an example of row decoder and driver/sinker for reference cells;

FIG. 25 is a schematic circuit diagram of a first example of column decoder and driver/sinker for data cells;

FIG. 29 is a schematic circuit diagram of the fourth embodiment of MRAM according to the invention;

FIG. 30 is a schematic circuit diagram of an example of row decoder and driver/sinker for data cells;

FIG. 31 is a schematic circuit diagram of an example of row decoder and driver/sinker for reference cells;

FIG. 39 is a schematic circuit diagram of an example of MRAM adopting a toggle write mode;

FIG. 41 is a schematic circuit diagram of still another example of MRAM adopting a toggle write mode;

FIG. 43 is a schematic illustration of signal waveforms that are used for reading from a toggle write type MRAM.

DETAILED DESCRIPTION OF THE INVENTION

Figure 5:
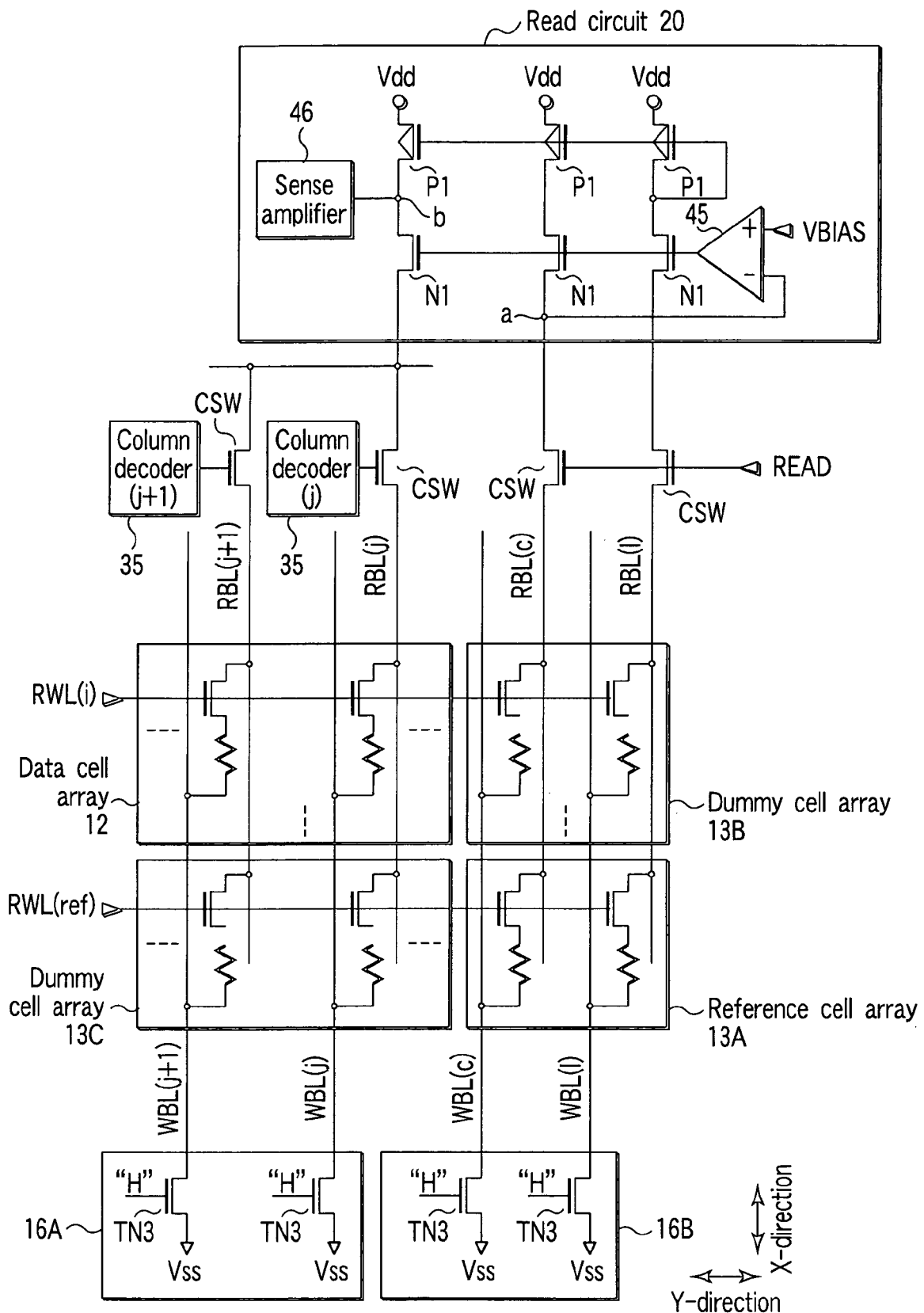
FIG. 5 is schematic circuit diagram of a first example of read circuit.

A magnetic random access memory of an aspect of the present invention will be described below in detail with reference to the accompanying drawing.

1. 1st Embodiment

FIG. 1 is a schematic block diagram of the first embodiment of magnetic random access memory according to the invention.

A magnetic random access memory (MRAM) 11 of this embodiment may constitute a memory chip by itself or may be a block in a system LSI comprising a plurality of blocks.

The memory cell array comprises a data cell array 12, a reference cell array 13A and dummy cell arrays 13B, 13C.

The data cell array 12 has a plurality of data cells literally arranged in array. The data cell array 12 occupies a major area of the memory cell array and is used to store data which are stored as the memory apparatus by external apparatuses or blocks. The reference cell array 13A has reference cells that are used to generate a bias current/potential or a reference current/potential. The dummy cell arrays 13B, 13C have dummy cells that do not function as memory cells.

Row decoder & driver (row decoder RD & write word line driver WWL-Dv., row decoder RD & read word line driver RWL-Dv.) 14A is arranged at one of the opposite ends of the block formed by the data cell array 12 and the dummy cell array 13B as viewed in Y-direction (the direction of Easy-Axis) and sinker (write word line sinker WWL-SNK) 15A is arranged at the other end.

Row decoder & driver (row decoder RD & write word line driver WWL-Dv. (ref), row decoder RD & read word line driver RWL-Dv. (ref)) 14B is arranged at one of the opposite ends of the block formed by the reference cell array 13A and the dummy cell array 13C as viewed in Y-direction (the direction of Easy-Axis) and sinker (write word line sinker WWL-SNK) (ref)) 15B is arranged at the other end.

For a write operation, the row decoder & driver 14A and the row decoder & driver 14B typically function to select one of a plurality of write word lines according to a row address signal and supply a write current to the selected write word line for a write operation, whereas the sinkers 15A, 15B typically function to absorb the write current supplied to the selected write word line.

For a read operation, the row decoder & driver 14A and the row decoder & driver 14B typically function to select one of a plurality of read word lines (which may be separated from or integrated with the write word lines) according to a row address signal and bring up the selected read word line to "H".

Column decoder & driver/sinker (column decoder CD & write bit line driver/sinker WBL-Dv. /SNK) 16A is arranged at one of the opposite ends of the block formed by the data cell array 12 and the dummy cell array 13C as viewed in X-direction (the direction of Hard-Axis) and column decoder & driver/sinker (column decoder CD & write bit line driver/sinker WBL-Dv. /SNK, column selection switch CSW, column decoder CD) 17A is arranged at the other end.

Column decoder & driver/sinker (column decoder CD & write bit line driver/sinker WBL-Dv. /SNK) 16B is arranged at one of the opposite ends of the block formed by the reference cell array 13A and the dummy cell array 13B as viewed in X-direction (the direction of Hard-Axis) and column decoder & driver/sinker (column decoder CD & write bit line driver/sinker WBL-Dv. /SNK, column selection switch CSW, column decoder CD) 17B is arranged at the other end.

For a write operation, the column decoder & driver/sinker 16A, the column decoder & driver/sinker 16B, the column decoder & driver/sinker 17A and the column decoder & driver/sinker 17B function to select one of a plurality of write bit lines according to a column address signal and flow a write current that is directed according to the applied write data to the selected write bit line. For a read operation, the column selection switch CSW and the column decoder CD functions to electrically connect the read bit line selected by a column address signal to the sense amplifier 20.

Address receiver 18 receives an address signal and transfers a row address signal to the row decoder & driver 14A and the row decoder & driver 14B and also a column address signal to the column decoder & driver/sinker 16A, the column decoder & driver/sinker 16B, the column decoder & driver/sinker 17A and the column decoder & driver/sinker 17B. Data input receiver 19A transfers a write data to the column decoder & driver/sinker 16A, the column decoder & driver/sinker 16B, the column decoder & driver/sinker 17A and the column decoder & driver/sinker 17B. Data output driver 21 outputs the read data detected by the sense amplifier 20 to the outside of the magnetic random access memory 11.

Control circuit 22 receives /CE signal (the inverted signal of the chip enable signal), /WE signal (the inverted signal of the write enable signal) and /OE signal (the inverted signal of the output enable signal) and controls the operation of the magnetic random access memory 11. For a write operation, for example, the control circuit 22 applies write signal WRITE to the row decoder & driver 14A, the row decoder & driver 14B, the column decoder & driver/sinker 16A, the column decoder & driver/sinker 16B, the column decoder & driver/sinker 17A and the column decoder & driver/sinker 17B.

FIG. 2 specifically illustrates the memory cell array and their peripherals thereof in FIG. 1.

It is assumed that the device structure of this example has write bit lines WBL and read bit lines RBL that are independently provided. With this device structure, only read bit lines RBL need to be electrically charged for a read operation so that it is not necessary to take the load capacity attributable to the driver/sinker and the switching element connected to each write bit line WBL into consideration. This arrangement is advantageous for high speed read operations.

Normally, each read selection switch SW has one of its ends connected to a common source line and the other end connected to a write/read bit line by way of an MTJ element. However, in this example, each read selection switch SW has one of its ends connected to a read bit line RBL and the other end connected to a write bit line WBL by way of an MTJ element.

With this arrangement, there is no longer a common source line and each column is provided with an individual read bit line RBL so that an increased cell size may be apprehended. However, the cell size is actually influenced significantly by other factors such as MTJ elements so that the increase in the cell size due to the provision of read bit lines RBL will be limited.

The data cell array 12 is formed by a plurality of data cells DATA-CELL. Each data cell DATA-CELL is a 1Tr-1MTJ type memory cell and comprises a read selection switch SW and an MTJ element MTJ. The data cell DATA-CELL typically stores the data input to the chip, when the latter is activated.

The reference cell array 13A is formed by a plurality of reference cells REF-CELL. Each reference cell REF-CELL is also a 1Tr-1MTJ type memory cell and comprises a read selection switch SW and an MTJ element MTJ. The reference cell REF-CELL typically stores a data for generating a bias current/potential or a reference current/potential.

The dummy cell arrays 13B, 13C is formed by a plurality of dummy cells DUMMY-CELL. Each dummy cell is also a 1Tr-1MTJ type memory cell and comprises a read selection switch SW and an MTJ element MTJ. However, since the dummy cell DUMMY-CELL is not used as memory cell, its read selection switch SW and its MTJ element MTJ are physically cut apart.

The data cell DATA-CELL and the reference cell REF-CELL typically have a device structure as shown in FIG. 3.

The read selection switch SW comprises a MOS transistor. The gate of the MOS transistor operates as read word line RWL. One of the source/drain regions of the MOS transistor is connected to the read bit line RBL by way of a contact plug 51. The other source/drain region of the MOS transistor is connected to the bottom surface of the MTJ element MTJ by way of contact plugs 52, 53 and an electro-conductive layer 54. The write bit line WBL is connected to the top surface of the MTJ element MTJ. The write word line WWL is arranged below the MTJ element MTJ.

On the other hand, the dummy cell DUMMY-CELL typically has a device structure as shown in FIG. 4.

The dummy cell DUMMY-CELL differs from the data cell DATA-CELL and the reference cell REF-CELL in that only it does not have contact plug 53 (FIG. 3). Otherwise, it is identical with the data cell DATA-CELL and the reference cell REF-CELL. Because of non-existence of contact plug 53, the read selection switch SW and the MTJ element MTJ of the dummy cell DUMMY-CELL are physically cut apart.

As the read selection switch SW and the MTJ element MTJ are physically cut apart, no electric current flows to the MTJ element MTJ of the dummy cell DUMMY-CELL if a bias potential is applied to the read word line RWL.

A device structure where no electric current is allowed to flow to the MTJ element MTJ of the dummy cell DUMMY-CELL regardless if a bias potential is applied to the read word line RWL can be realized in many different ways beside the above example (FIG. 4). For instance, in the device structure of FIG. 3, the read plug 51, the contact plug 52 or the MTJ element MTJ may be omitted. Alternatively, a combination of any of these elements may be omitted.

The read word line RWL (i) extends in the Y-direction from read word line driver 32. The read word line RWL (i) is connected to the read selection switch SW of the data cell DATA-CELL. The write word line WWL (i) extends in the Y-direction from write word line driver 33 to write word line sinker 34. The write word line WWL (i) passes near the MTJ element MTJ of the data cell DATA-CELL.

The read word line RWL (ref) extends in the Y-direction from read word line driver 40. The read word line RWL (ref) is connected to read selection switch SW of the reference cell REF-CELL. The write word line WWL (ref) extends in the Y-direction from write word line driver 39 to write word line sinker 41. The write word line WWL (ref) passes near the MTJ element MTJ of the reference cell REF-CELL.

Both the data cell DATA-CELL and the reference cell REF-CELL are arranged in the same memory cell array, although the read word line RWL (i) connected to the data cell DATA-CELL and the read word line RWL (ref) connected to the reference cell REF-CELL are provided independently.

Thus, for instance, before reading a data by applying a bias potential to the selected read word line RWL (i), it is possible to apply a bias potential to the read word line RWL (ref) in advance to generate a bias current/potential and a reference current/potential that are necessary for the read operation. In short, the requirements that need to be met for a read operation can be immediately satisfied to improve the read speed.

Dummy cells DUMMY-CELL are connected respectively to the read word lines RWL (i), RWL (ref) in order to physically and electrically maintain the regularity of the memory cell array. However, since the read selection switch SW and the MTJ element MTJ of the dummy cell DUMMY-CELL are cut apart, a normal read operation can be performed without any problem during the operation of reading main data if a bias potential is being applied continuously to the read word line RWL (ref).

The write bit line WBL (j) is arranged between write bit line driver/sinker 36 and write bit line driver/sinker 37 and extends in the X-direction. The write bit line WBL (j) passes near the MTJ element MTJ of the data cell DATA-CELL. The read bit line RBL (j) extends in the X-direction on the memory cell array. The read bit line RBL (j) has one of its ends connected to read circuit 20 by way of column selection switch CSW. The read bit line RBL (j) has its other end connected to the data cell DATA-CELL.

The write bit lines WBL (c), WBL (l) are arranged between write bit line driver/sinker 43 and write bit line driver/sinker 44 and extends in the X-direction. The write bit lines WBL (c), WBL (l) pass near the MTJ element MTJ of the reference cell REF-CELL. The read bit lines RBL (c), RBL (l) extend in the X-direction on the memory cell array. Each of the read bit lines RBL (c), RBL (l) has one of its ends connected to the read circuit 20 by way of the column selection switch CSW. The read bit lines RBL (c), RBL (l) are connected to the reference cell REF-CELL.

While the ON/OFF operation of the column selection switch CSW that is connected to the read bit line RBL (i) is controlled by the output signal of the column decoder 35, the ON/OFF operation of the column selection switches CSW that are connected respectively to the read bit lines RBL (c), RBL (l) is controlled by read signal READ that comes up to "H" for a read operation. In other words, when the read signal READ comes up to "H", a bias current/potential and a reference current/potential are immediately generated according to the data of the reference cell REF-CELL.

While dummy cells DUMMY-CELL are connected respectively to the read bit lines RBL (j), RBL (c), RBL (l), a normal read operation is performed by applying a bias potential to, for instance, the read word line RWL (i) because the read selection switch SW and the MTJ element MTJ of each of the dummy cells DUMMY-CELL are cut apart.

FIG. 5 is schematic circuit diagram of a first example of read circuit.

Note that, for the purpose of simplicity, the write circuits are partly omitted in terms of, for example, write word line driver/sinker, write word line and write bit line driver/sinker.

The read circuit 20 includes a sense amplifier 46, an operational amplifier 45, P-channel MOS transistors P1 and N-channel MOS transistors N1.

The operational amplifier 45 generates a bias potential (clamp potential) that makes the potential of node a equal to VBIAS and applies it to the gates of the N-channel MOS transistors N1. The bias potential is defined on the basis of the state of the reference cell connected to the read bit line RBL (c).

The P-channel MOS transistors P1 form a current mirror circuit and apply a bias current that is defined on the basis of the state of the reference cell connected to the read bit line RBL (l) to data cells in the data cell array 12.

For a read operation, firstly, the gates of the N-channel MOS transistors TN3 in the column decoder & driver/sinker 16A and the column decoder & driver/sinker 16B come up to "H" and the ground potential Vss is selected to all the write bit lines WBL (j), WBL (c), WBL (l).

As the read signal READ comes up to "H" and the read word line RWL (ref) also comes up to "H", the read circuit 20 generates a bias potential/current according to the data in the selected reference cell in the reference cell array 13A.

Thereafter, as the read word line RWL (i) comes up to "H" and, for example, the output signal of the column decoder (j) comes up to "H", the read bit line RBL (j) is electrically connected to the read circuit 20 by way of the column selection switch CSW.

Since the potential of node b in the read circuit 20 changes according to the data of the selected data cell in the data cell array 12, the data can be read by detecting the change by means of the sense amplifier 46.

FIG. 6 is schematic circuit diagram of a second example of read circuit.

This read circuit is a variant of the read circuit of FIG. 5. The read circuit of FIG. 6 differs from that of FIG. 5 in that the an operational amplifier 47 is used for the sense amplifier 46 and a reference cell is additionally provided in order to generate reference potential VREF that is necessary to judge the data value by means of the operational amplifier 47.

Thus, referring to FIG. 6, the read circuit 20 includes a sense amplifier 46, an operational amplifier 45, P-channel MOS transistor P1 and N-channel MOS transistor N1. It will be appreciated that the number of elements of the read circuit 20 of FIG. 6 is greater than that of the read circuit of FIG. 5 because it is necessary to generate reference potential VREF.

The operational amplifier 45 generates a bias potential (clamp potential) that makes the potential of node a equal to VBIAS and applies it to the gates of the N-channel MOS transistors N1. The bias potential is defined on the basis of the state of the reference cell connected to the read bit line RBL (c).

The P-channel MOS transistors P1 form a current mirror circuit and apply a bias current that is-defined on the basis of the state of the reference cell connected to the read bit line RBL (l) to data cells in the data cell array 12.

For a read operation, firstly, the gates of the N-channel MOS transistors TN3 in the column decoder & driver/sinker 16A and the column decoder & driver/sinker 16B come up to "H" and the ground potential Vss is selected to all the write bit lines WBL (j), WBL (c), WBL (l).

As the read signal READ comes up to "H" and the read word line RWL (ref) also comes up to "H", the read circuit 20 generates a bias potential/current and reference potential VREF according to the data in the selected reference cell in the reference cell array 13A.

Thereafter, as the read word line RWL (i) comes up to "H" and, for example, the output signal of the column decoder (j) comes up to "H", the read bit line RBL (j) is electrically connected to the read circuit 20 by way of the column selection switch CSW.

Since the potential of node b in the read circuit 20 changes according to the data of the selected data cell in the data cell array 12, the value of the read data can be determined by comparing the potential of the node b and the reference potential VREF after the change.

FIG. 7 is schematic circuit diagram of a third example of read circuit.

This read circuit is a variant of the read circuit of FIG. 6. The read circuit of FIG. 7 differs from that of FIG. 6 in terms of the time when a bias current/potential is generated and the time when a reference potential VREF is generated.

More specifically, in this example, data cells and reference cells are commonly connected to the read word line RWL (i) and a cell data and a reference cell data are input to the sense amplifier 47 at the same timing.

Just like the read circuit of FIG. 6, the read circuit 20 of this example includes a sense amplifier 46, an operational amplifier 45, P-channel MOS transistor P1 and N-channel MOS transistor N1. However, in this example, the reference cell a that is required to generate reference potential VREF is connected to the read word line RWL (i) and a dummy cell β is arranged in the reference cell array 13A as part of the latter.

For a read operation, firstly, the gates of the N-channel MOS transistors TN3 in the column decoder & driver/sinker 16A and the column decoder & driver/sinker 16B come up to "H" and the ground potential Vss is selected to all the write bit lines WBL (j), WBL (c), WBL (l).

As the read signal READ comes up to "H" and the read word line RWL (ref) also comes up to "H", the read circuit 20 generates a bias potential/current according to the data in the selected reference cell in the reference cell array 13A.

Thereafter, as the read word line RWL (i) comes up to "H" and, for example, the output signal of the column decoder (j) comes up to "H", the read bit line RBL (j) is electrically connected to the read circuit 20 by way of the column selection switch CSW. Thus, the data of the selected data cell in the data cell array 12 is input to the sense amplifier 47.

Since the reference potential VREF generated by the reference cell a is input to the sense amplifier 47 at the same time, the sense amplifier 47 can determine the value of the read data.

Figure 8:
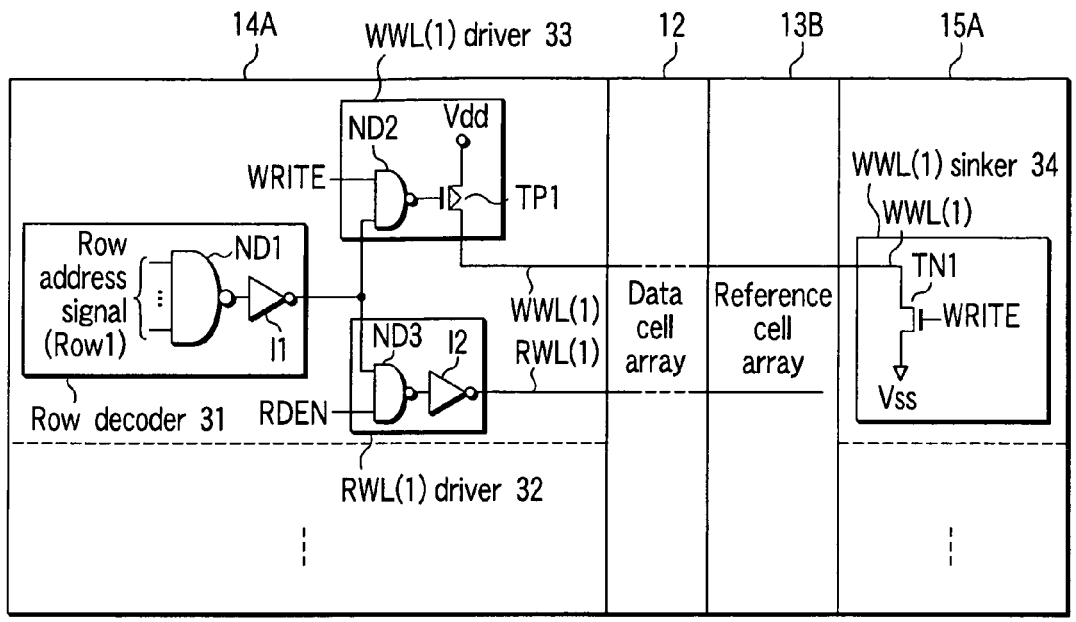
FIG. 8 is a schematic circuit diagram of a first example of row decoder and driver/sinker for data cells.

FIG. 8 is a schematic circuit diagram of a first example of row decoder and driver/sinker for data cells.

For this example, the circuit of row decoder & driver 14A and sinker 15A of a row will be described.

The row decoder & driver 14A includes row decoders 31, read word line drivers 32 and write word line drivers 33.

Each row decoder 31 is formed by a NAND gate circuit ND1 to which a row address signal is input and an inverter I1. One of row address signals that are different from row to row is input to the NAND gate circuit ND1 and the output signal of the row decoder 31 comes up to "H" when all the bits of the row address signal are at "H".

The read word line driver 32 is formed by a NAND gate circuit ND3 to which the output signal of the row decoder 31 and row decoder enable signal RDEN are input and an inverter I2. The row decoder enable signal RDEN is a signal that comes up to "H" when a predetermined period of time has elapsed since the time when the read signal READ came up to "H".

For example, the row decoder enable signal RDEN comes up to "H" after the read signal READ has come up to "H" and the row address signal is determined.

The write word line driver 33 is formed by a NAND gate circuit ND2 to which the output signal of the row decoder 31 and write signal WRITE are input and a P-channel MOS transistor TP1 that receives the output signal of the NAND gate circuit ND2. The write signal WRITE is a signal that comes up to "H" for a write operation.

The sinker 34 is formed by an N-channel MOS transistor TN1 to the gate of which write signal WRITE is input.

Figure 9:
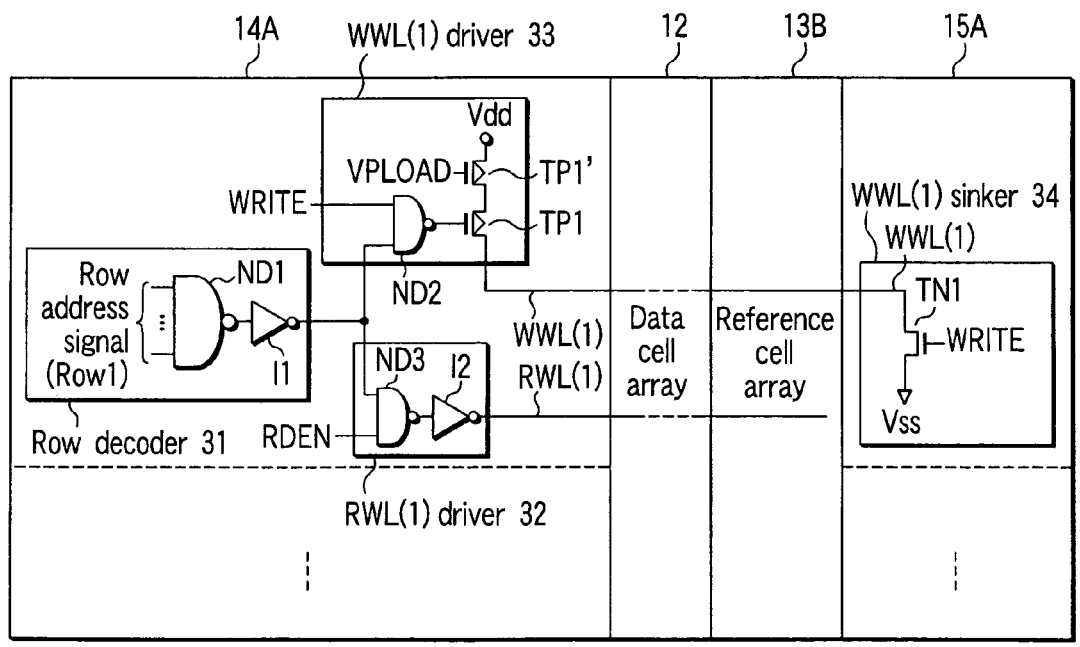
FIG. 9 is a schematic circuit diagram of a second example of row decoder and driver/sinker for data cells.

FIG. 9 is a schematic circuit diagram of a second example of row decoder and driver/sinker for data cells.

The circuit of this example differs from that of FIG. 8 only in terms of the configuration of the write word line driver 33. Otherwise, it is identical with the circuit of FIG. 8.

A P-channel MOS transistor TP1' to the gate of which VPLOAD is input is connected between the power supply terminal Vdd and the P-channel MOS transistor TP1 of the write word line driver 33.

The circuit of this example is exempted from fluctuations in the write current due to fluctuations of the supply potential Vdd, or the supply potential dependency of the write current, because the P-channel MOS transistor TP1' is used as constant current source.

Additionally, the likelihood of occurrence of magnetization reversal depends on temperature and the value of VPLOAD potential is made dependent-on temperature in the circuit of this example in order to avoid operation errors.

A circuit described in Japanese Patent Application No. 2003-121633 may be used to realize temperature dependency of VPLOAD. The cited patent document also describes the relationship between the pulse width of a write current (current pulse) and temperature. The shape and the timing of application of a current pulse are described in Japanese Patent Application No. 2002-140499.

FIG. 10 is a schematic circuit diagram of a first example of row decoder and driver/sinker for reference cells.

For this example, the circuit of row decoder & driver 14B and sinker 15B of a row will be described.

The row decoder & driver 14B includes a row decoder 38, a write word line driver 39 and a read word line driver 40.

The row decoder 38 is formed by a NAND gate circuit ND4 to which a row address signal is input and an inverter I3. A row address signal is input to the NAND gate circuit ND4 and the output signal of the row decoder 38 comes up to "H" when all the bits of the row address signal are at "H".

The write word line driver 39 is formed by a NAND gate circuit ND5 to which the output signal of the row decoder 38 and write signal WRITE are input and a P-channel MOS transistor TP2 that receives the output signal of the NAND gate circuit ND5. The write signal WRITE is a signal that comes up to "H" for a write operation.

The sinker 41 is formed by an N-channel MOS transistor TN2 to the gate of which write signal WRITE is input.

The read word line driver 40 is formed by inverters I4, I5. Read signal READ is input to the read word line driver 40.

At the row decoder & driver for the data cells (e.g., of FIG. 8), row decoder enable signal RDEN is input to the read word line driver 32. More specifically, for a read operation, read signal READ comes up to "H" and the data of the reference cell is read immediately. Subsequently, the row address signal is determined and the data of the cell is read when the row decoder enable signal RDEN comes up to "H".

FIG. 11 is a schematic circuit diagram of a second example of row decoder and driver/sinker for reference cells.

The circuit of this example differs from that of FIG. 10 only in terms of the configuration of the write word line driver 39. Otherwise, it is identical with the circuit of FIG. 10.

A P-channel MOS transistor TP2' to the gate of which VPLOAD is input is connected between the power supply terminal Vdd and the P-channel MOS transistor TP2 of the write word line driver 39.

The circuit of this example is exempted from fluctuations in the write current due to fluctuations of the supply potential Vdd, or the supply potential dependency of the write current, because the P-channel MOS transistor TP2' is used as constant current source.

Additionally, the likelihood of occurrence of magnetization reversal depends on temperature and the value of VPLOAD potential is made dependent on temperature in the circuit of this example in order to avoid operation errors.

A circuit described in Japanese Patent Application No. 2003-121633 may be used to realize temperature dependency of VPLOAD. The cited patent document also describes the relationship between the pulse width of a write current (current pulse) and temperature. The shape and the timing of application of a current pulse are described in Japanese Patent Application No. 2002-140499.

Figure 12:
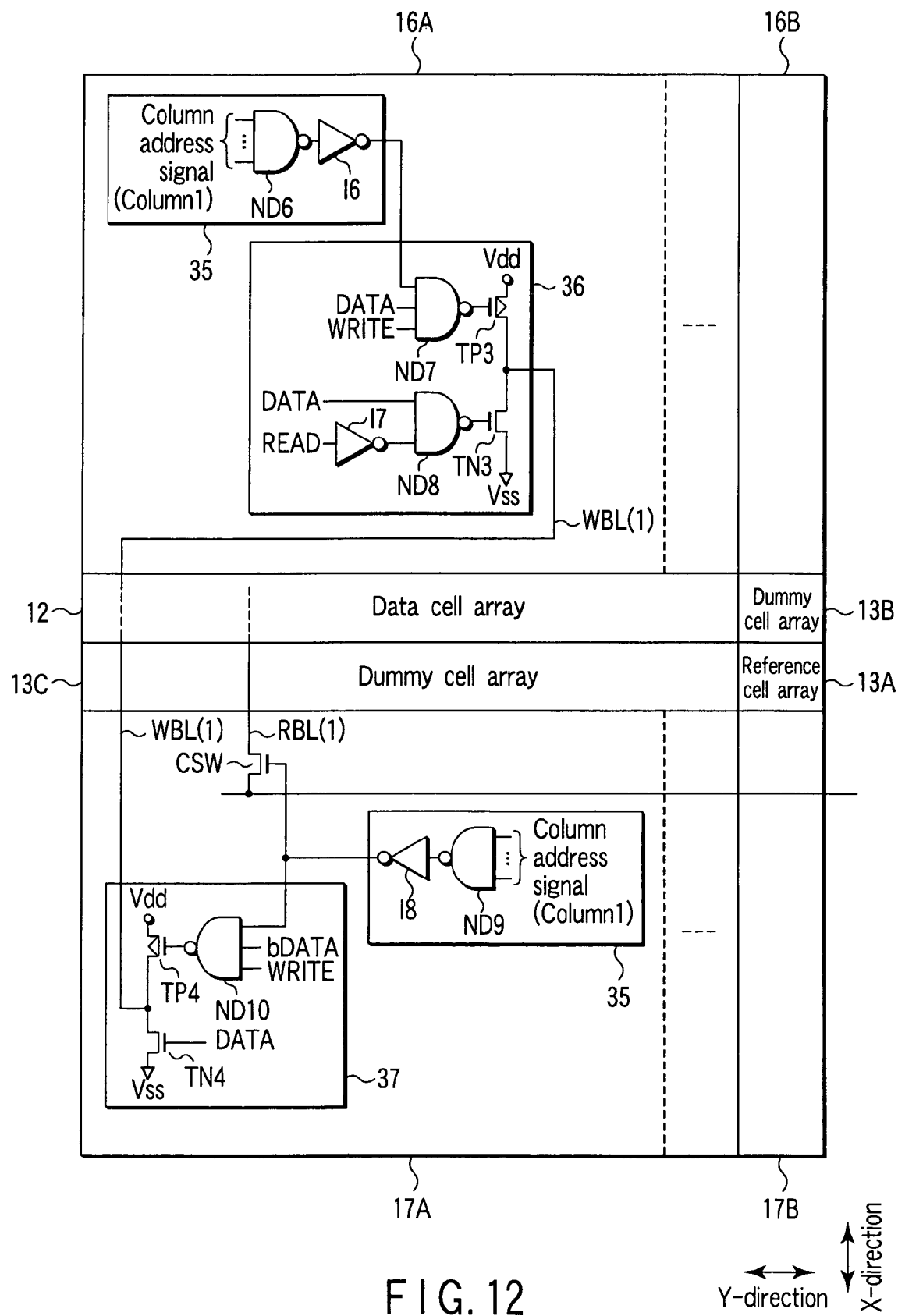
FIG. 12 is a schematic circuit diagram of a first example of column decoder and driver/sinker for data cells.

FIG. 12 is a schematic circuit diagram of a first example of column decoder and driver/sinker for data cells.

For this example, the circuit of column decoder & driver/sinker 16A and column decoder & driver/sinker 17A of a column will be described.

The column decoder & driver/sinker 16A includes a column decoder 35 and a write bit line driver/sinker 36.

The column decoder 35 is formed by a NAND gate circuit ND6 to which a column address signal is input and an inverter I6. One of column address signals that are different from column to column is input to the NAND gate circuit ND6 and the output signal of the column decoder 35 comes up to "H" when all the bits of the column address signal are at "H".

The write bit line driver/sinker 36 is formed by a NAND gate circuit ND7 to which the output signal of the column decoder 35, write signal WRITE and data DATA are input, a NAND gate circuit ND8 to which data DATA and inverted signal bREAD of read signal READ are input, an inverter I7, a P-channel MOS transistor TP3 to the gate of which the output signal of the NAND gate circuit ND7 is applied and an N-channel MOS transistor TN3 to the gate of which the output signal of the NAND gate circuit ND8 is applied.

The column decoder & driver/sinker 17A includes a column decoder 35 and a write bit line driver/sinker 37.

The column decoder 35 is formed by a NAND gate circuit ND9 to which a column address signal is input. One of column address signals that are different from column to column is input to the NAND gate circuit ND9 and the output signal of the column decoder 35 comes up to "H" when all the bits of the column address signal are at "H".

The write bit line driver/sinker 37 is formed by a NAND gate circuit ND10 to which the output signal of the column decoder 35, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

With the column decoder & driver/sinker 16A and column decoder & driver/sinker 17A having the above described configuration, for example, the output signal of the column decoder 35 of the selected column comes up to "H" after the write signal WRITE comes up to "H" and the column address signal is determined.

When the write data is equal to "1" (="H"), the MOS transistors TP3, TN4 become ON and the MOS transistors TP4, TN3 become OFF. Therefore, the write current flows from the column decoder & driver/sinker 16A toward the column decoder & driver/sinker 17A.

When, on the other hand, the write data is equal to "0" (="L"), the MOS transistors TP4, TN3 become ON and the MOS transistors TP3, TN4 become OFF. Therefore, the write current flows from the column decoder & driver/sinker 17A toward the column decoder & driver/sinker 16A.

Note that, since the read signal READ comes up to "H" for a read operation, the output signal of the NAND gate circuit ND8 also comes up to "H" so that only the N-channel MOS transistor TN3 becomes ON to show a state as shown in FIGS. 5, 6 and 7.

Figure 13:
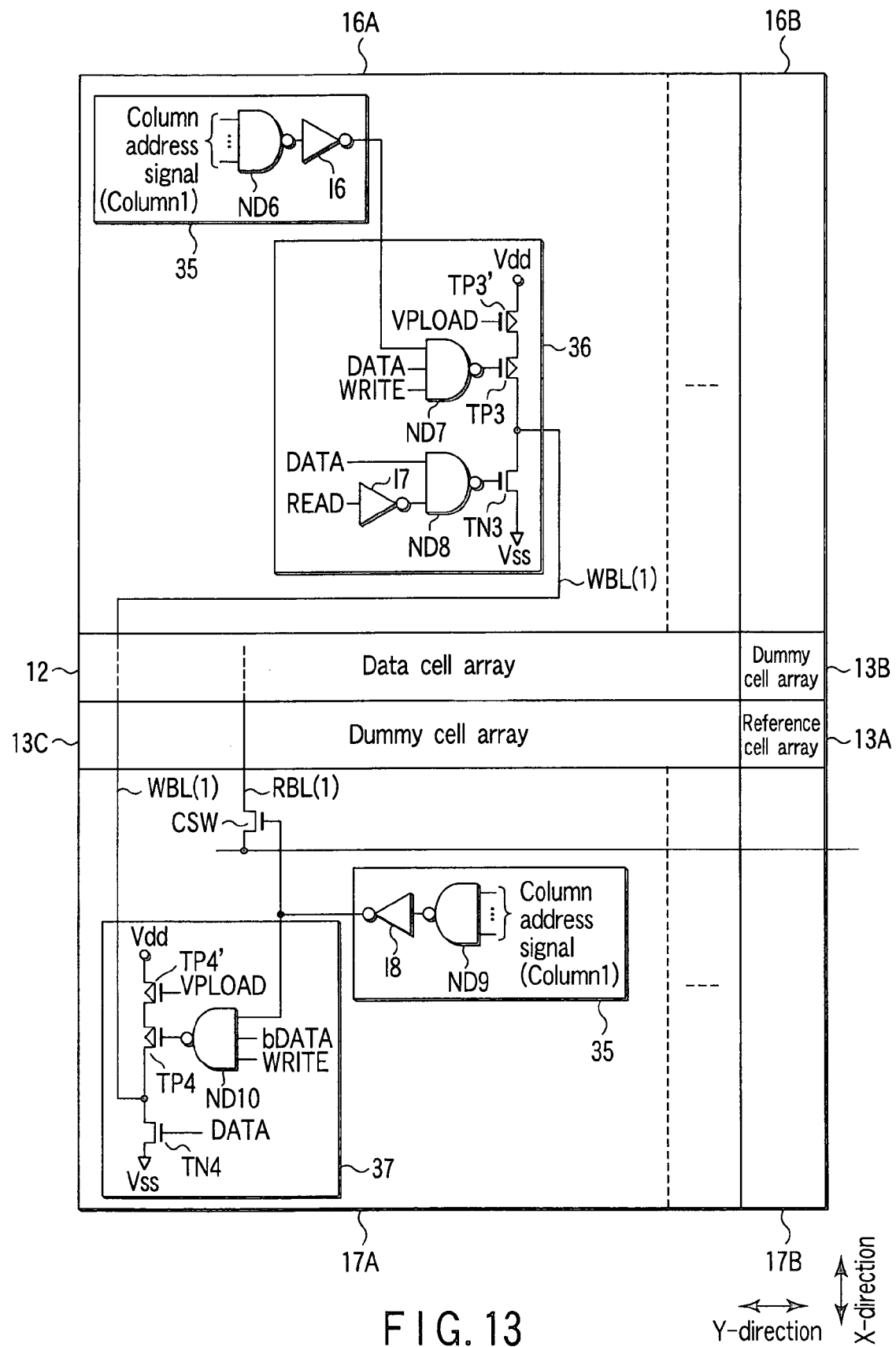
FIG. 13 is a schematic circuit diagram of a second example of column decoder and driver/sinker for data cells.

FIG. 13 is a schematic circuit diagram of a second example of column decoder and driver/sinker for data cells.

The circuit of this example differs from that of FIG. 12 only in terms of the configuration of the write bit line driver/sinker 36 and that of the write bit line driver/sinker 37. Otherwise, it is identical with the circuit of FIG. 12.

A P-channel MOS transistor TP3' to the gate of which VPLOAD is input is connected between the power supply terminal Vdd and the P-channel MOS transistor TP3 of the write bit line driver/sinker 36. Additionally, a P-channel MOS transistor TP4' to the gate of which VPLOAD is input is connected between the power supply terminal Vdd and the P-channel MOS transistor TP4 of the write bit line driver/sinker 37.

The circuit of this example is exempted from fluctuations in the write current due to fluctuations of the supply potential Vdd, or the supply potential dependency of the write current, because the P-channel MOS transistors TP3', TP4' are used as constant current source.

Additionally, the likelihood of occurrence of magnetization reversal depends on temperature and the value of VPLOAD potential is made dependent on temperature in the circuit of this example in order to avoid operation errors.

A circuit described in Japanese Patent Application No. 2003-121633 may be used to realize temperature dependency of VPLOAD. The cited patent document also describes the relationship between the pulse width of a write current (current pulse) and temperature. The shape and the timing of application of a current pulse are described in Japanese Patent Application No. 2002-140499. Additionally, the method described in Japanese Patent Application No. 2002-179914 may be used with regard to a shift of an asteroid curve.

Figure 14:
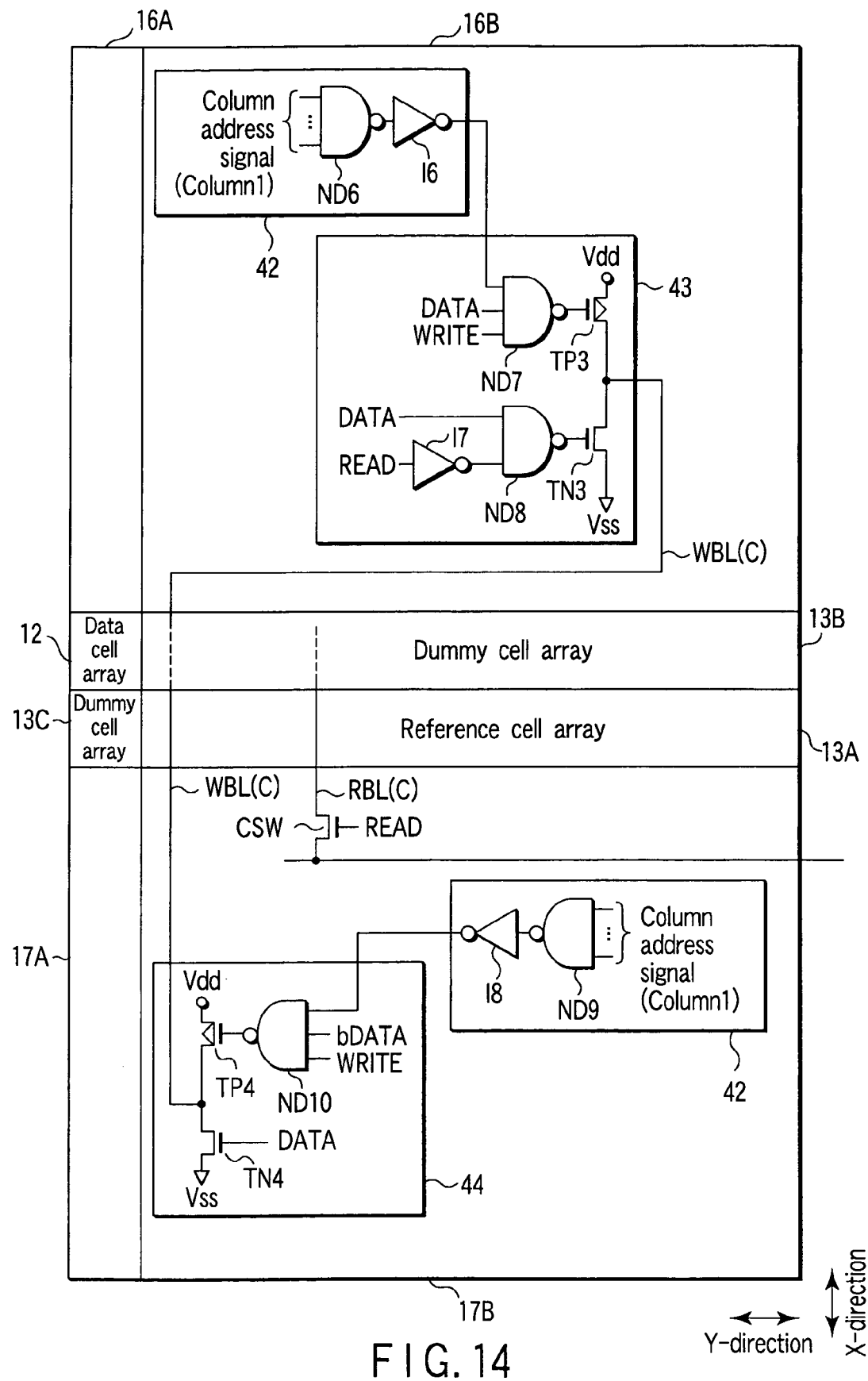
FIG. 14 is a schematic circuit diagram of a first example of column decoder and driver/sinker for reference cells.

FIG. 14 is a schematic circuit diagram of a first example of column decoder and driver/sinker for reference cells.

For this example, the circuit of column decoder & driver/sinker 16B and column decoder & driver/sinker 17B of a column will be described.

The column decoder & driver/sinker 16B includes a column decoder 42 and a write bit line driver/sinker 43.

The column decoder 42 is formed by a NAND gate circuit ND6 to which a column address signal is input and an inverter I6. One of column address signals that are different from column to column is input to the NAND gate circuit ND6 and the output signal of the column decoder 42 comes up to "H" when all the bits of the column address signal are at "H".

The write bit line driver/sinker 43 is formed by a NAND gate circuit ND7 to which the output signal of the column decoder 42, write signal WRITE and data DATA are input, a NAND gate circuit ND8 to which data DATA and inverted signal bREAD of read signal READ are input, an inverter I7, a P-channel MOS transistor TP3 to the gate of which the output signal of the NAND gate circuit ND7 is applied and an N-channel MOS transistor TN3 to the gate of which the output signal of the NAND gate circuit ND8 is applied.

The column decoder & driver/sinker 17B includes a column decoder 42 and a write bit line driver/sinker 44.

The column decoder 42 is formed by a NAND gate circuit ND9 to which a column address signal is input and an inverter I8. One of column address signals that are different from column to column is input to the NAND gate circuit ND9 and the output signal of the column decoder 42 comes up to "H" when all the bits of the column address signal are at "H".

The write bit line driver/sinker 44 is formed by a NAND gate circuit ND10 to which the output signal of the column decoder 42, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

With the column decoder & driver/sinker 16B and the column decoder & driver/sinker 17B having the above described configuration, for example, the output signal of the column decoder 35 of the selected column comes up to "H" after the write signal WRITE comes up to "H" and the column address signal is determined.

When the write data is equal to "1" (="H"), the MOS transistors TP3, TN4 become ON and the MOS transistors TP4, TN3 become OFF. Therefore, the write current flows from the column decoder & driver/sinker 16B toward the column decoder & driver/sinker 17B.

When, on the other hand, the write data is equal to "0" (="L"), the MOS transistors TP4, TN3 become ON and the MOS transistors TP3, TN4 become OFF. Therefore, the write current flows from the column decoder & driver/sinker 17B toward the column decoder & driver/sinker 16B.

Note that, since the read signal READ comes up to "H" for a read operation, the output signal of the NAND gate circuit ND8 also comes up to "H" so that only the N-channel MOS transistor TN3 becomes ON to show a state as shown in FIGS. 5, 6 and 7.

Figure 15:
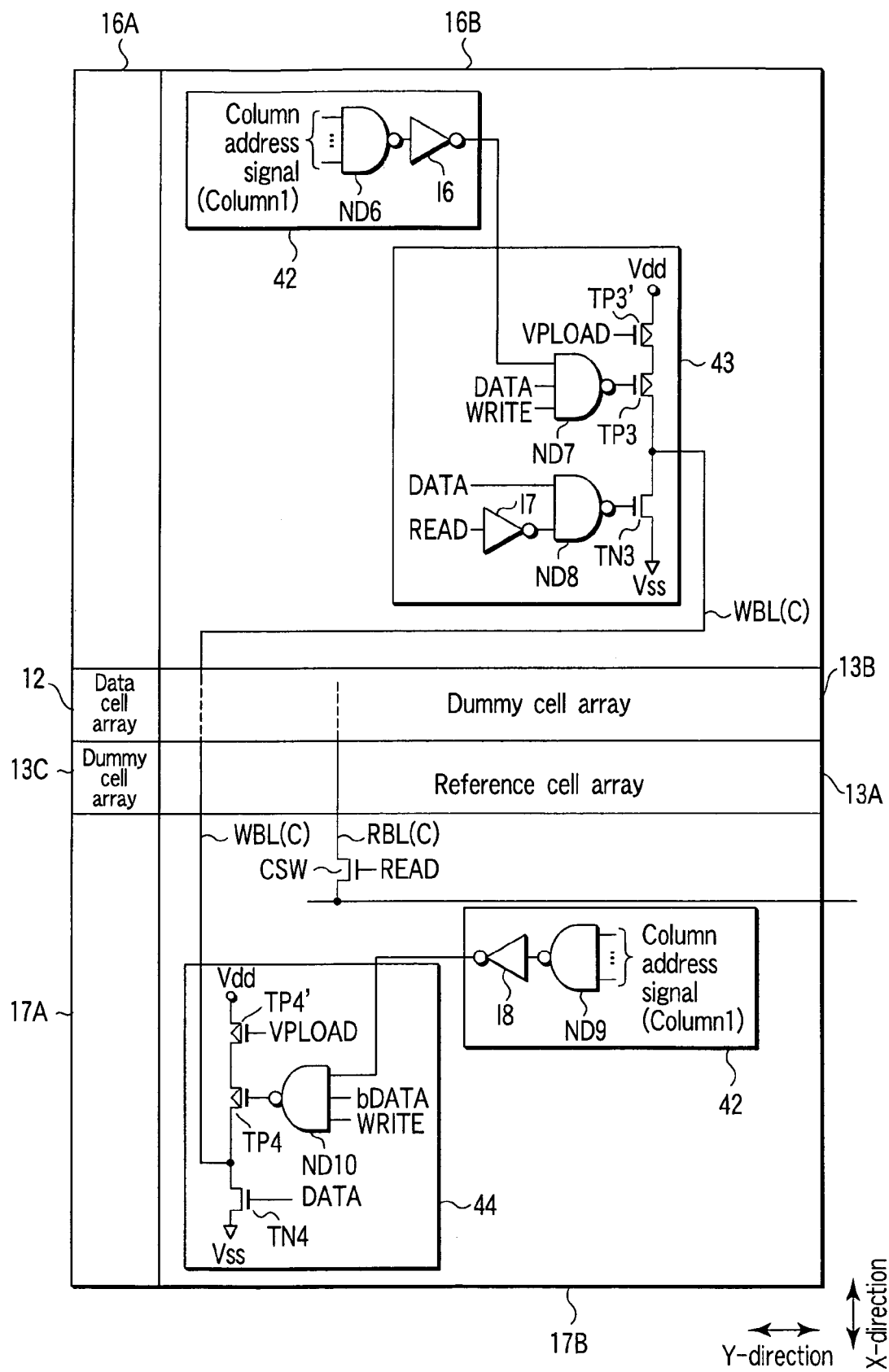
FIG. 15 is a schematic circuit diagram of a second example of column decoder and driver/sinker for reference cells.

FIG. 15 is a schematic circuit diagram of a second example of column decoder and driver/sinker for reference cells.

The circuit of this example differs from that of FIG. 14 only in terms of the configuration of the write bit line driver/sinker 43 and that of the write bit line driver/sinker 44. Otherwise, it is identical with the circuit of FIG. 14.

A P-channel MOS transistor TP3' to the gate of which VPLOAD is input is connected between the power supply terminal Vdd and the P-channel MOS transistor TP3 of the write bit line driver/sinker 43. Additionally, a P-channel MOS transistor TP4' to the gate of which VPLOAD is input is connected between the power supply terminal Vdd and the P-channel MOS transistor TP4 of the write bit line driver/sinker 44.

The circuit of this example is exempted from fluctuations in the write current due to fluctuations of the supply potential Vdd, or the supply potential dependency of the write current, because the P-channel MOS transistors TP3', TP4' are used as constant current source.

Additionally, the likelihood of occurrence of magnetization reversal depends on temperature and the value of VPLOAD potential is made dependent on temperature in the circuit of this example in order to avoid operation errors.

A circuit described in Japanese Patent Application No. 2003-121633 may be used to realize temperature dependency of VPLOAD. The cited patent document also describes the relationship between the pulse width of a write current (current pulse) and temperature. The shape and the timing of application of a current pulse are described in Japanese Patent Application No. 2002-140499. Additionally, the method described in Japanese Patent Application No. 2002-179914 may be used with regard to a shift of an asteroid curve.

2. 2nd Embodiment

FIG. 16 is a schematic block diagram of the second embodiment of magnetic random access memory according to the invention.

This second embodiment of magnetic random access memory is characterized in that the read circuit 20 is not connected to the side of the column decoder & driver/sinker 17A and the column decoder & driver/sinker 17B but to the side of the row decoder & driver 14A and the row decoder & driver 14B.

As in the first embodiment, a magnetic random access memory (MRAM) 11 may constitute a memory chip by itself or may be a block in a system LSI comprising a plurality of blocks.

The memory cell array comprises a data cell array 12, a reference cell array 13A and dummy cell arrays 13B, 13C. Since the configuration of the cell array is already described in detail by referring to the first embodiment, it will not be described here any further.

Row decoder & driver (row decoder RD & write word line driver WWL-Dv., row selection switch RSW) 14A is arranged at one of the opposite ends of the block formed by the data cell array 12 and the dummy cell array 13B as viewed in Y-direction (the direction of Easy-Axis) and sinker (write word line sinker WWL-SNK) 15A is arranged at the other end.

Row decoder & driver (row decoder RD & write word line driver WWL-Dv. (ref), row selection switch RSW) 14B is arranged at one of the opposite ends of the block formed by the reference cell array 13A and the dummy cell array 13C as viewed in Y-direction (the direction of Easy-Axis) and sinker (write word line sinker WWL-SNK) (ref)) 15B is arranged at the other end.

For a write operation, the row decoder & driver 14A and the row decoder & driver 14B typically function to select one of a plurality of write word lines according to a row address signal and supply a write current to the selected write word line for a write operation, whereas the sinkers 15A, 15B typically function to absorb the write current supplied to the selected write word line.

For a read operation, the row selection switch RSW functions to electrically connect the read bit line that is selected by a row address signal to the sense amplifier 20 for a read operation.

Column decoder & driver/sinker (column decoder CD & write bit line driver/sinker WBL-Dv. /SNK) 16A is arranged at one of the opposite ends of the block formed by the data cell array 12 and the dummy cell array 13C as viewed in X-direction (the direction of Hard-Axis) and column decoder & driver/sinker (column decoder CD & write bit line driver/sinker WBL-Dv. /SNK, read word line driver RWL-Dv.) 17B is arranged at the other end.

Column decoder & driver/sinker (column decoder CD & write bit line driver/sinker WBL-Dv. /SNK) 16B is arranged at one of the opposite ends of the block formed by the reference cell array 13A and the dummy cell array 13B as viewed in X-direction (the direction of Hard-Axis) and column decoder & driver/sinker (column decoder CD & write bit line driver/sinker WBL-Dv. /SNK, read word line driver RWL-Dv. (ref)) 17A is arranged at the other end.

For a write operation, the column decoder & driver/sinker 16A, the column decoder & driver/sinker 16B, the column decoder & driver/sinker 17A and the column decoder & driver/sinker 17B function to select one of a plurality of write bit lines according to a column address signal and flow a write current that is directed according to the applied write data to the selected write bit line.

For a read operation, the column decoder &driver/sinker 17A and the column decoder & driver/sinker 17B function to select one of a plurality of read word lines (which may be separated from or integrated with the write bit lines) according to a column address signal and bring up the selected read word line to "H".

Address receiver 18 receives an address signal and transfers a row address signal to the row decoder & driver 14A and the row decoder & driver 14B and also a column address signal to the column decoder & driver/sinker 16A, the column decoder & driver/sinker 16B, the column decoder & driver/sinker 17A and the column decoder & driver/sinker 17B. Data input receiver 19A transfers a write data to the column decoder & driver/sinker 16A, the column decoder & driver/sinker 16B, the column decoder & driver/sinker 17A and the column decoder & driver/sinker 17B. Data output driver 21 outputs the read data detected by the sense amplifier 20 to the outside of the magnetic random access memory 11.

Control circuit 22 receives /CE signal (the inverted signal of the chip enable signal), /WE signal (the inverted signal of the write enable signal) and /OE signal (the inverted signal of the output enable signal) and controls the operation of the magnetic random access memory 11. For a write operation, for example, the control circuit 22 applies write signal WRITE to the row decoder & driver 14A, the row decoder & driver 14B, the column decoder & driver/sinker 16A, the column decoder & driver/sinker 16B, the column decoder & driver/sinker 17A and the column decoder & driver/sinker 17B.

Figure 17:
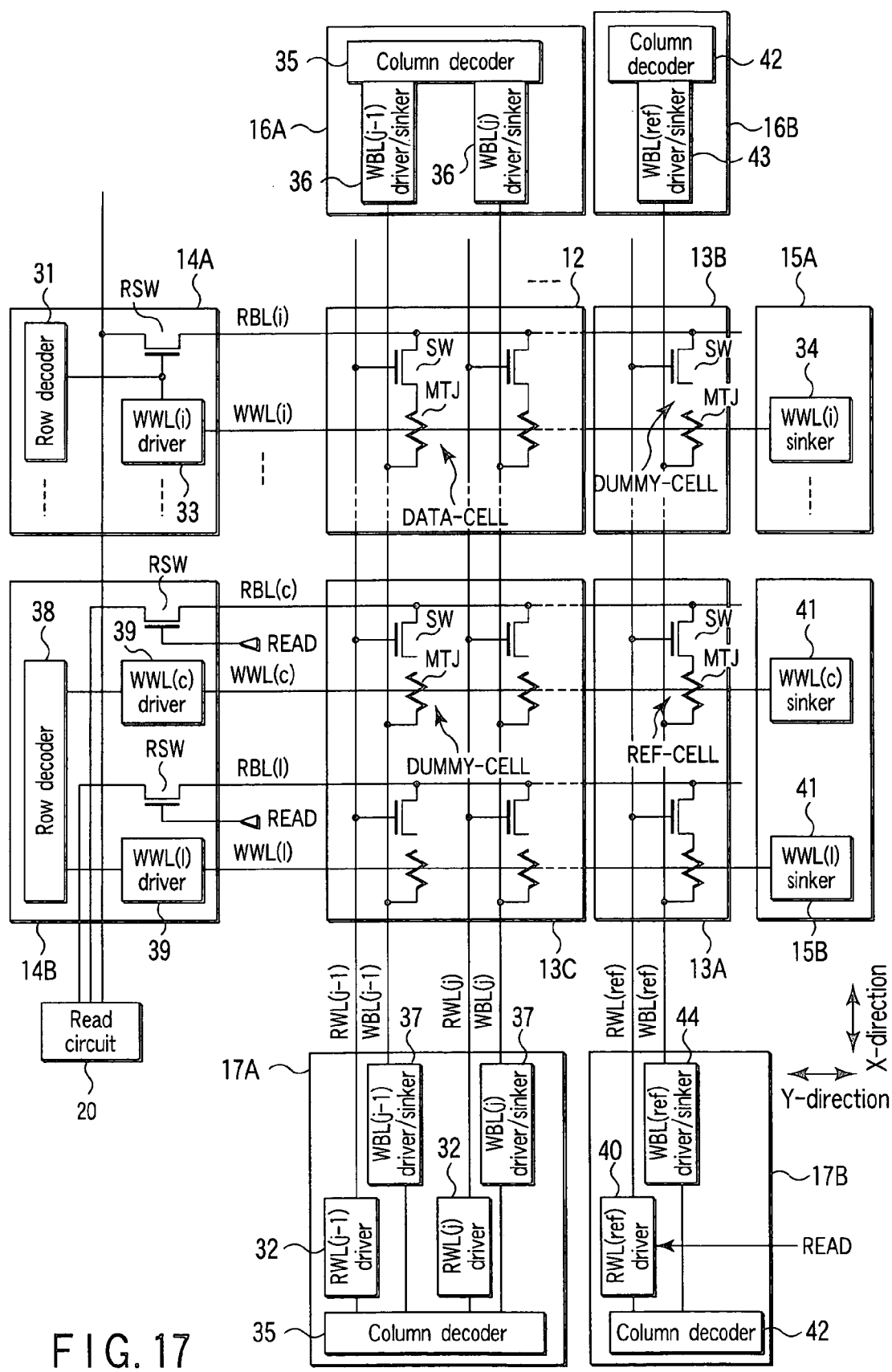
FIG. 17 is a schematic circuit diagram of the second embodiment of MRAM according to the invention.

FIG. 17 specifically illustrates the memory cell array and their peripherals thereof in FIG. 16.

The circuit structure and the device structure of the data cell array 12, those of the reference cell array 13A and those of the dummy cell arrays 13B, 13C are identical with those of their counterparts of the above described first embodiment and hence will not be described here any further.

The read word line RWL (j) of this embodiment extends in the X-direction from the read word line driver 32. In other words, the read word line RWL (j) is arranged in parallel with the write bit line WBL (j). The read word line RWL (j) is connected to the read selection switch SW of the data cell DATA-CELL.

The write bit line WBL (j) is arranged between the write bit line driver/sinker 36 and the write bit line driver/sinker 37 and extends in the X-direction. The write bit line WBL (j) passes near the MTJ element MTJ of the data cell DATA-CELL.

The read word line RWL (ref) extends in the X-direction from read word line driver 40. In other words, the read word line RWL (ref) is arranged in parallel with the write bit line WBL (ref). The read word line RWL (ref) is connected to read selection switch SW of the data cell DATA-CELL.

The write bit line WBL (ref) is arranged between the write bit line driver/sinker 43 and the write bit line driver/sinker 44 and extends in the X-direction. The write bit line WBL (ref) passes near the MTJ element MTJ of the reference cell REF-CELL'.

The write word line WWL (i) extends in the Y-direction from write word line driver 33 to write word line sinker 34. The write word line WWL (i) passes near the MTJ element MTJ of the data cell DATA-CELL.

The read bit line RBL (i) extends in the Y-direction on the memory cell array. The read bit line RBL (i) has one of its ends connected to the read circuit 20 by way of the row selection switch RSW. The read bit line RBL (i) has its other end connected to the data cell DATA-CELL.

The write word lines WWL (c) and WWL (l) extend in the Y-direction from the write word line driver 39 to the write word line sinker 41. The write word lines WWL (c), WWL (l) pass near the MTJ element MTJ of the reference cell REF-CELL.

The read bit lines RBL (c), RBL (l) extend in the Y-direction on the memory cell array. One of the opposite ends of each of the read bit lines RBL (c), RBL (l) is connected to the read circuit 20 by way of the row selection switch RSW. The other end of each of the read bit lines RBL (c), RBL (l) is connected to reference cell REF-CELL.

While the ON/OFF operation of the row selection switch RSW that is connected to the read bit line RBL (i) is controlled by the output signal of the row decoder 31, the ON/OFF operation of the row selection switches RSW that are connected to the read bit lines RBL (c), RBL (l) is controlled by read signal READ that comes up to "H" for a read operation. In other words, when the read signal READ comes up to "H", a bias current/potential and a reference current/potential are immediately generated according to the data of the reference cell REF-CELL.

While dummy cells DUMMY-CELL are connected respectively to the read word lines RWL (j), RWL (ref) and read bit lines RBL (i), RBL (c), RBL (l), a normal read operation is performed by applying a bias potential to, for instance, the read word line RWL (i) because the read selection switch SW and the MTJ element MTJ of each of the dummy cells DUMMY-CELL are cut apart.

As in the case of the above-described first embodiment, any of the circuits shown in FIGS. 5, 6 and 7 may be used for the read circuit 20.

Figure 18:
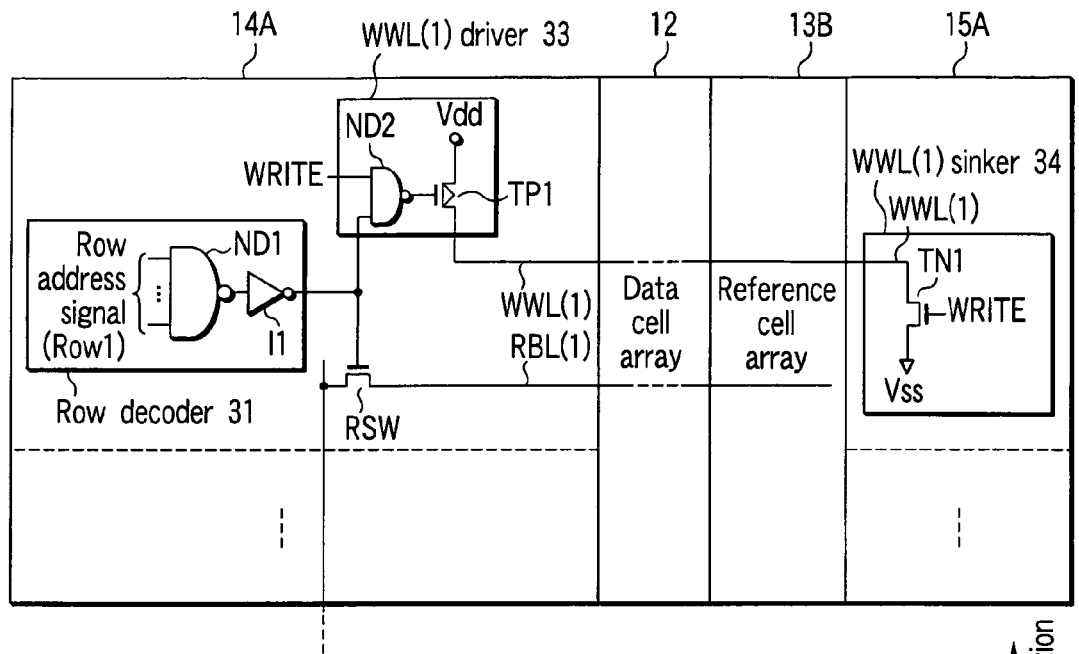
FIG. 18 is a schematic circuit diagram of an example of row decoder and driver/sinker for data cells.

FIG. 18 is a schematic circuit diagram of an example of row decoder and driver/sinker for data cells.

For this example, the circuit of row decoder & driver 14A and sinker 15A of a row will be described.

The row decoder & driver 14A includes row decoders 31, write word line drivers 33 and row selection switches RSW.

Each row decoder 31 is formed by a NAND gate circuit ND1 to which a row address signal is input and an inverter I1. One of row address signals that are different from row to row is input to the NAND gate circuit ND1 and the output signal of the row decoder 31 comes up to "H" when all the bits of the row address signal are at "H".

The write word line driver 33 is formed by a NAND gate circuit ND2 to which the output signal of the row decoder 31 and write signal WRITE are input and a P-channel MOS transistor TP1 that receives the output signal of the NAND gate circuit ND2. The write signal WRITE is a signal that comes up to "H" for a write operation.

The row selection switch RSW is formed by an N-channel MOS transistor. The output signal of the row decoder 31 is input to the gate of the row selection switch RWS. The row selection switch RWS is connected between the read bit line RBL (l) and the read circuit.

The sinker 34 is formed by an N-channel MOS transistor TN1, to the gate of which write signal WRITE is input.

A P-channel MOS transistor TP1' may be added to the write word line driver 33 as constant current source typically as shown in FIG. 9.

Figure 19:
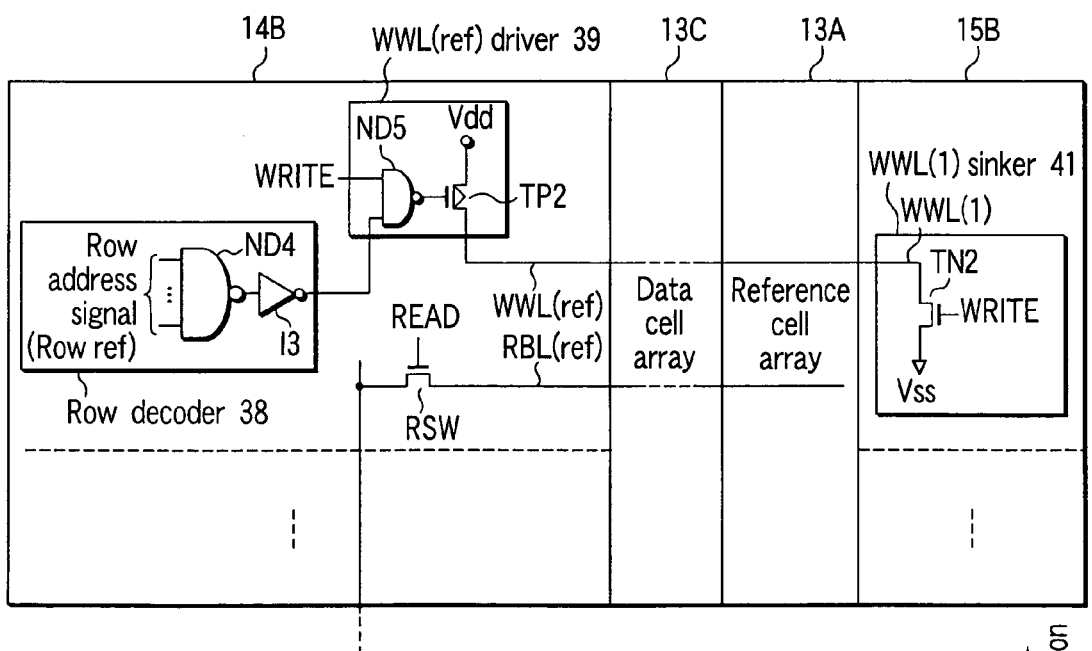
FIG. 19 is a schematic circuit diagram of an example of row decoder and driver/sinker for reference cells.

FIG. 19 is a schematic circuit diagram of an example of row decoder & driver/sinker for reference cells.

For this example, the circuit of row decoder & driver 14B and sinker 15B of a row will be described.

The row decoder & driver 14B includes a row decoder 38, a write word line driver 39 and a row selection switch RSW.

The row decoder 38 is formed by a NAND gate circuit ND4 to which a row address signal is input and an inverter I3. A row address signal is input to the NAND gate circuit ND4 and the output signal of the row decoder 38 comes up to "H" when all the bits of the row address signal are at "H".

The write word line driver 39 is formed by a NAND gate circuit ND5 to which the output signal of the row decoder 38 and write signal WRITE are input and a P-channel MOS transistor TP2 that receives the output signal of the NAND gate circuit ND5. The write signal WRITE is a signal that comes up to "H" for a write operation.

The row selection switch RSW is formed by an N-channel MOS transistor. Read signal READ is input to the gate of the row selection switch RWS. The row selection switch RWS is connected between the read bit line RBL (ref) and the read circuit.

The sinker 41 is formed by an N-channel MOS transistor TN2, to the gate of which write signal WRITE is input.

A P-channel MOS transistor TP2' may be added to the write word line driver 39 as constant current source typically as shown in FIG. 11.

FIG. 20 is a schematic circuit diagram of an example of column decoder and driver/sinker for data cells.

For this example, the circuit of column decoder & driver/sinker 16A and column decoder & driver/sinker 17A of a column will be described.

The column decoder & driver/sinker 16A includes a column decoder 35 and a write bit line driver/sinker 36.

The column decoder 35 is formed by a NAND gate circuit ND6 to which a column address signal is input and an inverter I6. One of a plurality of column address signals that are different from column to column is input to the NAND gate circuit ND6 and the output signal of the column decoder 35 comes up to "H" when all the bits of the column address signal are at "H".

The write bit line driver/sinker 36 is formed by a NAND gate circuit ND7 to which the output signal of the column decoder 35, write signal WRITE and data DATA are input, a NAND gate circuit ND8 to which data DATA and inverted signal bREAD of read signal READ are input, an inverter I7, a P-channel MOS transistor TP3 to the gate of which the output signal of the NAND gate circuit ND7 is applied and an N-channel MOS transistor TN3 to the gate of which the output signal of the NAND gate circuit ND8 is applied.

The column decoder & driver/sinker 17A includes a column decoder 35, a write bit line driver/sinker 37 and a read word line driver 32.

The column decoder 35 is formed by a NAND gate circuit ND9 to which a column address signal is input and an inverter I8. One of a plurality of column address signals that are different from column to column is input to the NAND gate circuit ND9 and the output signal of the column decoder 35 comes up to "H" when all the bits of the column address signal are at "H".

The write bit line driver 37 is formed by a NAND gate circuit ND10 to which the output signal of the column decoder 35, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

The read word line driver 32 is formed by a NAND gate circuit ND3 to which the output signal of the column decoder 35 and column decoder enable signal CDEN are input and an inverter I2. The column decoder enable signal CDEN is a signal that comes up to "H" when a predetermined period of time has elapsed since the time when the read signal READ came up to "H".

For example, the column decoder enable signal CDEN comes up to "H" after the read signal READ comes up to "H" and the column address signal is determined.

With the column decoder & driver/sinker 16A and the column decoder & driver sinker 17A having the above-described configuration, for example, the output signal of the column decoder 35 of the selected column comes up to "H" after the write signal WRITE comes up to "H" and the column address signal is determined.

When the write data is equal to "1" (="H"), the MOS transistors PT3, TN4 become ON and the MOS transistors TP4, TN3 become OFF. Therefore, the write current flows from the column decoder & driver/sinker 16A toward the column decoder & driver/sinker 17A.

When, on the other hand, the write data is equal to "0" (="L"), the MOS transistors TP4, TN3 become ON and the MOS transistors TP3, TN4 become OFF. Therefore, the write current flows from the column decoder & driver/sinker 17A toward the column decoder & driver/sinker 16A.

Note that, since the read signal READ comes up to "H" for a read operation, the output signal of the NAND gate circuit ND8 also comes up to "H" so that only the N-channel MOS transistor TN3 becomes ON to show a state as shown in FIGS. 5, 6 and 7.

P-channel MOS transistors TP3', TP4' may be added respectively to the write bit line driver/sinker 36, the write bit line driver/sinker 37 as constant current sources that do not depend on the value of the supply potential typically as shown in FIG. 13.

Figure 21:
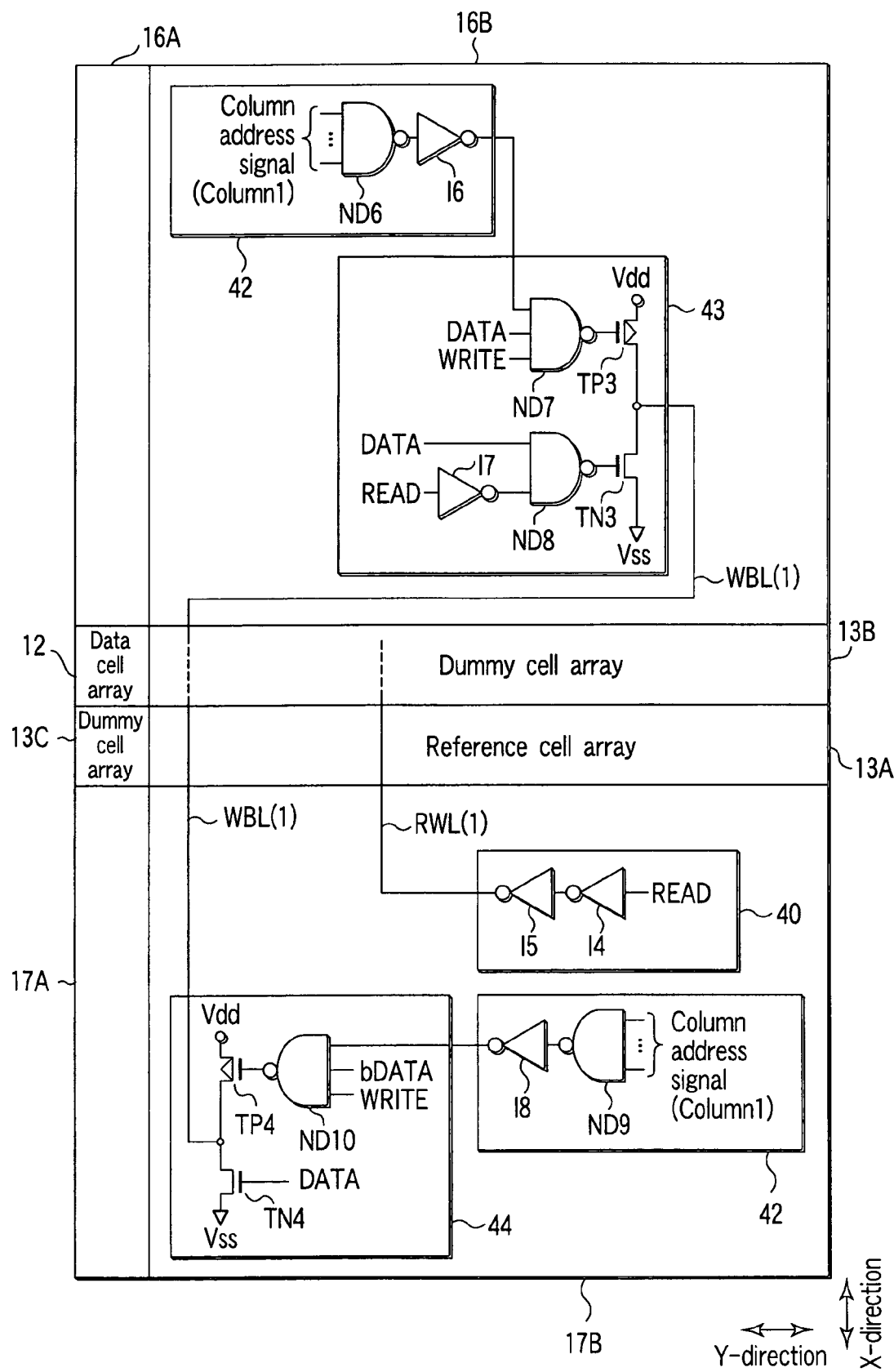
FIG. 21 is a schematic circuit diagram of an example of column decoder and driver/sinker for reference cells.

FIG. 21 is a schematic circuit diagram of an example of column decoder and driver/sinker for reference cells.

For this example, the circuit of column decoder & driver/sinker 16B and column decoder & driver/sinker 17B of a column will be described.

The column decoder & driver/sinker 16B includes a column decoder 42 and a write bit line driver/sinker 43.

The column decoder 42 is formed by a NAND gate circuit ND6 to which a column address signal is input and an inverter I6. One of a plurality of column address signals that are different from column to column is input to the NAND gate circuit ND6 and the output signal of the column decoder 35 comes up to "H" when all the bits of the column address signal are at "H".

The write bit line driver/sinker 43 is formed by a NAND gate circuit ND7 to which the output signal of the column decoder 42, write signal WRITE and data DATA are input, a NAND gate circuit ND8 to which data DATA and inverted signal bREAD of read signal READ are input, an inverter I7, a P-channel MOS transistor TP3 to the gate of which the output signal-of the NAND gate circuit ND7 is applied and an N-channel MOS transistor TN3 to the gate of which the output signal of the NAND gate circuit ND8 is applied.

The column decoder & driver/sinker 17B includes a column decoder 42, a write bit line driver/sinker 44 and a read word line driver 40.

The column decoder 42 is formed by a NAND gate circuit ND9 to which a column address signal is input and an inverter I8. One of a plurality of column address signals that are different from column to column is input to the NAND gate circuit ND9 and the output signal of the column decoder 42 comes up to "H" when all the bits of the column address signal are at "H".

The write bit line driver/sinker 44 is formed by a NAND gate circuit ND10 to which the output signal of the column decoder 42, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

The read word line driver 40 is formed by inverters I4, I5. Read signal READ is input to the read word line driver 40.

At the column decoder & driver/sinker for the data cells (see, for example FIG. 20), column decoder enable signal CDEN is input to the read word line driver 32. More specifically, for a read operation, read signal READ comes up to "H" and immediately the reference cell data is read. Subsequently, the column address signal is determined and the data cell data is read when the column decoder enable CDEN comes to up "H".

With the column decoder & driver/sinker 16B and the column decoder & driver/sinker 17B having the above-described configuration, for example, the output signal of the column decoder 35 comes up to "H" after the write signal WRITE comes up to "H" and the column address signal is determined.

When the write data is equal to "1" (="H"), the MOS transistors PT3, TN4 become ON and the MOS transistors TP4, TN3 become OFF. Therefore, the write current flows from the column decoder & driver/sinker 16B toward the column decoder & driver/sinker 17B.

When, on the other hand, the write data is equal to "0" (="L"), the MOS transistors TP4, TN3 become ON and the MOS transistors TP3, TN4 become OFF. Therefore, the write current flows from the column decoder & driver/sinker 17B toward the column decoder & driver/sinker 16B.

Note that, since the read signal READ comes up to "H" for a read operation, the output signal of the NAND gate circuit ND8 also comes up to "H" so that only the N-channel MOS transistor TN3 becomes ON to show a state as shown in FIGS. 5, 6 and 7.

P-channel MOS transistors TP3', TP4' may be added respectively to the write bit line driver/sinker 43, the write bit line driver/sinker 44 as constant current sources that do not depend on the value of the supply potential typically as shown in FIG. 15.

3. 3rd Embodiment

Figure 22:
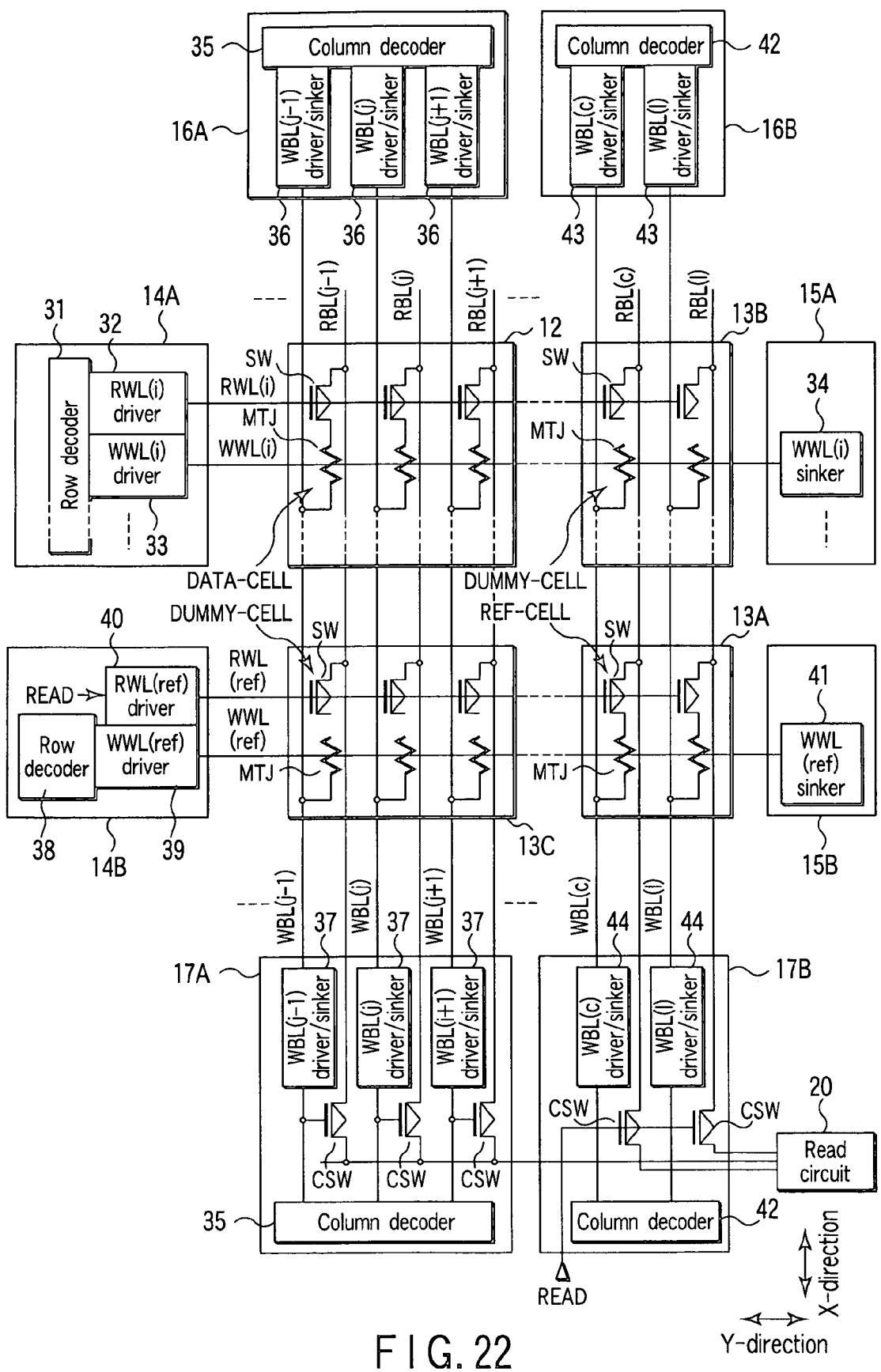
FIG. 22 is a schematic circuit diagram of the third embodiment of MRAM according to the invention.

FIG. 22 is a schematic circuit diagram of the third embodiment of magnetic random access memory according to the invention.

The third embodiment of magnetic random access memory is a variant of the first embodiment and characterized in that each read selection switches SW in the data cells DATA-CELL, reference cells REF-CELL and dummy cells DUMMY-CELL is formed by a P-channel MOS transistor and each column selection switch CSW is also formed by a P-channel MOS transistor.

Otherwise, this embodiment of magnetic random access memory is identical with the first embodiment of magnetic random access memory and hence will not be described any further.

Note, however, that the row decoder & driver 14A, the row decoder & driver 14B, the column decoder & driver/sinker 16A, the column decoder & driver/sinker 16B, the column decoder & driver/sinker 17A and the column decoder & driver/sinker 17B, which are peripheral circuits, have respective circuit configurations that are different from those of the first embodiment because both the read selection switch SW and the column selection switch CSW are formed by a P-channel MOS transistor. Therefore, they will be discussed below.

FIG. 23 is a schematic circuit diagram of an example of row decoder and driver/sinker for data cells that can be used for this embodiment.

Compared with the circuit of FIG. 8, it will be appreciated that the circuit of FIG. 23 differs from the circuit of FIG. 8 only in terms of the read word line driver 32. Otherwise, the two circuits are identical.

In the third embodiment, the read selection switch SW (FIG. 22) is formed by a P-channel MOS transistor. Therefore, the read word line driver 32 is formed only by a NAND gate circuit ND3 in order to eliminate any contradiction in terms of logic.

Thus, as the row decoder enable signal RDEN comes up to "H" after the read signal READ comes up to "H" and subsequently the row address signal is determined, for example, the level of the read word line RWL (I) that belongs to the selected row falls to "L".

A P-channel MOS transistor TP1' may be added to the write word line driver 33 as constant current source typically as shown in FIG. 9.

FIG. 24 is a schematic circuit diagram of an example of row decoder and driver/sinker for reference cells.

By comparing the circuit of FIG. 24 with that of FIG. 10, it will be appreciated that the two circuits differ from each other only in terms of the read word line driver 40 and otherwise the two circuits are identical.

In the third embodiment, the read selection switch SW (FIG. 22) is formed by a P-channel MOS transistor. Therefore, the read word line driver 40 is formed only by an inverter I4.

Thus, as the read signal READ comes up to "H", the level of the read word line RWL (ref) immediately falls to "L".

A P-channel MOS transistor TP2' may be added to the write word line driver 39 as constant current source typically as shown in FIG. 11.

FIG. 25 is a schematic circuit diagram of a first example of column decoder and driver/sinker for data cells.

For this example, the circuit of column decoder & driver/sinker 16A and column decoder & driver/sinker 17A of a column will be described.

The column decoder & driver/sinker 16A includes a column decoder 35 and a write bit line driver/sinker 36.

The column decoder 35 is formed by a NAND gate circuit ND6 to which a column address signal is input and an inverter I6. One of column address signals that are different from column to column is input to the NAND gate circuit ND6 and the output signal of the column decoder 35 comes up to "H" when all the bits of the column address signal are at "H".

The write bit line driver/sinker 36 is formed by a NAND gate circuit ND7 to which the output signal of the column decoder 35, write signal WRITE and data DATA are input, a NAND gate circuit ND7' to which the output signal of the NAND gate circuit ND7 and inverted signal bREAD of read signal READ are applied, an inverter I7' to which the output signal of the NAND gate circuit ND7' is input, a P-channel MOS transistor TP3 to the gate of which the output signal of the inverter I7' is applied and an N-channel MOS transistor TN3 to the gate of which inverted signal bDATA of data DATA is applied.

The column decoder & driver/sinker 17A includes a column decoder 35, a write bit line driver/sinker 37 and a column selection switch CSW.

The column decoder 35 is formed by a NAND gate circuit ND9 to which a column address signal is input and an inverter I8. One of column address signals that are different from column to column is input to the NAND gate circuit ND9 and the output signal of the column decoder 35 comes up to "H" when all the bits of the column address signal are at "H".

The write bit line driver/sinker 37 is formed by a NAND gate circuit ND10 to which the output signal of the column decoder 35, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

The column selection switch CSW of the third embodiment is formed by a P-channel MOS transistor. Therefore, the output signal of the NAND gate circuit ND9 in the column decoder 35 is applied to the gate of the P-channel MOS transistor.

Since read signal READ comes up to "H" for a read operation, the output signal of the NAND gate circuit ND7' comes up to "H" and the output signal of the inverter I7' comes down to "L" so that only the P-channel MOS transistor TP3 becomes ON. In other words, the level of the write bit line WBL (l) is fixed to "H" for a read operation.

Figure 26:
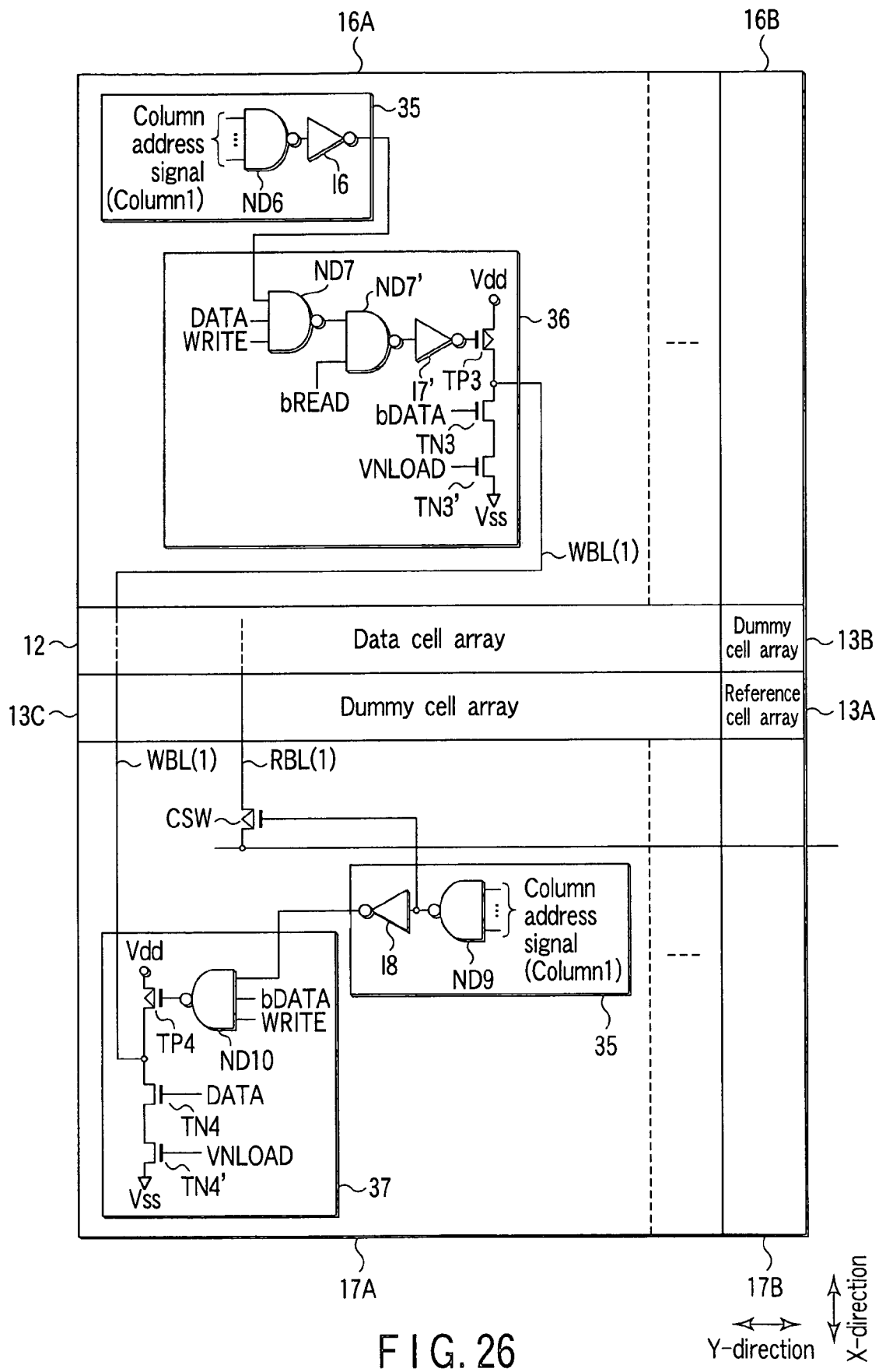
FIG. 26 is a schematic circuit diagram of a second example of column decoder and driver/sinker for data cells.

FIG. 26 is a schematic circuit diagram of a second example of column decoder and driver/sinker for data cells.

The circuit of FIG. 26 differs from that of FIG. 25 only in terms of the configuration of the write bit line driver/sinker 36 and that of the write bit line driver/sinker 37. Otherwise, the circuit of FIG. 26 is identical with that of FIG. 25.

In the write bit line driver/sinker 36, N-channel MOS transistor TN3' to the gate of which VNLOAD is input is connected between the grounding terminal Vss and the N-channel MOS transistor TN3. In the write bit line driver/sinker 37, N-channel MOS transistor TN4' to the gate of which VNLOAD is input is connected between the grounding terminal Vss and the N-channel MOS transistor TN4.

The circuit of this example is exempted from fluctuations in the write current due to fluctuations of the power supply potential Vdd, or the power supply potential dependency of the write current, because the N-channel MOS transistors TN3', TN4' are used as constant current source.

Figure 27:
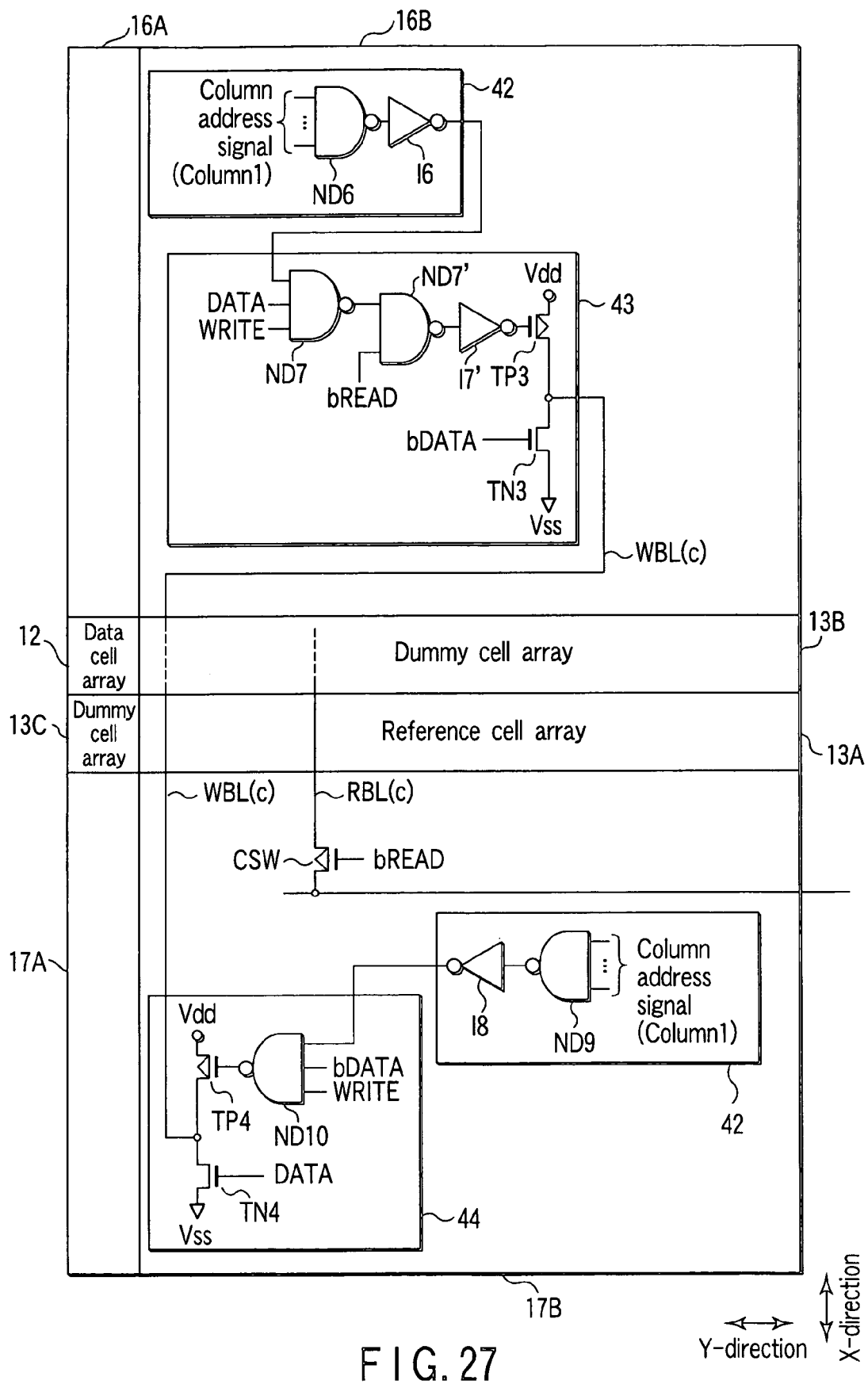
FIG. 27 is a schematic circuit diagram of a first example of column decoder and driver/sinker for reference cells.

FIG. 27 is a schematic circuit diagram of a first example of column decoder and driver/sinker for reference cells.

For this example, the circuit of column decoder & driver/sinker 16B and column decoder & driver/sinker 17B of a column will be described.

The column decoder & driver/sinker 16B includes a column decoder 42 and a write bit line driver/sinker 43.

The column decoder 42 is formed by a NAND gate circuit ND6 to which a column address signal is input and an inverter I6. One of column address signals that are different from column to column is input to the NAND gate circuit ND6 and the output signal of the column decoder 35 comes up to "H" when all the bits of the column address signal are at "H".

The write bit line driver/sinker 43 is formed by a NAND gate circuit ND7 to which the output signal of the column decoder 42, write signal WRITE and data DATA are input, a NAND gate circuit ND7' to which the output signal of the NAND gate circuit ND7 and inverted signal bREAD of read signal READ are applied, an inverter I7' to which the output signal of the NAND gate circuit ND7' is applied, a P-channel MOS transistor TP3 to the gate of which the output signal of the inverter I7' is input and an N-channel MOS transistor TN3 to the gate of which inverted signal bDATA of data DATA is applied.

The column decoder & driver/sinker 17B includes a column decoder 42, a write bit line driver/sinker 44 and a column selection switch CSW.

The column decoder 42 is formed by a NAND gate circuit ND9 to which a column address signal is input and an inverter I8. One of column address signals that are different from column to column is input to the NAND gate circuit ND9 and the output signal of the column decoder 35 comes up to "H" when all the bits of the column address signal are at "H".

The write bit line driver/sinker 44 is formed by a NAND gate circuit ND10 to which the output signal of the column decoder 42, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is input.

The column selection switch CSW of the third embodiment is formed by a P-channel MOS transistor. Therefore, inverted signal bREAD of read signal READ is applied to the gate of this P-channel MOS transistor.

For a read operation, read signal READ comes up to "H" and its inverted signal bREAD comes down to "L". Therefore, the column selection switch CSW immediately becomes ON. Additionally, the output signal of the NAND gate circuit ND7' comes up to "H" and the output signal of the inverter I7' comes down to "L" so that only the P-channel MOS transistor TP3 becomes ON. In other words, the level of the write bit line WBL (c) is fixed to "H" for a read operation.

Figure 28:
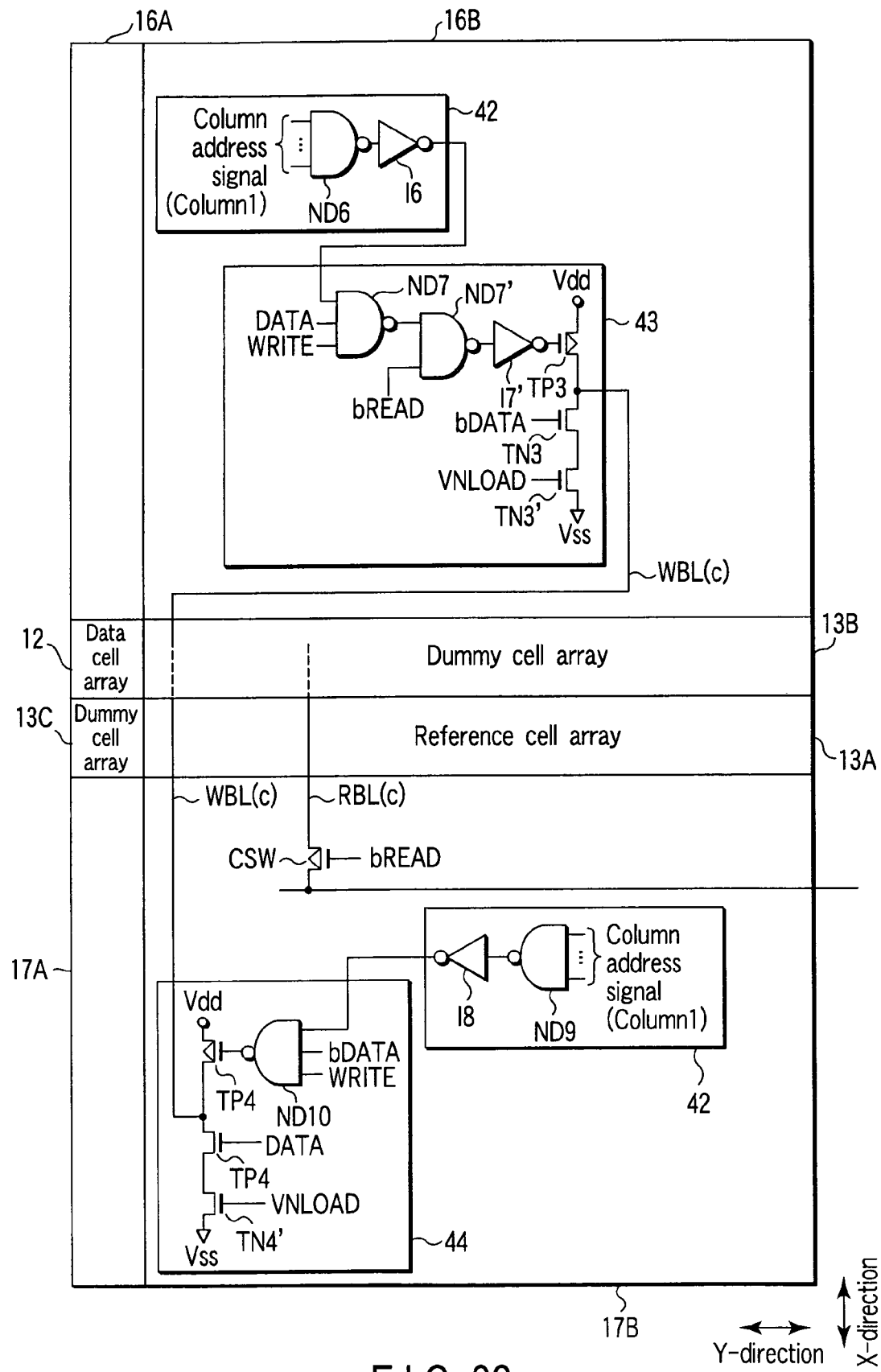
FIG. 28 is a schematic circuit diagram of a second example of column decoder and driver/sinker for reference cells.

FIG. 28 is a schematic circuit diagram of a second example of column decoder and driver/sinker for data cells.

The circuit of FIG. 28 differs from that of FIG. 27 only in terms of the configuration of the write bit line driver/sinker 43 and that of the write bit line driver/sinker 44. Otherwise, the circuit of FIG. 28 is identical with that of FIG. 27.

In the write bit line driver/sinker 43, N-channel MOS transistor TN3' to the gate of which VNLOAD is input is connected between the grounding terminal Vss and the N-channel MOS transistor TN3. In the write bit line driver/sinker 44, N-channel MOS transistor TN4' to the gate of which VNLOAD is input is connected between the grounding terminal Vss and the N-channel MOS transistor TN4.

The circuit of this example is exempted from fluctuations in the write current due to fluctuations of the power supply potential Vdd, or the power supply potential dependency of the write current, because the N-channel MOS transistors TN3', TN4' are used as constant current source.

4. 4th Embodiment

FIG. 29 is a schematic circuit diagram of the fourth embodiment of magnetic random access memory according to the invention.

The fourth embodiment of magnetic random access memory is a variant of the second embodiment and characterized in that each read selection switches SW in the data cells DATA-CELL, reference cells REF-CELL and dummy cells DUMMY-CELL is formed by a P-channel MOS transistor and each row selection switch RSW is also formed by a P-channel MOS transistor.

Otherwise, this embodiment of magnetic random access memory is identical with the second embodiment of magnetic random access memory and hence will not be described any further.

Note, however, that the row decoder & driver 14A, the row decoder & driver 14B, the column decoder & driver/sinker 16A, the column decoder & driver/sinker 16B, the column decoder & driver/sinker 17A and the column decoder & driver/sinker 17B, which are peripheral circuits, have respective circuit configurations that are different from those of the second embodiment because both the read selection switch SW and the row selection switch RSW are formed by a P-channel MOS transistor. Therefore, they will be discussed below.

FIG. 30 is a schematic circuit diagram of an example of row decoder and driver/sinker for data cells that can be used for this embodiment.

Compared with the circuit of FIG. 18, it will be appreciated that the circuit of FIG. 30 differs from the circuit of FIG. 18 only in terms of the configuration of row selection switch RSW. Otherwise, the two circuits are identical.

In the fourth embodiment, the row selection switch RSW is formed by a P-channel MOS transistor. Therefore, the output signal of the NAND gate circuit ND1 in the row decoder 31 is input to the gate of the row selection switch RSW in order to eliminate any contradiction in terms of logic.

Thus, for a read operation, all the bits of the row address signal of the selected row comes up to "H" and the row selection switch RSW becomes ON so that, for example, the read bit line RBL (l) is electrically connected to the read circuit.

A P-channel MOS transistor TP1' may be added to the write word line driver 33 as constant current source typically as shown in FIG. 9.

FIG. 31 is a schematic circuit diagram of an example of row decoder and driver/sinker for reference cells.

Compared with the circuit of FIG. 19, it will be appreciated that the circuit of FIG. 31 differs from the circuit of FIG. 19 only in terms of the configuration of row selection switch RSW. Otherwise, the two circuits are identical.

In the fourth embodiment, the row selection switch RSW is formed by a P-channel MOS transistor. Therefore, inverted signal bREAD of read signal READ is applied to the gate of the row selection switch RSW in order to eliminate any contradiction in terms of logic.

Thus, for a read operation, as the read signal READ comes up to "H", the row selection switch RSW becomes ON so that, for example, the read bit line RBL (ref) is electrically connected to the read circuit.

A P-channel MOS transistor TP2' may be added to the write word line driver 39 as constant current source typically as shown in FIG. 11.

Figure 32:
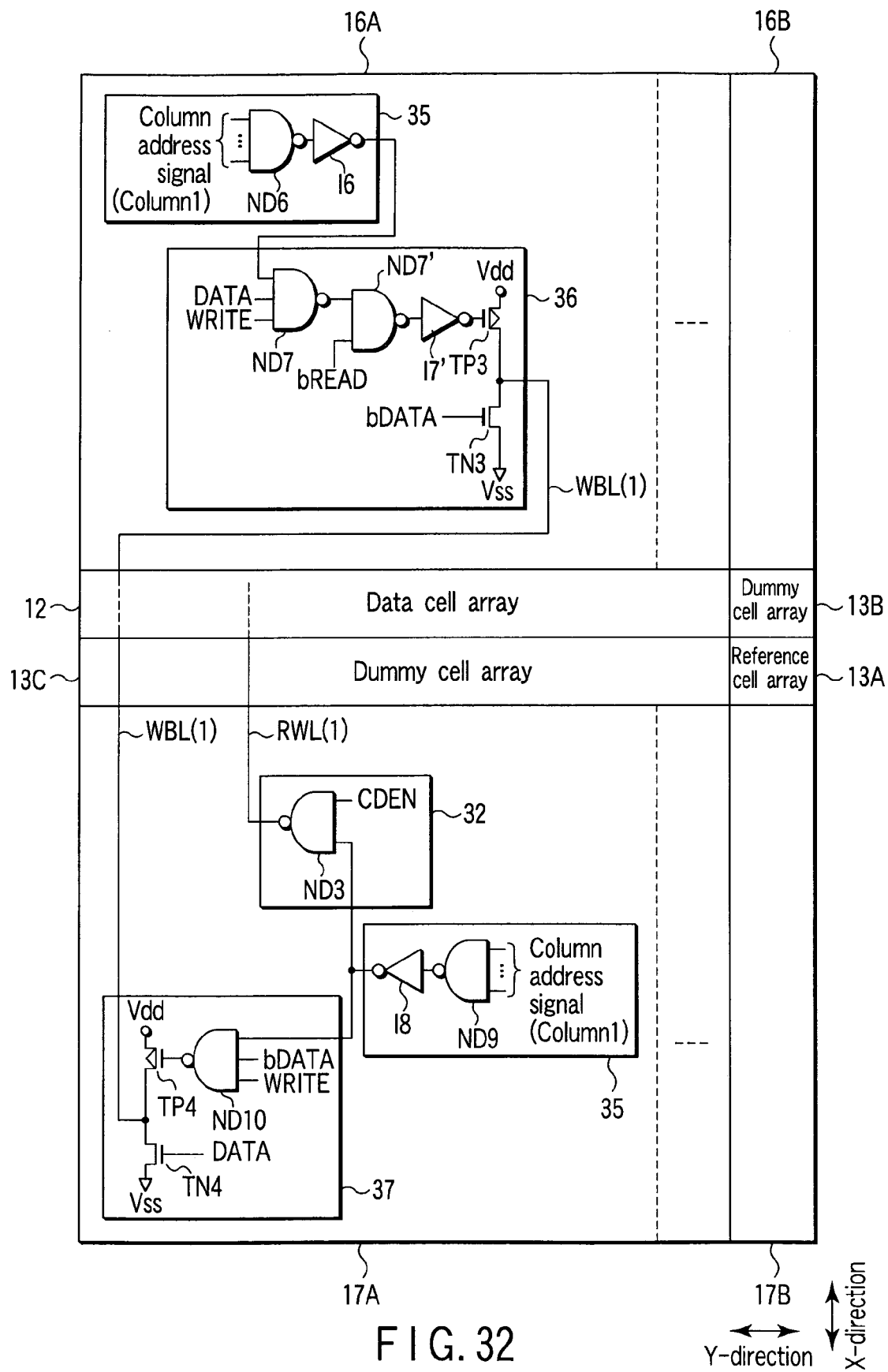
FIG. 32 is a schematic circuit diagram of an example of column decoder and driver/sinker for data cells.

FIG. 32 is a schematic circuit diagram of an example of column decoder and driver/sinker for data cells.

For this example, the circuit of column decoder & driver/sinker 16A and column decoder & driver/sinker 17A of a column will be described.

The column decoder & driver/sinker 16A includes a column decoder 35 and a write bit line driver/sinker 36.

The column decoder 35 is formed by a NAND gate circuit ND6 to which a column address signal is input and an inverter I6. One of column address signals that are different from column to column is input to the NAND gate circuit ND6 and the output signal of the column decoder 35 comes up to "H" when all the bits of the column address signal are at "H".

The write bit line driver/sinker 36 is formed by a NAND gate circuit ND7 to which the output signal of the column decoder 35, write signal WRITE and data DATA are input, a NAND gate circuit ND7' to which the output signal of the NAND gate circuit ND7 and inverted signal bREAD of read signal READ are applied, an inverter I7' to which the output signal of the NAND gate circuit ND7' is input, a P-channel MOS transistor TP3 to the gate of which the output signal of the inverter I7' is applied and an N-channel MOS transistor TN3 to the gate of which inverted signal bDATA of data DATA is applied.

The column decoder & driver/sinker 17A includes a column decoder 35, a write bit line driver/sinker 37 and a read word line driver 32.

The column decoder 35 is formed by a NAND gate circuit ND9 to which a column address signal is input and an inverter I8. One of column address signals that are different from column to column is input to the NAND gate circuit ND9 and the output signal of the column decoder 35 comes up to "H" when all the bits of the column address signal are at "H".

The write bit line driver/sinker 37 is formed by a NAND gate circuit ND10 to which the output signal of the column decoder 35, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

The read word line driver 32 is formed by a NAND gate circuit ND3 to which the output signal of the column decoder 35 and column decoder enable signal CDEN are input.

Since read signal READ comes up to "H" for a read operation, the output signal of the NAND gate circuit ND7' comes up to "H" and the output signal of the inverter I7' comes down to "L" so that only the P-channel MOS transistor TP3 becomes ON. In other words, the level of the write bit line WBL (l) is fixed to "H" for a read operation.

Additionally, the column decoder enable signal CDEN comes up to "H" after the read signal READ comes up to "H" and the column address signal is determined. Therefore, in the selected column, the output signal of the read word line driver 32 comes down to "L" and, for example, the level of the read word line RWL (l) falls to "L".

An N-channel MOS transistor TN4' may be added to the write bit line driver/sinker 37 as constant current source typically as shown in FIG. 26.

Figure 33:
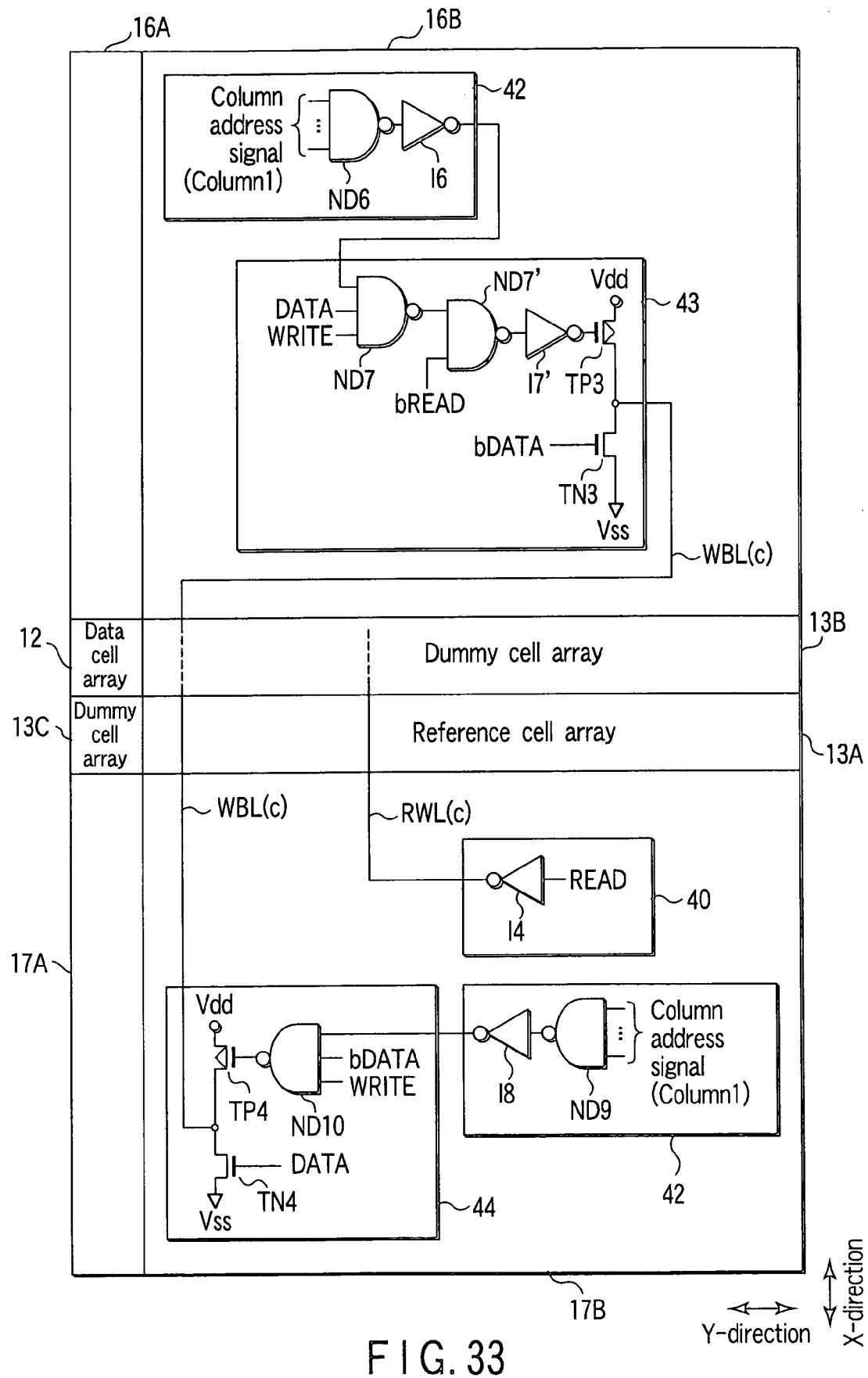
FIG. 33 is a schematic circuit diagram of an example of column decoder and driver/sinker for reference cells.

FIG. 33 is a schematic circuit diagram of an example of column decoder and driver/sinker for reference cells.

For this example, the circuit of column decoder & driver/sinker 16B and column decoder & driver/sinker 17B of a column will be described.

The column decoder & driver/sinker 16B includes a column decoder 42 and a write bit line driver/sinker 43.

The column decoder 42 is formed by an inverter I6 and a NAND gate circuit ND6 to which a column address signal is input. One of column address signals that are different from column to column is input to the NAND gate circuit ND6 and the output signal of the column decoder 42 comes up to "H" when all the bits of the column address signal are at "H".

The write bit line driver/sinker 43 is formed by a NAND gate circuit ND7 to which the output signal of the column decoder 42, write signal WRITE and data DATA are input, a NAND gate circuit ND7' to which the output signal of the NAND gate circuit ND7 and inverted signal bREAD of read signal READ are input, an inverter I7' to which the output signal of the NAND gate circuit ND7' is input, a P-channel MOS transistor TP3 to the gate of which the output signal of the inverter I7' is applied and an N-channel MOS transistor TN3 to the gate of which inverted signal bDATA of data DATA is input.

The column decoder & driver/sinker 17B includes a column decoder 42, a write bit line driver/sinker 44 and a read word line driver 40.

The column decoder 42 is formed by an inverter I8 and a NAND gate circuit ND9 to which a column address signal is input. One of column address signals that are different from column to column is input to the NAND gate circuit ND9 and the output signal of the column decoder 35 comes up to "H" when all the bits of the column address signal are at "H".

The write bit line driver/sinker 44 is formed by a NAND gate circuit ND10 to which the output signal of the column decoder 42, write signal WRITE and inverted signal bDATA of data DATA are input, a P-channel MOS transistor TP4 to the gate of which the output signal of the NAND gate circuit ND10 is applied and an N-channel MOS transistor TN4 to the gate of which data DATA is applied.

The read word line driver 40 is formed by an inverter I4 to which read signal READ is input.

Since read signal READ comes up to "H" for a read operation, the output signal of the NAND gate circuit ND7' comes up to "H" and the output signal of the inverter I7' comes down to "L" so that only the P-channel MOS transistor TP3 becomes ON. In other words, the level of the write bit line WBL (c) is fixed to "H" for a read operation.

Additionally, when read signal READ comes up to "H", the output signal of the read word line driver 40 immediately comes down to "L" so that, for example, the level of the read word line RWL (c) falls to "L".

An N-channel MOS transistor TN4' may be added to the write bit line driver/sinker 44 as constant current source typically as shown in FIG. 28.

Figure 34:
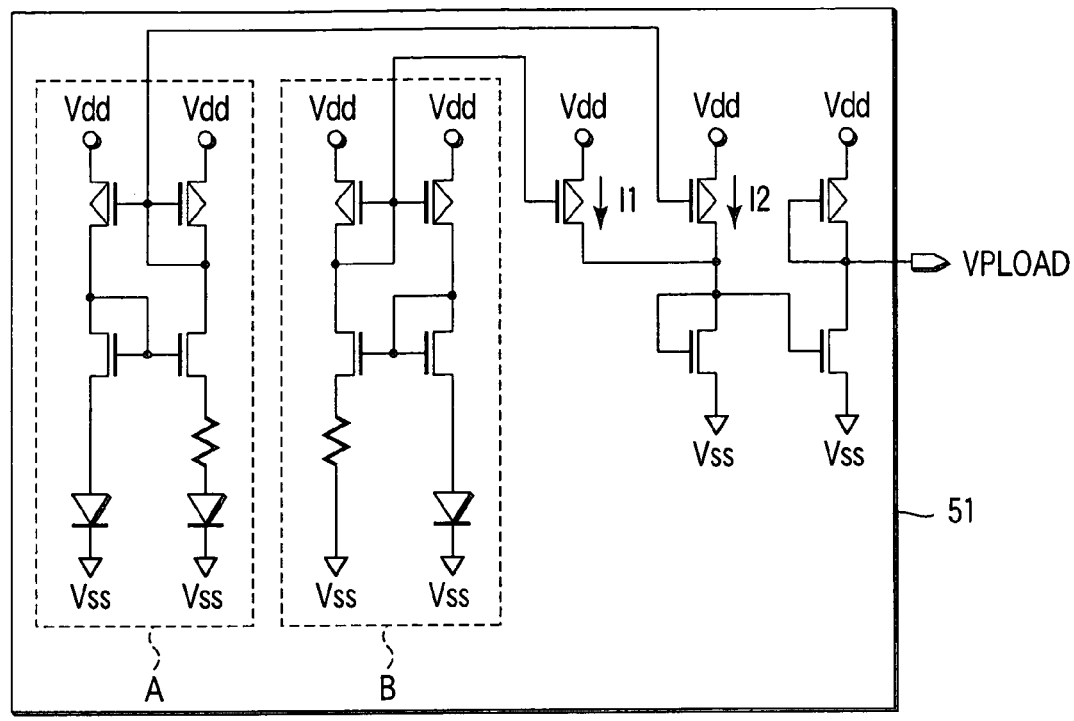
FIG. 34 is a schematic circuit diagram of an example of VPLOAD generation circuit.

5. Other Embodiments (1) VPLOAD Generation Circuit and VNLOAD Generation Circuit FIG. 34 is a schematic circuit diagram of an example of VPLOAD generation circuit.

A VPLOAD generation circuit 51 generates VPLOAD in FIGS. 9, 11, 13 and 15. The VPLOAD generation circuit 51 can be formed, for example, by using a constant current source circuit, to which a BGR circuit is applied.

With the illustrated example, it is possible to make VPLOAD have a value that is dependent on or independent of temperature in response to the write characteristic of the MTJ element in advance by providing part A that increases the electric current when the temperature rises and part B that decreases the electric current when the temperature rises.

Figure 35:
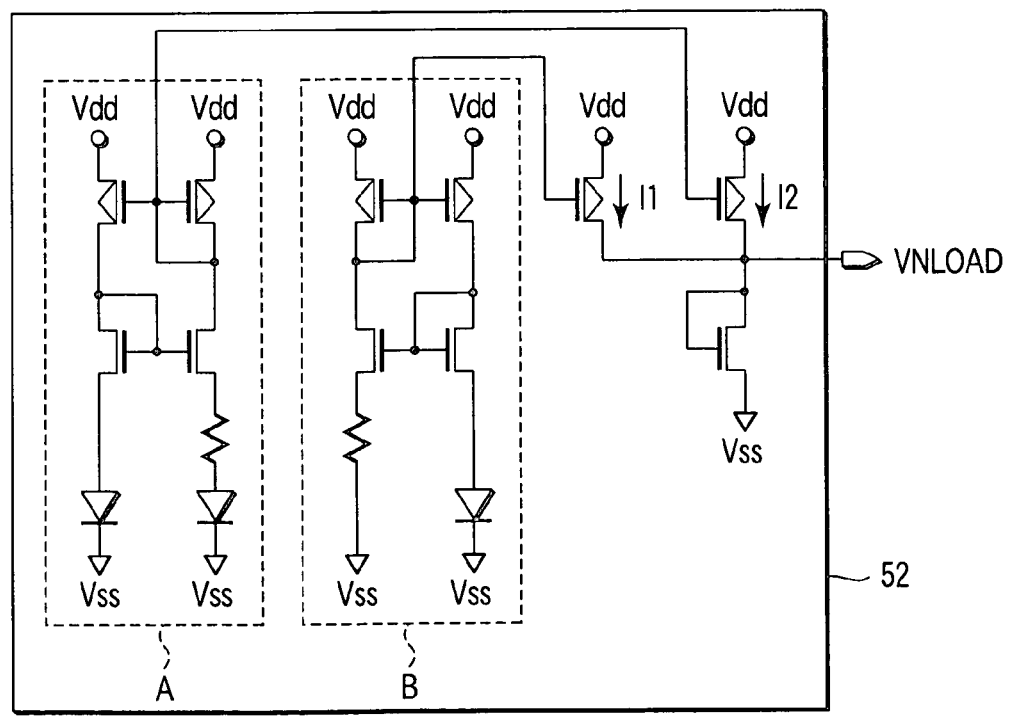
FIG. 35 is a schematic circuit diagram of an example of VNLOAD generation circuit.

FIG. 35 is a schematic circuit diagram of an example of VNLOAD generation circuit.

The VNLOAD generation circuit 52 generates VNLOAD in FIGS. 26 and 28. The VNLOAD generation circuit 52 can also be formed, for example, by using a constant current source circuit, to which a BGR circuit is applied.

With the illustrated example again, it is possible to make VNLOAD have a value that is dependent on or independent of temperature in response to the write characteristic of the MTJ element in advance by providing part A that increases the electric current when the temperature rises and part B that decreases the electric current when the temperature rises.

(2) An Exemplary Circuit having a Sense Amplifier Provided for Each Column

Figure 36:
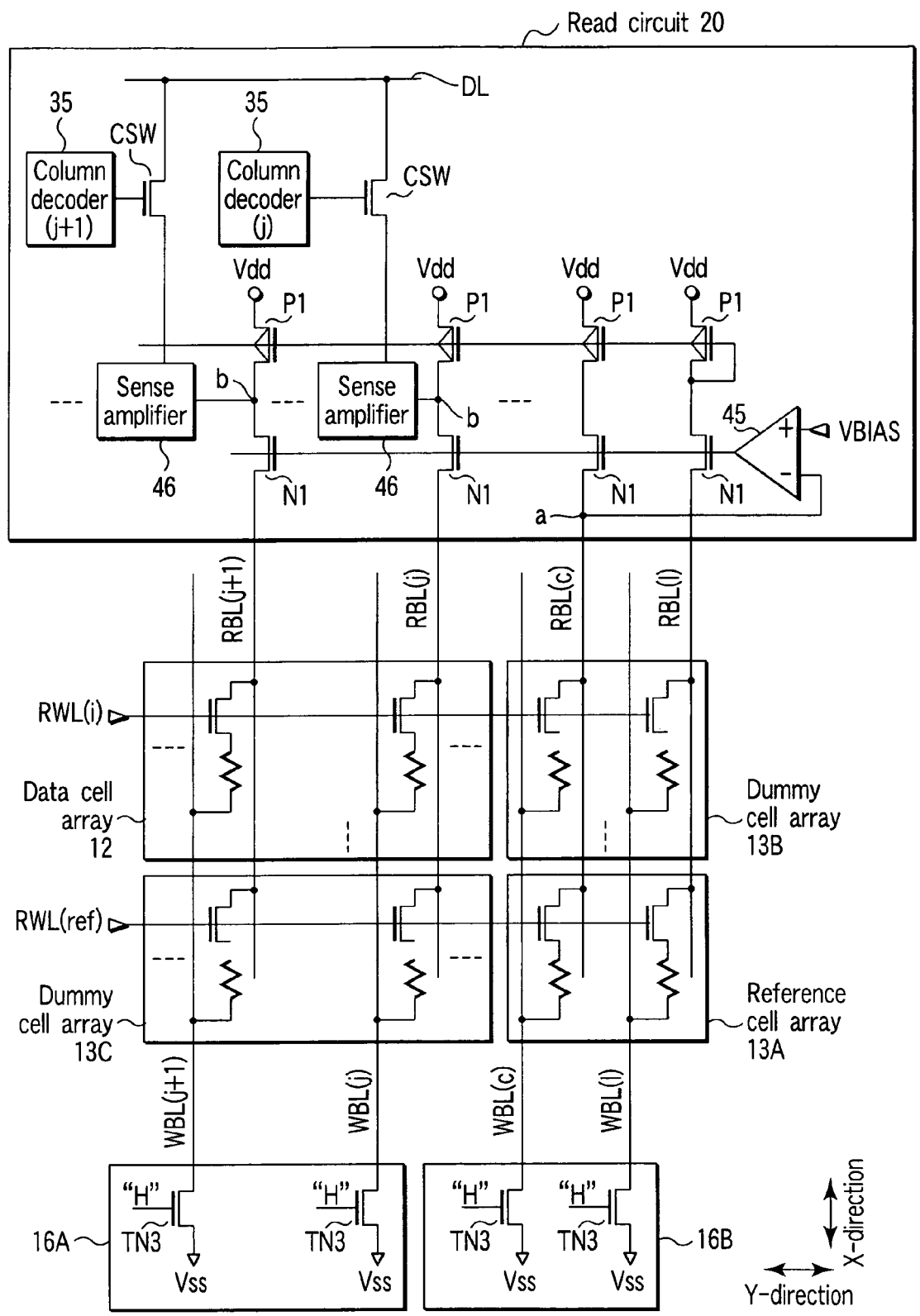
FIG. 36 is a schematic circuit diagram of an example of MRAM in which a sense amplifier is provided for each column.

FIG. 36 shows an exemplary circuit of magnetic random access memory where a sense amplifier is provided for each column.

This exemplary circuit is a variant of the circuit of FIG. 5.

Since a sense amplifier 46 is arranged for each column of the data cell array 12, the column selection switch CSW is arranged between the sense amplifier 46 and the data line DL at the data cell side. On the other hand, no column selection switch CSW is connected between the read bit line RBL (c) and the corresponding N-channel MOS transistor N1 and between the read bit line RBL (l) and the corresponding N-channel MOS transistor N1, at the reference cell side.

Figure 37:
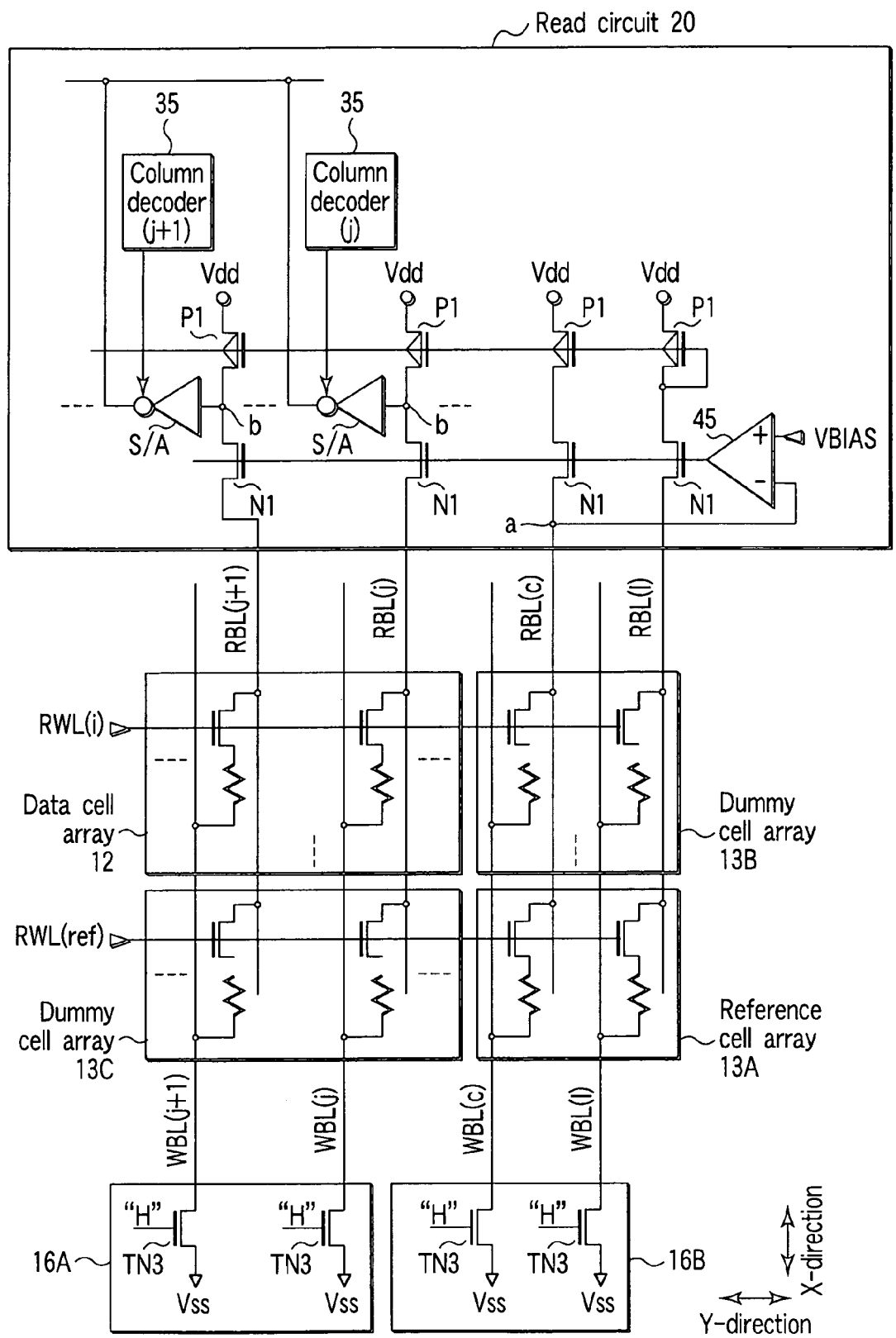
FIG. 37 is a schematic circuit diagram of another example of MRAM in which a sense amplifier is provided for each column.
Figure 38:
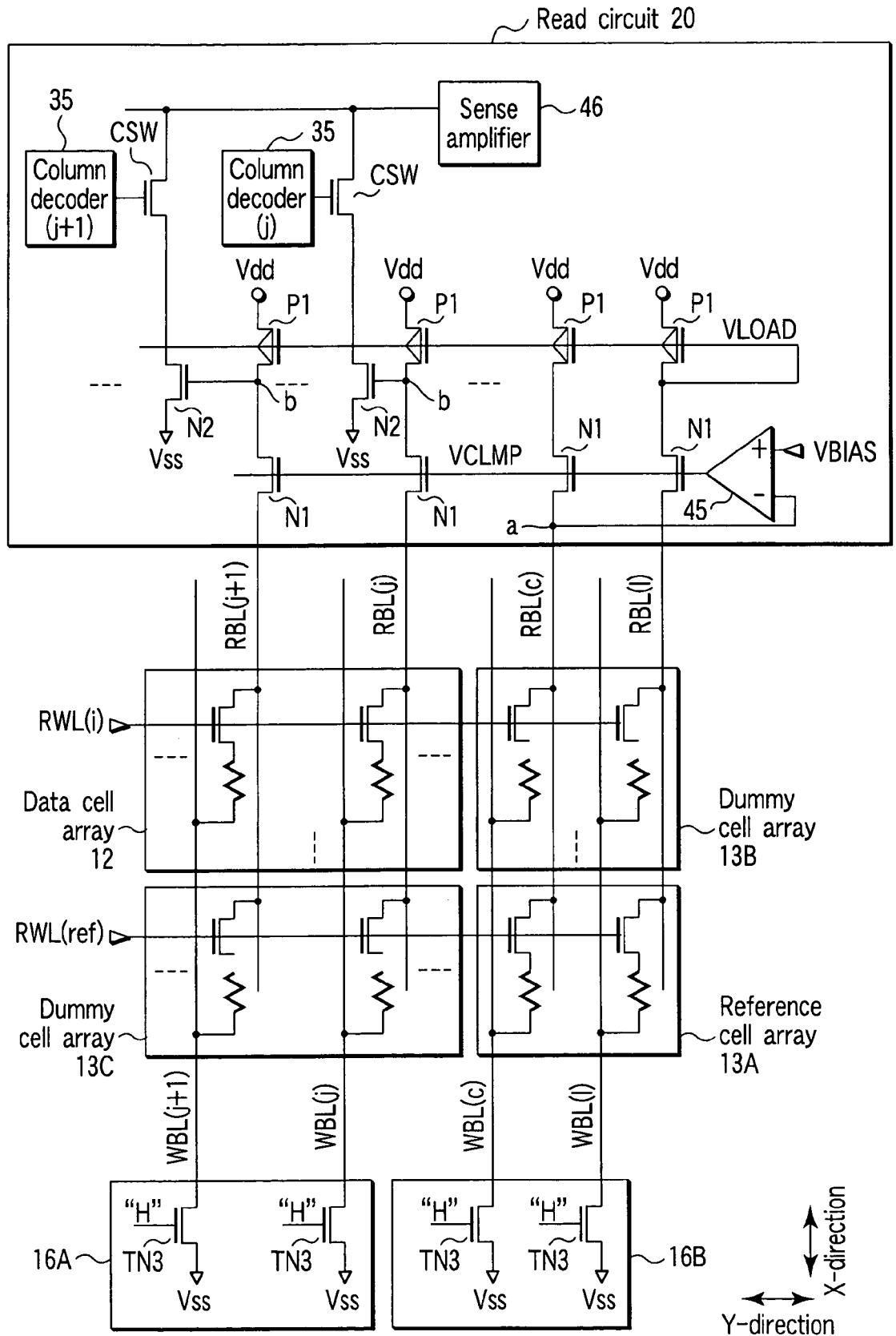
FIG. 38 is a schematic circuit diagram of still another example of MRAM in which a sense amplifier is provided for each column.

For example, the sense amplifier 46 can be formed by a clocked inverter that is controlled by the output signal of the column decoder 35 as shown in FIG. 37. Alternatively, for example, the sense amplifier 46 can be formed by an N-channel MOS transistor N2 having a configuration of so-called wired NOR as shown in FIG. 38.

(3) Exemplary Circuits Formed by Using a Toggle Write System

Figure 40:
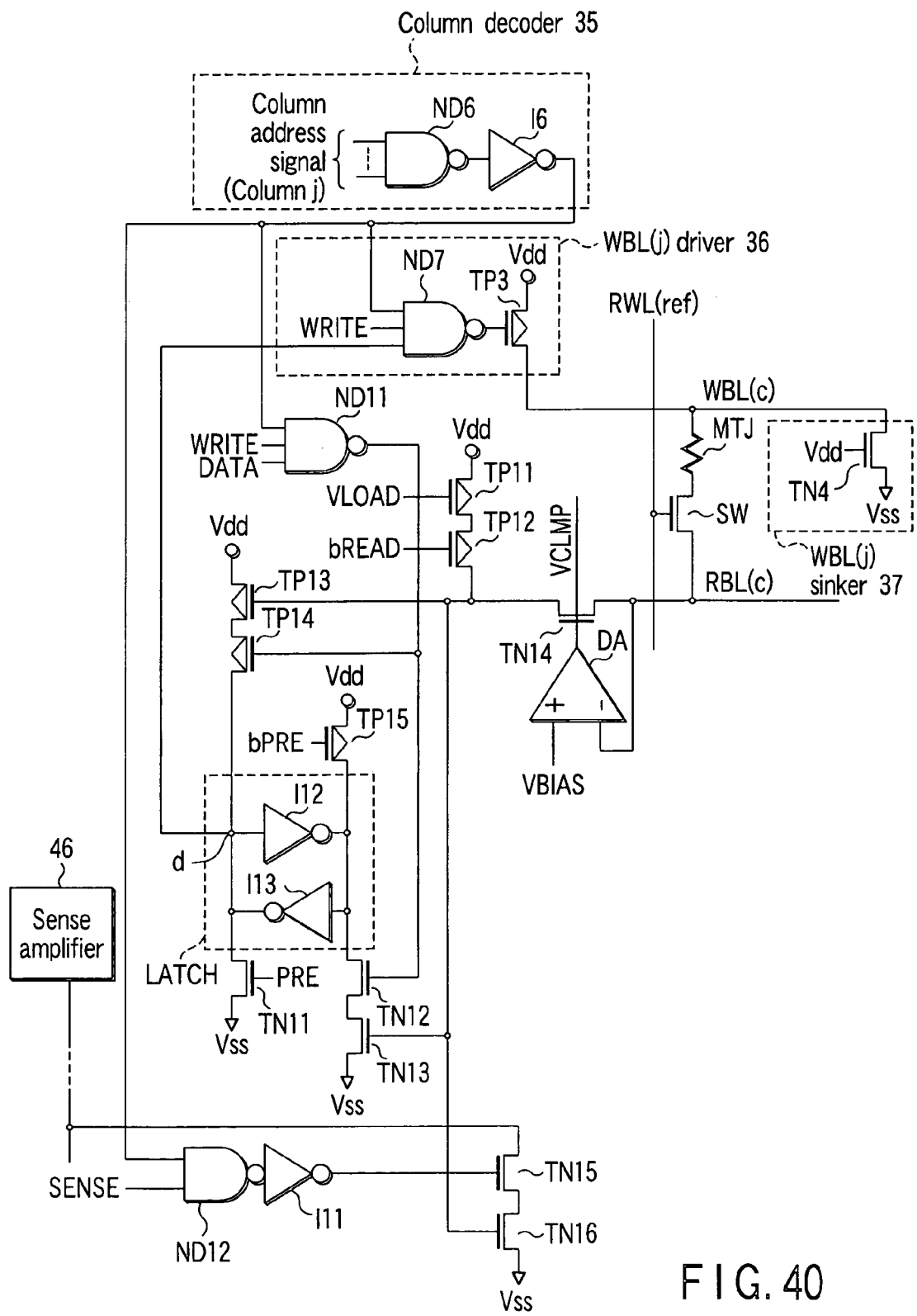
FIG. 40 is a schematic circuit diagram of another example of MRAM adopting a toggle write mode.
Figure 42:
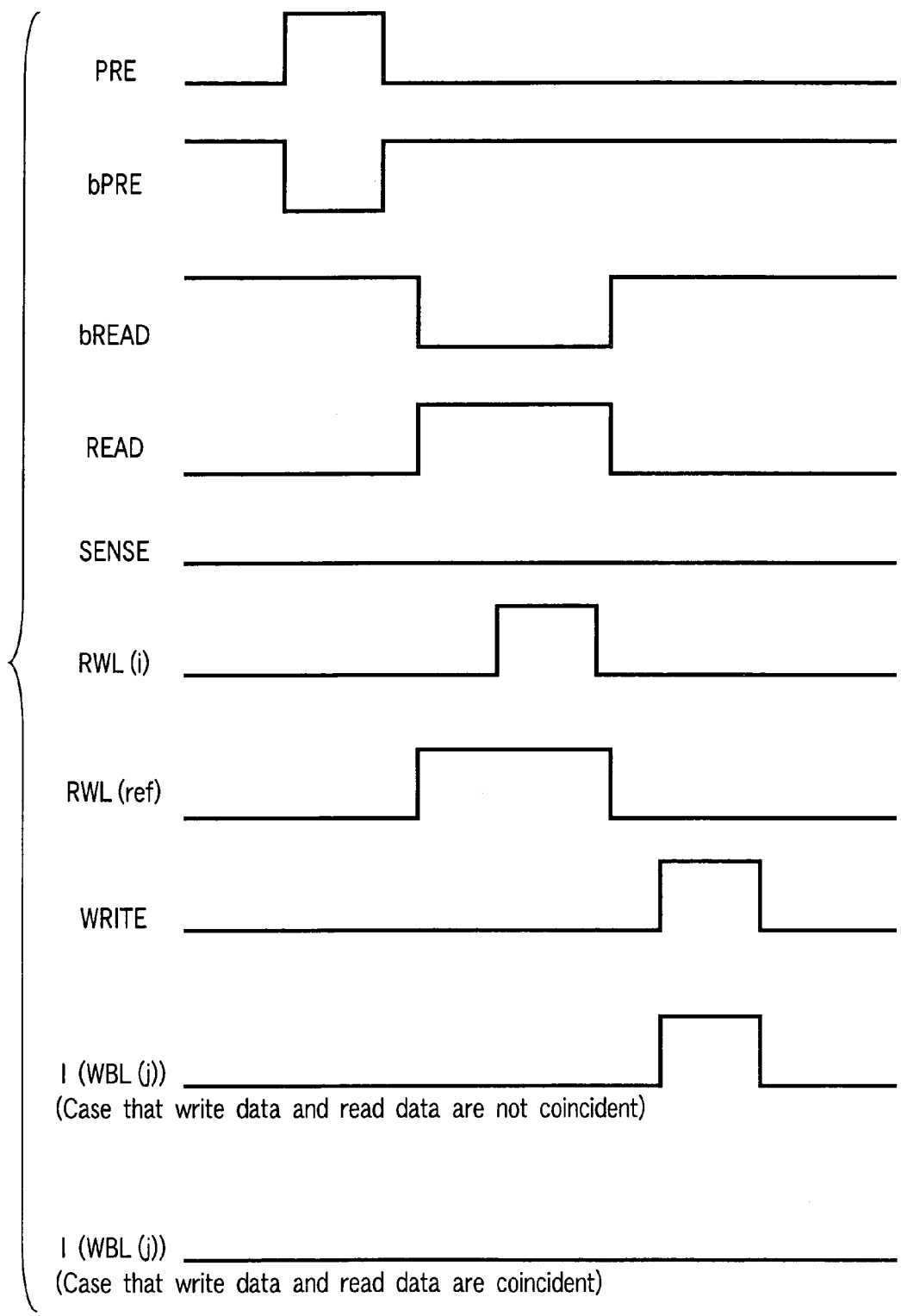
FIG. 42 is a schematic illustration of signal waveforms that are used for writing to a toggle write type MRAM.

FIGS. 39 through 41 shows exemplary circuits of magnetic random access memory that are realized by using a toggle write mode. FIG. 42 shows signal waveforms to be used for a write operation and FIG. 43 shows signal waveforms to be used for a read operation.

A toggle write mode is described in detail in U.S. Pat. No. 6,545,906, for instance, and therefore it will be described only briefly herein.

With a toggle write mode, the state of magnetization (parallel or unparallel) of MTJ element MTJ cannot be determined by the direction of flow of the electric current that is made to flow to the write word/bit line. Therefore, the data of the MTJ element MTJ that is the object of program is read out and the value of the read out data and that of the write data are compared.

If the two values are equal to each other, no write current is made to flow to the write word/bit line in order to improve the reliability of operation and reduce the power consumption rate. If, on the other hand, the two values are different from each other, a write current is made to flow to the write word/bit line.

In the illustrated examples, the node d in the sense amplifier (latch circuit) S/A is set to "L" (write disabled state) by defining PRE="H". Thereafter, the data of the MTJ element MTJ is read out and, if the value of the read out data and the value of write data DATA are equal to each other, no write current is made to flow to the write bit line WBL (j).

If, on the other hand, the value of the data read out from the MTJ element MTJ and the value of write data DATA are different from each other, the node d in the sense amplifier S/A is set to "H" (write enabled state) and write current is made to flow to the write bit line WBL (j).

Tables 1 through 3 below respectively show the gate level of each of transistors TP13, TN13, the output level of NAND circuit ND11 and the level of the node d of a magnetic random access memory using a toggle write mode.

TABLE 1

| Gate level of each of transistors TP13, TN13 | |
|---|---|
| Extracted data of MTJ | |
| 0 | 1 |
| L | H |

TABLE 2

| | Output level of NAND circuit ND11 | |
|---|---|---|
| | Input data | |
| | 0 | 1 |
| | L | H |

TABLE 3

| | Level of node d | |
|---|---|---|
| MTJ Input | Extracted data of | |
| data | 0 | 1 |
| 0 | L | H |
| 1 | H | L |

L: Keep the state which is pre-set by PRE

The drain of the N-channel MOS transistor TN 15 is connected to sense amplifier 46 by way of a common node that is common to a plurality of or all columns.

The common node is at "H" when the read out data is equal to "0" and at "L" when the read out data is equal to "1".

Any of the exemplary circuits of FIGS. 39 through 41 may be modified in such a way that the node d in the sense amplifier S/A is set to "H" (write enabled state) in advance and, if the value of the data of the MTJ element MTJ and that of write data DATA are equal to each other, the node d in the sense amplifier S/A is brought down to "L" (write disabled state) so that no write current may be made to flow to the write bit line WBL (j).

6. Others

A memory cell array is arranged in a chip or a block in each of the above described embodiments of the invention. However, according to the present invention, if a plurality of blocks (memory cell arrays) exist in a chip, it is also possible to keep the blocks that are not used for read/write operations in a non-operating state to reduce the power consumption rate.

The read bit lines and the write bit lines are arranged independently to realize a structure that is advantageous for high speed operations in the above described embodiments of the invention. However, according to the invention, it is also possible to integrally arrange the read bit lines and the write bit lines, or provide read/write bit lines, for the data cells, the reference cells and the dummy cells.

A MOS transistor is used for a read selection switch in the above described embodiments of the present invention. However, according to the invention, a read selection switch may alternatively be formed by a MES transistor, a bipolar transistor, a diode or some other element.

Thus, according to the invention, it is possible to reduce the chip area, realize high speed operations of the chip and simplify data storing operations by using part of the memory cells of a memory cell array as reference cells for generating a bias current/potential or a reference current/potential.

A magnetic random access memory according to the invention can operate at high speed particularly when it has a 1 Tr-1 MTJ type cell array structure where each memory cell is formed by a transistor and a MTJ element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a data cell and a first reference cell arranged in a memory cell array and each formed by a magneto-resistive effect element and a read selection switch connected in series;
    the first reference cell is connected to a first read bit line;
    the data cell is connected to a second read bit line different from the first read bit line;
    the read selection switch of the first reference cell is connected to a first read word line;
    the read selection switch of the data cell is connected to a second read word line different from the first read word line;
    the second read word line is not connected to read selection switches of all other reference cells; and
    the second read bit line is not connected to said all other reference cells.

2. The magnetic random access memory according to claim 1, further comprising:
    a second reference cell connected to the first read word line and formed by a magneto-resistive effect element and a read selection switch connected in series;
    a first read word line driver that activates the first read word line for a read operation; and
    a second read word line driver that activates the second read word line after the activation of the first read word line,
    wherein a bias current that is made to flow to the data cell and the second reference cell is generated on the basis of data of the first reference cell, and a reference level is generated as reference for determining data of the data cell on the basis of data of the second reference cell.

3. The magnetic random access memory according to claim 2, wherein the first reference cell is programmable.

4. The magnetic random access memory according to claim 2, wherein the second read word line is activated after the first read word line is activated.

5. The magnetic random access memory according to claim 1, further comprising:
    a first write bit line connected to one end of the data cell for a write operation;
    the other end of the data cell is connected to the second read bit line for a data read operation;
    the first and second read bit lines are connected to a read circuit; and
    the first write bit line is made to show a fixed electric potential for a read operation.

6. The magnetic random access memory according to claim 5, wherein the first and second read word lines extend in a first direction and the first write bit line and the first read bit line extend in a second direction that intersects the first direction.

7. The magnetic random access memory according to claim 5, further comprising:
    a second write bit line connected to one end of the first reference cell for a write operation;

the first read bit line is connected to the other end of the first reference cell for a data read operation;

the first and second read bit lines are connected to the read circuit; and the second write bit line is made to show a fixed electric potential for a read operation.

8. The magnetic random access memory according to claim 7, further comprising:

a first column/row selection switch connected between the second read bit line and the read circuit and adapted to be turned ON/OFF according to a column address signal for a read operation; and a second column/row selection switch connected between the first read bit line and the read circuit and adapted to be turned ON immediately for a read operation regardless of the column address signal.

9. The magnetic random access memory according to claim 1, further comprising:

a second reference cell connected to the second read word line and formed by a magneto-resistive effect element and a read selection switch connected in series;

a first read word line driver that activates the first read word line for a read operation; and a second read word line driver that activates the second read word line after the activation of the first read word line, wherein a bias current that is made to flow to the data cell and the second reference cell is generated based on data of the first reference cell, and a reference level is generated as reference for determining data of the data cell based on data of the second reference cell.

10. The magnetic random access memory according to claim 1, wherein the first reference cell is programmable.

11. The magnetic random access memory according to claim 1, further comprising:

a gate connected to a first common node of a bias circuit and a clamp circuit; and a second common node connected to the gate, wherein the second common node is selectively connected to a sense amplifier based on an output signal of a decoder.

12. The magnetic random access memory according to claim 1, further comprising:

a gate connected to a first common node of a bias circuit and a clamp circuit; and a second common node connected to the gate, wherein the second common node is selectively connected to a comparator based on an output signal of a decoder, and data are written to the data cell by a toggle write mode.

13. The magnetic random access memory according to claim 12, further comprising:

a latch circuit having a preset function, wherein a state of the latch circuit is inverted based on a state of the second common node.

14. The magnetic random access memory according to claim 12, wherein the first reference cell is programmable.

15. The magnetic random access memory according to claim 1, further comprising:

a second reference cell formed by a magneto-resistive effect element and a read selection switch connected in series, and connected to a third read bit line, wherein the read selection switch of the second reference cell is connected to the first read word line.

16. A magnetic random access memory comprising:

a data cell and a reference cell arranged in a memory cell array and each formed by a magneto-resistive effect element and a read selection switch connected in series;

a first read word line connected to the read selection switch of the reference cell;

a second read word line connected to the read selection switch of the data cell; and a dummy cell arranged in the memory cell array and formed by a magneto-resistive effect element and a read selection switch, wherein data of the data cell are read out on the basis of data of the reference cell, and the read selection switch of the dummy cell is connected to the first word line or the second word line and no electric current flows to the magneto-resistive effect element of the dummy cell if the read selection switch of the dummy cell becomes ON.

17. The magnetic random access memory according to claim 16, wherein the first reference cell is programmable.

18. The magnetic random access memory according to claim 16, wherein the data cell and the reference cell have the same device structure and the dummy cell have a device structure that is identical with the device structure of the data cell and the reference cell except that contact plugs partly do not exist.

19. The magnetic random access memory according to claim 16, wherein the data cell and the reference cell have the same device structure and the dummy cell have a device structure that is identical with the device structure of the data cell and the reference cell except that the current path connecting the magneto-resistive effect element and the read selection switch of the dummy cell are cut apart.

20. A magnetic random access memory comprising:

a data cell and a reference cell arranged in a memory cell array and each formed by a magneto-resistive effect element and a read selection switch connected in series;

a first read word line connected to the read selection switch of the reference cell;

a second read word line connected to the read selection switch of the data cell;

a first read word line driver that activates the first read word line for a read operation; and a second read word line driver that activates the second read word line after the activation of the first read word line, wherein data of the data cell are read out on the basis of data of the reference cell, and a reference level is generated as reference for determining the bias current that is made to flow to the data cell or data of the data cell on the basis of data of the reference cell.

21. The magnetic random access memory according to claim 20, wherein the first reference cell is programmable.

* * * * *